(12) United States Patent
Higashidani et al.

(10) Patent No.: US 8,064,198 B2
(45) Date of Patent: Nov. 22, 2011

(54) COOLING DEVICE FOR SEMICONDUCTOR ELEMENT MODULE AND MAGNETIC PART

(75) Inventors: Yoshihiko Higashidani, Wako (JP); Takeshi Kato, Wako (JP); Masao Nagano, Wako (JP); Tsutomu Yoshino, Wako (JP)

(73) Assignee: Honda Motor Co., Ltd., Tokyo (JP)

( * ) Notice: Subject to any disclaimer, the term of this patent is extended or adjusted under 35 U.S.C. 154(b) by 15 days.

(21) Appl. No.: 12/820,668

(22) Filed: Jun. 22, 2010

(65) Prior Publication Data

US 2010/0328893 A1 Dec. 30, 2010

(30) Foreign Application Priority Data

| Jun. 29, 2009 | (JP) | 2009-153789 |
| Jul. 1, 2009 | (JP) | 2009-156665 |
| Jul. 8, 2009 | (JP) | 2009-161611 |

(51) Int. Cl.
*H05K 7/20* (2006.01)

(52) U.S. Cl. ........... 361/679.53; 361/679.46; 361/689; 361/699; 361/702; 361/703; 361/715; 165/80.4; 165/80.5; 165/104.19; 165/104.33; 257/714; 62/259.2; 307/9.1; 307/10.1; 307/43; 363/65; 363/141; 363/143

(58) Field of Classification Search ........... 361/679.46, 361/679.47, 679.53, 689, 698–703, 707–715, 361/721–728, 734, 760, 766, 768; 165/80.3, 165/80.4, 80.5, 104.19, 104.33, 104.34, 185; 257/706–727, E23.186, E23.183, E23.044, 257/E23.001; 174/16.3, 252; 307/9.1, 10.1, 307/11, 38, 43, 115; 363/141–147, 137, 363/65, 56.02; 29/592.1, 740, 741, 759, 29/602.1, 831, 832

See application file for complete search history.

(56) References Cited

U.S. PATENT DOCUMENTS

| 2,942,165 | A | * | 6/1960 | Jackson et al. | 257/714 |
| 3,857,044 | A | * | 12/1974 | Papoi et al. | 307/9.1 |
| 5,504,378 | A | * | 4/1996 | Lindberg et al. | 307/10.1 |
| 5,504,655 | A | * | 4/1996 | Underwood et al. | 361/707 |
| 5,966,291 | A | * | 10/1999 | Baumel et al. | 361/707 |
| 6,141,219 | A | * | 10/2000 | Downing et al. | 361/704 |

(Continued)

FOREIGN PATENT DOCUMENTS

JP 2004-349324 12/2004

*Primary Examiner* — Michail V Datskovskiy
(74) *Attorney, Agent, or Firm* — Squire, Sanders & Dempsey (US) LLP

(57) ABSTRACT

A cooling device for a semiconductor element module and a magnetic part, includes: a water-cooled type heat sink having a cooling water passage; a semiconductor element module including a plurality of chips arranged side by side in a circulation direction in the cooling water passage, the semiconductor element module being mounted on the heat sink; and a magnetic part including a core and a winding portion mounted on the core, the magnetic part being mounted on the heat sink or another heat sink. In the cooling device, a plurality of cooling fins is disposed to extend along the circulation direction in the cooling water passage in a manner that the plurality of cooling fins are separated into groups for the respective chips arranged side by side in the circulation direction, and that the groups of the cooling fins are offset from each other in a direction perpendicular to the circulation direction. Accordingly, it is possible to have improved cooling efficiency of a heat sink with cooling fins.

12 Claims, 37 Drawing Sheets

U.S. PATENT DOCUMENTS

| | | | | |
|---|---|---|---|---|
| 6,166,937 A * | 12/2000 | Yamamura et al. | ............ | 363/141 |
| 6,219,245 B1 * | 4/2001 | Nagashima et al. | ........... | 361/705 |
| 6,414,867 B2 * | 7/2002 | Suzuki et al. | ................. | 363/141 |
| 6,621,701 B2 * | 9/2003 | Tamba et al. | ................. | 361/699 |
| 6,648,062 B2 * | 11/2003 | Fukazu et al. | ............... | 165/80.3 |
| 6,729,383 B1 * | 5/2004 | Cannell et al. | ............... | 165/80.3 |
| 6,771,507 B1 * | 8/2004 | Belady et al. | ................. | 361/704 |
| 6,885,553 B2 * | 4/2005 | Pfeifer et al. | ................. | 361/688 |
| 6,906,404 B2 * | 6/2005 | Maly et al. | .................... | 257/678 |
| 6,940,715 B2 * | 9/2005 | Beihoff et al. | ................ | 361/689 |
| 6,956,742 B2 * | 10/2005 | Pfeifer et al. | ................. | 361/709 |
| 6,961,244 B2 * | 11/2005 | Tsuchiya et al. | .............. | 361/710 |
| 6,987,670 B2 * | 1/2006 | Ahmed et al. | ................ | 361/699 |
| 7,030,520 B2 * | 4/2006 | Takenaka et al. | ............... | 310/64 |
| 7,042,725 B2 * | 5/2006 | Martin et al. | ................ | 361/699 |
| 7,090,044 B2 * | 8/2006 | Nakamura et al. | ........... | 180/65.8 |
| 7,095,613 B2 * | 8/2006 | Tsuchiya et al. | .............. | 361/699 |
| 7,173,823 B1 * | 2/2007 | Rinehart et al. | .............. | 361/699 |
| 7,187,548 B2 * | 3/2007 | Meyer et al. | ................... | 361/699 |
| 7,197,819 B1 * | 4/2007 | Rinehart et al. | ................. | 29/840 |
| 7,333,331 B2 * | 2/2008 | Yamabuchi et al. | .......... | 361/699 |
| 7,504,720 B2 * | 3/2009 | Nakatsu et al. | ................ | 257/712 |
| 7,525,224 B2 * | 4/2009 | Takenaka et al. | ............. | 310/54 |
| 7,547,966 B2 * | 6/2009 | Funakoshi et al. | ............ | 257/707 |
| 7,571,759 B2 * | 8/2009 | Inagaki et al. | ................ | 165/80.4 |
| 7,687,901 B2 * | 3/2010 | Furuta | ............................ | 257/712 |
| 7,710,721 B2 * | 5/2010 | Matsuo et al. | ................ | 361/699 |
| 7,719,838 B2 * | 5/2010 | Nakajima et al. | ............. | 361/699 |
| 7,755,898 B2 * | 7/2010 | Aoki et al. | ...................... | 361/710 |
| 7,760,503 B2 * | 7/2010 | Aoki et al. | ...................... | 361/699 |
| 7,816,786 B2 * | 10/2010 | Nakatsu et al. | ................ | 257/714 |
| 7,839,641 B2 * | 11/2010 | Baba et al. | ...................... | 361/711 |
| 7,859,103 B2 * | 12/2010 | Aoki et al. | ...................... | 257/714 |
| 7,876,563 B2 * | 1/2011 | Shiba | ............................ | 361/699 |
| 7,948,758 B2 * | 5/2011 | Buhler et al. | ................. | 361/702 |
| 7,965,510 B2 * | 6/2011 | Suzuki et al. | ................. | 361/699 |

\* cited by examiner

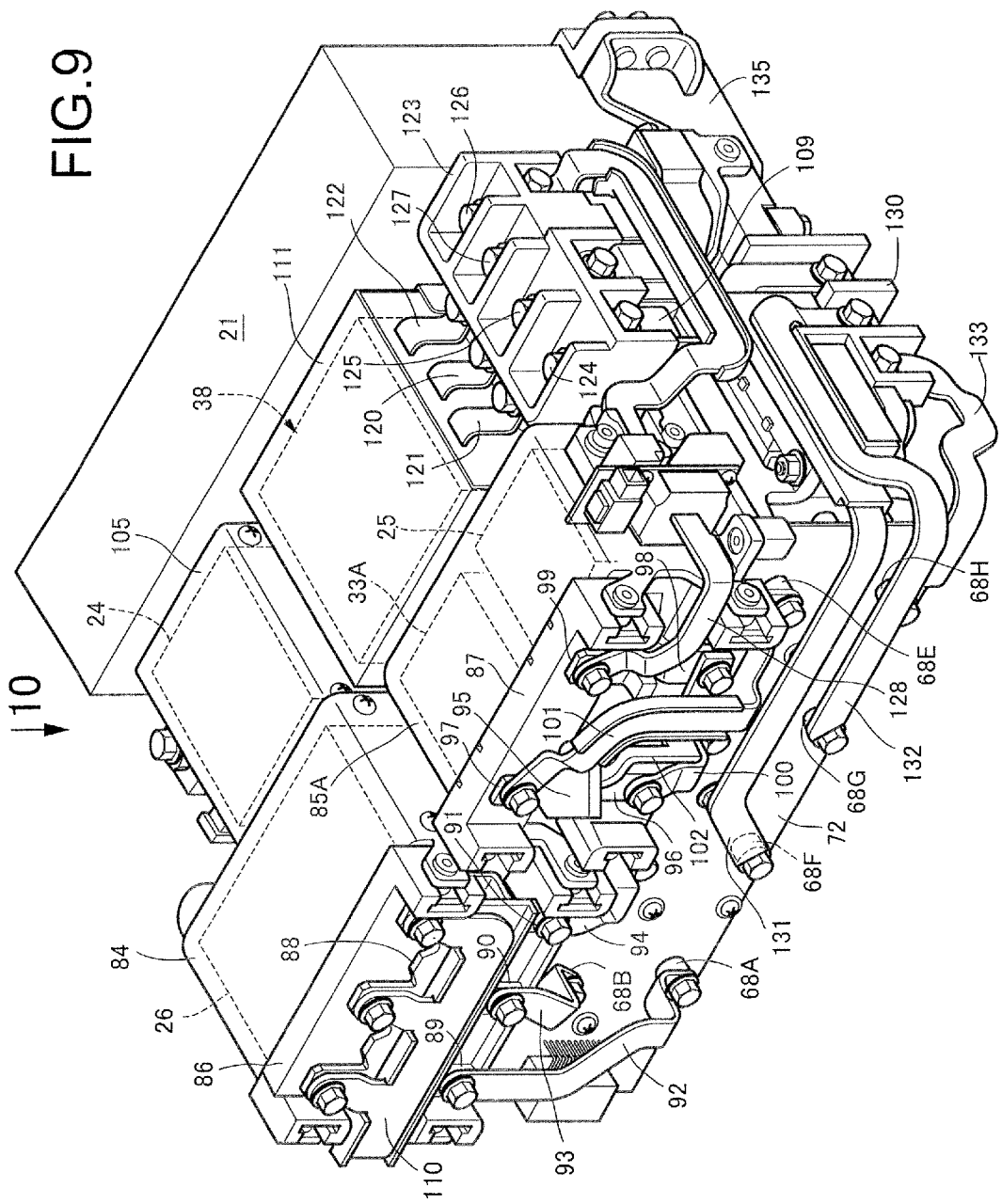

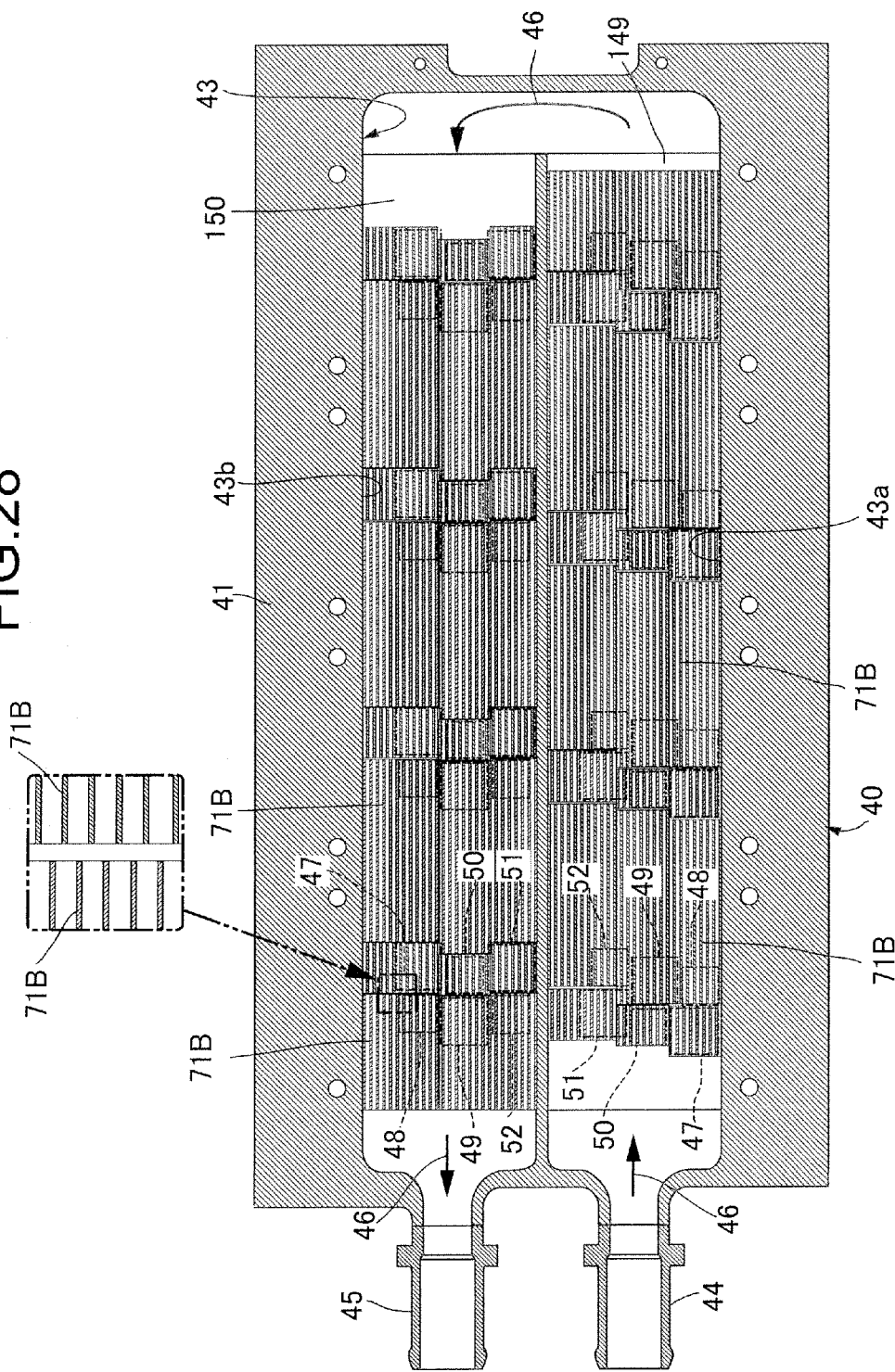

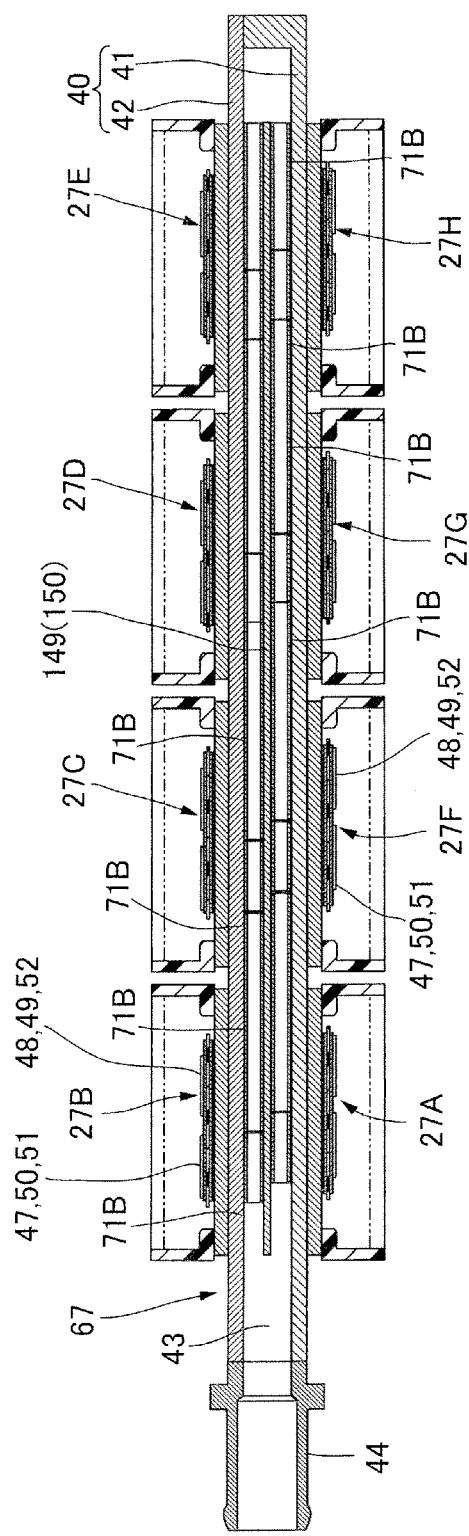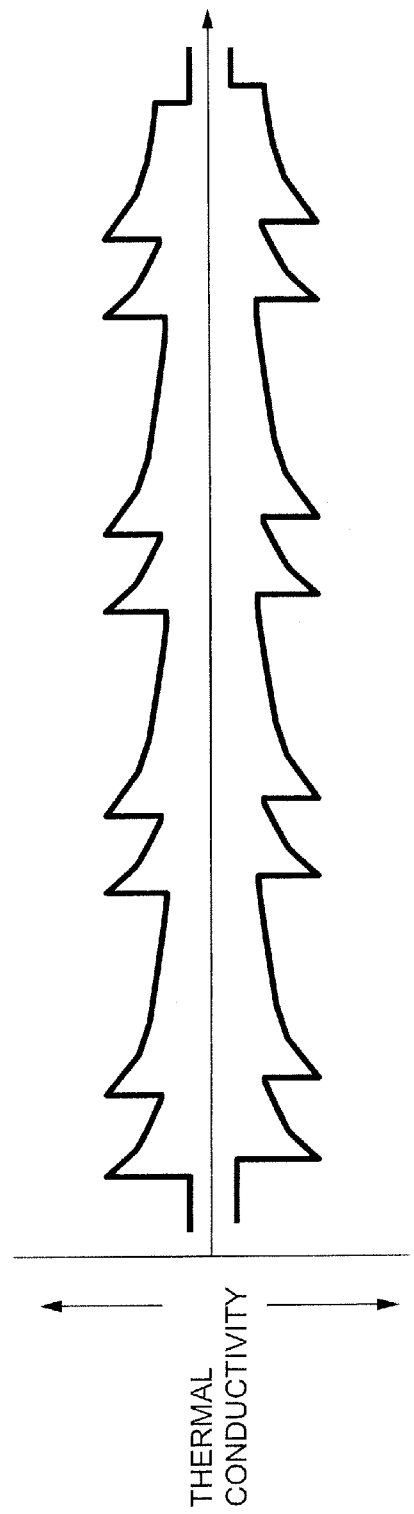

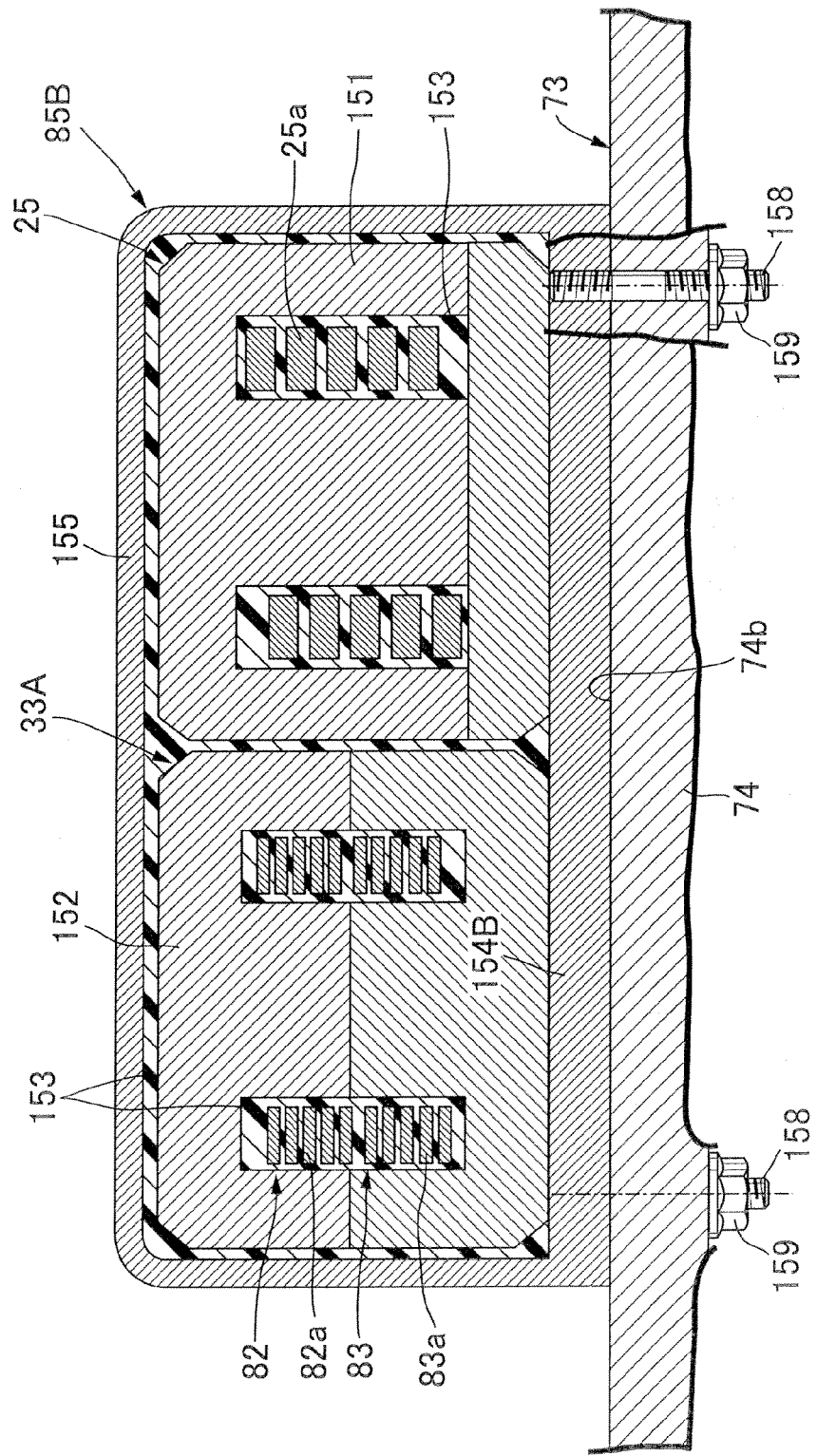

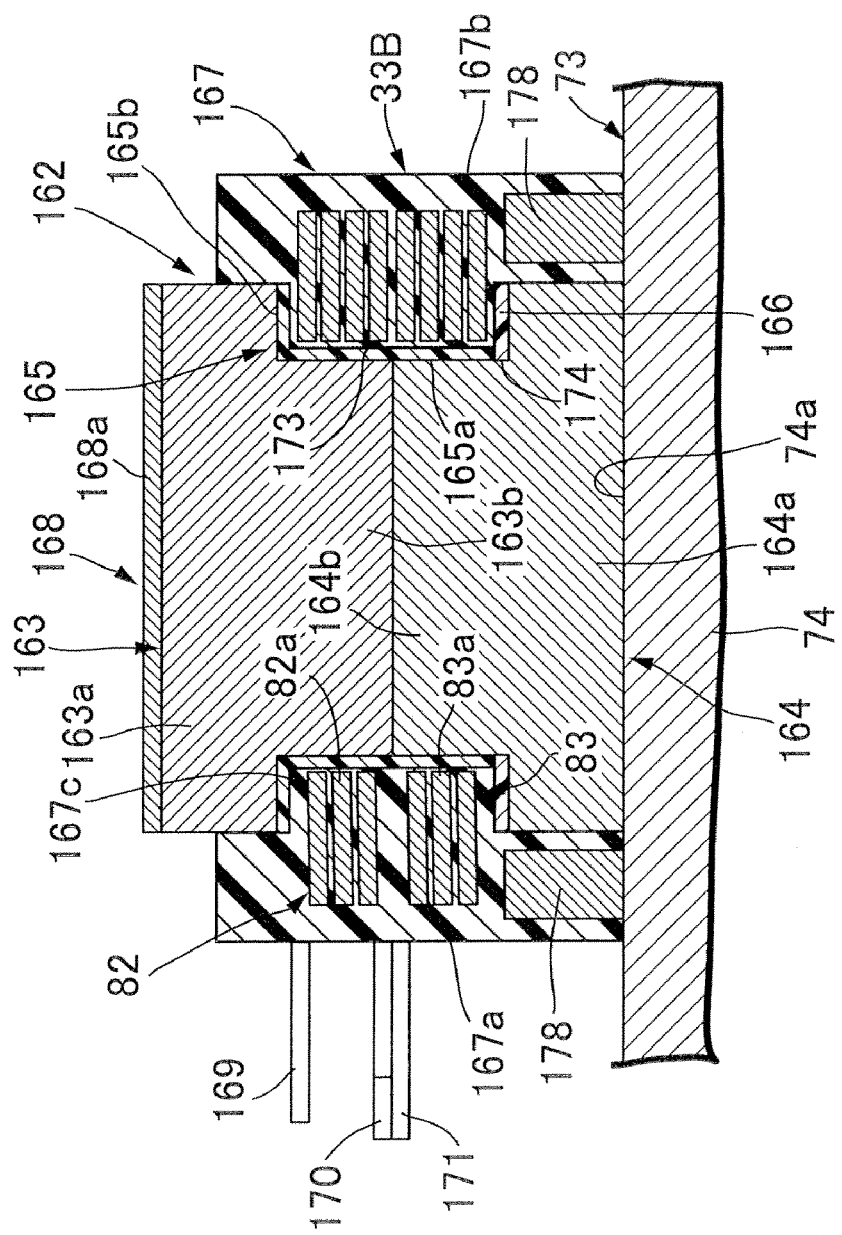

COOLING DEVICE FOR SEMICONDUCTOR ELEMENT MODULE AND MAGNETIC PART

CROSS-REFERENCE TO RELATED APPLICATIONS

The present application claims priority under 35 USC 119 to Japanese Patent Application No. 2009-153789, filed on Jun. 29, 2009, Japanese Patent Application No. 2009-156665, filed on Jul. 1, 2009, and Japanese Patent Application No. 2009-161611, filed on Jul. 8, 2009 the entire contents of which are hereby incorporated by reference.

BACKGROUND OF THE INVENTION

1. Field of the Invention

The present invention relates to a cooling device for a semiconductor element module and a magnetic part, comprising: a water-cooled type heat sink having a cooling water passage; a semiconductor element module including a plurality of chips arranged side by side in a circulation direction in the cooling water passage, the semiconductor element module being mounted on the heat sink; and a magnetic part including a core and a winding portion mounted on the core, the magnetic part being mounted on the heat sink or another heat sink.

2. Description of the Related Art

A cooling device as follows has already been known from Japanese Patent Application Laid-open No. 2004-349324. The cooling device includes cooling fins disposed in a cooling water passage of a heat sink in order to improve the cooling performance of the heat sink on which semiconductor element modules are mounted. The cooling fins are extended along the circulation direction of the cooling water passage, and are formed to be integrally connected to each other along the entire cooling water passage.

In the meantime, the following is known. When cooling water flows through a cooling water passage, there is a thermal entrance region associated with a change in the flow velocity distribution near the inlet of the cooling water passage. In the thermal entrance region, the thermal conductivity decreases in a downstream direction. After the cooling water passes through the thermal entrance region, the thermal conductivity approaches to a constant thermal conductivity in a hydrodynamically developed region where the flow velocity becomes constant. Thus, the cooling device formed by integrally connecting the cooling fins extending along the circulation direction of the cooling water passage across the entire length of the cooling water passage as disclosed in the Japanese Patent Application Laid-open No. 2004-349324 has a thermal entrance region only at the inlet of the cooling water passage, thus it is difficult to obtain high heat transfer efficiency for the entire cooling water passage.

SUMMARY OF THE INVENTION

The present invention is made in view of such background, and an object of the invention is to provide a cooling device for a semiconductor element module and a magnetic part, which is designed to have improved cooling efficiency of a heat sink with cooling fins.

In order to achieve the above-mentioned object, according to a first feature of the present invention, there is provided a cooling device for a semiconductor element module and a magnetic part, comprising: a water-cooled type heat sink having a cooling water passage; a semiconductor element module including a plurality of chips arranged side by side in a circulation direction in the cooling water passage, the semiconductor element module being mounted on the heat sink; a magnetic part including a core and a winding portion mounted on the core, the magnetic part being mounted on the heat sink or another heat sink; and a plurality of cooling fins disposed to extend in the circulation direction in the cooling water passage in a manner that the plurality of cooling fins are separated into groups for the respective chips arranged side by side along the circulation direction, and that the groups of the cooling fins are offset from each other in a direction perpendicular to the circulation direction.

According to the configuration having the first feature, multiple cooling fins are disposed in the cooling water passage of the heat sink in a manner that the cooling fins are separated into groups for the respective chips arranged side by side in the circulation direction, and that the groups of the cooling fins are offset from each other in a direction perpendicular to the circulation direction. Thus, a thermal entrance region is formed in a portion corresponding to each of the chips arranged side by side in the circulation direction, and thereby the cooling efficiency of the entire cooling water passage can be increased.

According to a second feature of the present invention, in addition to the first feature, each the semiconductor element module includes a pair of semiconductor elements which are disposed at separate locations along the circulation direction of the cooling water passage.

According to the configuration of the second feature, a thermal entrance region is formed for every semiconductor element by arranging a pair of semiconductor elements included in a semiconductor element module at separate locations along the circulation direction of the cooling water passage. Thus, the cooling efficiency can be increased.

According to a third feature of the present invention, in addition to the first or second feature, a plurality of the semiconductor element modules are mounted separately on opposite surfaces of the heat sink having the cooling water passage.

According to the configuration of the third feature, multiple semiconductor element modules are mounted separately on the opposite surfaces of the heat sink. Thus, the entire cooling device can be designed to be compact while improving its cooling performance.

According to a fourth feature of the present invention, in addition to the first feature, the semiconductor element module is mounted on the heat sink having the cooling water passage, with a plurality of semiconductor elements buried in a covering layer made of a synthetic resin.

According to the configuration of the fourth feature, the semiconductor element module is mounted on the heat sink with the semiconductor elements being buried in the covering layer made of a synthetic resin. Thus, the semiconductor element module can be cooled more effectively by heat dissipation from the covering layer and cooling by the heat sink.

According to a fifth feature of the present invention, in addition to the first feature, the plurality of cooling fins are integrally molded.

According to the configuration of the fifth feature, each of the cooling fins on the downstream side can be securely placed at a position corresponding to the midpoint between adjacent ones of the cooling fins on the upstream side by integrally forming the multiple cooling fins. Thus, possibility of reduction of the cooling effect due to positional displacement of the downstream cooling fins can be eliminated, and the cooling effect exactly as designed can be achieved.

According to a sixth feature of the present invention, in addition to the first feature, a flat mounting surface is formed on the heat sink on which a plurality of the magnetic parts are mounted, the magnetic parts are housed in a common housing case in such a manner that axes of the winding portions of the magnetic parts are perpendicular to the mounting surface, and the housing case is mounted on the mounting surface.

According to the configuration of the sixth feature, multiple magnetic parts are housed in the housing case, thus the package can be made compact. Furthermore, the multiple magnetic parts housed in the housing case are disposed in such a manner that the axes of their winding portions are perpendicular to the flat mounting surface of the heat sink. Accordingly, the entire winding portions can be placed closer to the heat sink than in a case where the axes of the winding portions are approximately parallel to the heat sink. Thus, heat of the entire winding portions can be uniformly dissipated to the heat sink side, and thereby abnormal heat generation is prevented from occurring at a portion of the winding portions. Accordingly, a temperature rise of the winding portions is prevented, consequently preventing a temperature rise of the cores.

According to a seventh feature of the present invention, in addition to the sixth feature, the plurality of magnetic parts are an inductor and a transformer.

According to the configuration of the seventh feature, the package for the inductor and the transformer can be made compact by providing a common housing case for housing both of the inductor and the transformer.

According to an eighth feature of the present invention, in addition to the sixth or seventh feature, the housing case includes: a supporting plate portion with which the magnetic parts are brought into contact; and a cover portion which covers the magnetic parts and is connected to the supporting plate portion, and the supporting plate portion having a greater plate thickness than that of the cover portion is mounted on the mounting surface while being in contact with the mounting surface.

According to the configuration of the eighth feature, the supporting plate portion with increased heat capacity and improved mechanical strength can be provided with the function to cool the magnetic parts as well as the function to mount the same.

According to a ninth feature of the present invention, in addition to the first feature, a flat mounting surface is formed on the heat sink having mounted thereon the magnetic part having a resin covering portion in which at least part of the winding portion is buried, the flat mounting surface formed to be perpendicular to an axis of the winding portion and to be in contact with the resin covering portion and the core, and at least part of a heat dissipation plate made of metal is buried in the resin covering portion.

According to the configuration of the ninth feature, the entire magnetic part can be placed closer to the heat sink than in a case where the axis of the winding portion is approximately parallel to the heat sink. Furthermore, since at least a part of the heat dissipation plate made of metal is buried in the resin covering portion in which at least the winding portion of the magnetic part is buried, heat generated by the magnetic part can be easily transferred to the heat sink side via the heat dissipation plate. Thus, the heat of the entire magnetic part can be uniformly dissipated from the heat dissipation plate, and thereby abnormal heat generation is prevented from occurring at a portion of the magnetic part. Accordingly, a temperature rise of the magnetic part is prevented. In addition, since the core is also in contact with the heat sink, heat transferred from the magnetic part to the core can be efficiently transferred to the heat sink, thereby suppressing a temperature rise of the core.

According to a tenth feature of the present invention, in addition to the ninth feature, the heat dissipation plate is buried in the resin covering portion while being in direct contact with the mounting surface.

According to the configuration of the tenth feature, the heat dissipation plate is in direct contact with the heat sink. Thus, heat dissipation to the heat sink side can be greatly promoted.

According to an eleventh feature of the present invention, in addition to the ninth or tenth feature, a mounting plate portion mounted on the mounting surface while being in contact with the mounting surface is provided integrally to the heat dissipation plate in such a manner as to project from the resin covering portion.

According to the configuration of the eleventh feature, the heat dissipation plate can be provided with heat transfer function and mounting function to mount the resin covering portion, i.e., the magnetic part on the heat sink.

According to a twelfth feature of the present invention, in addition to the ninth feature, the heat dissipation plate is formed to sandwich the winding portion at least in the axis direction of the winding portion from both sides thereof.

According to the configuration of the twelfth feature, optimal heat dissipation from the entire magnetic part can be achieved.

Here, first to eighth switching element modules 27A, 27B, 27C, 27D, 27E, 27F, 27G, and 27H of embodiments correspond to the semiconductor element module of the present invention; first to eighth positive side switching elements 31A, 31B, 31C, 31D, 31E, 31F, 31G, and 31H and first to eighth negative side switching elements 32A, 32B, 32C, 32D, 32E, 32F, 32G, and 32H of the embodiments correspond to the semiconductor element of the present invention; a first heat sink 40 and a second heat sink 73 of the embodiments correspond to the heat sink of the present invention; a first cooling water passage 43 of the embodiments corresponds to the cooling water passage of the present invention; and second housing cases 85A, 85B correspond to the housing case of the present invention.

The above and other objects, characteristics and advantages of the present invention will be clear from detailed descriptions which will be provided below for the preferred embodiments while referring to the attached drawings.

BRIEF DESCRIPTION OF THE DRAWINGS

FIGS. 1 to 24 show Embodiment 1 of the present invention:

FIG. 1 is an overall schematic circuit diagram of a power conversion device;

FIG. 2 is a side view of a switching element assembly unit;

FIG. 3 is a diagram viewed from an arrow 3 in FIG. 2 with a control circuit omitted;

FIG. 4 is a diagram viewed from an arrow 4 in FIG. 2 with the control circuit omitted;

FIG. 5 is a cross-sectional view taken along a line 5-5 in FIG. 3;

FIG. 6 is a cutaway perspective view of an essential portion of the switching element assembly unit;

FIG. 7 is a cross-sectional view taken along a line 7-7 in FIG. 2;

FIG. 9 is a perspective view of the power conversion device;

FIG. 10 is a plan view viewed from an arrow 10 in FIG. 9;

FIG. 11 is a diagram viewed from an arrow 11 in FIG. 10;

FIG. 12 is a cross-sectional view taken along a line 12-12 in FIG. 10;

FIG. 13 is a cross-sectional view of a second heat sink taken along a line 13-13 in FIG. 11;

FIG. 14 is a diagram showing a circulation circuit of cooling water;

FIG. 15 is a cross-sectional view taken along a line 15-15 in FIG. 10;

FIG. 16 is a cross-sectional view taken along a line 16-16 in FIG. 15;

FIG. 17 is a cross-sectional view taken along a line 17-17 in FIG. 10;

FIG. 18 is an exploded perspective view of a capacitor unit;

FIG. 19 is an exploded perspective view of the switching element assembly unit, a DC link capacitor unit, and an external bus bar unit;

FIG. 20 is an exploded perspective view of the external bus bar unit;

FIG. 22 is a simplified diagram showing an example of a path of commutation current in the DC link capacitor unit in the case with the external bus bar unit;

FIG. 23 is a simplified diagram showing another example of a path of commutation current in the DC link capacitor unit in the case with the external bus bar unit; and FIG. 24 is a simplified diagram showing yet another example of a path of commutation current in the DC link capacitor unit in the case with the external bus bar unit.

FIGS. 25 to 29 show Embodiment 2 of the present invention:

FIG. 25 is a plan view showing an upper surface of the switching element assembly unit with the control circuit omitted;

FIG. 26 is a bottom plan view showing a lower surface of the switching element assembly unit with the control circuit omitted;

FIG. 27 is a cross-sectional view taken along a line 27-27 in FIG. 25;

FIG. 28 is a cross-sectional view taken along a line 28-28 in FIG. 27;

FIG. 29A is a longitudinal cross-sectional view of the switching element assembly unit; and FIG. 29B is a diagram showing a change of a thermal conductivity in the direction of cooling water circulation in the first heat sink, in comparison with FIG. 29A.

FIG. 30 shows Embodiment 3 and is a cross-sectional view corresponding to a second inductor and a two-phase transformer in FIG. 15.

FIGS. 31 to 34 show Embodiment 4 of the present invention:

FIG. 31 is a longitudinal cross-sectional view of the two-phase transformer and the second heat sink;

FIG. 32 is a perspective view of the two-phase transformer and the second heat sink;

FIG. 33 is an exploded perspective view of the two-phase transformer and the second heat sink; and FIG. 34 is a perspective view of a coil and a resin covering portion.

FIG. 35 is a longitudinal cross-sectional view corresponding to FIG. 31;

FIG. 36 is a cross-sectional view taken along a line 36-36 in FIG. 35; and

FIG. 37 is a cross-sectional view taken along a line 37-37 in FIG. 35.

DESCRIPTION OF THE PREFERRED EMBODIMENTS

Figure 1:
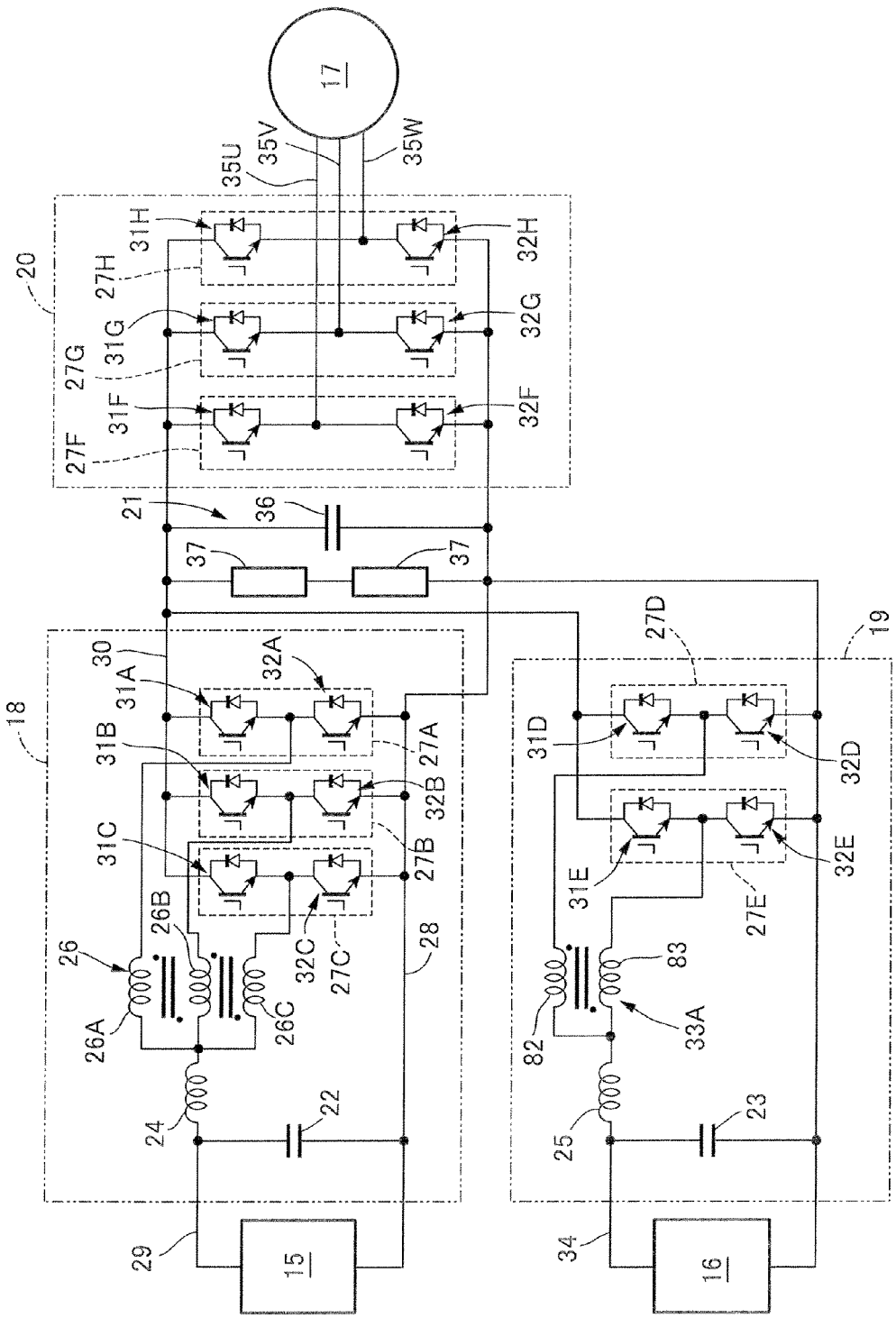

In the following, Embodiment 1 of the present invention is described referring to FIGS. 1 to 24. At first, referring to FIG. 1, a power conversion device is a device to be installed in a vehicle to convert direct current power obtained from a fuel cell 15, which is a first direct current power supply, and direct current power obtained from a storage battery 16, which is a second direct current power supply, into three-phase alternating current power to be supplied to an electric motor 17 generating power to drive a driving wheel. The power conversion device includes a first converter 18 which steps up or down the direct current voltage obtained from the fuel cell 15, a second converter 19 which steps up or down the direct current voltage obtained from the storage battery 16, an inverter 20 which converts the direct current voltage from the first and second converters 18 and 19 into an alternating voltage to drive the electric motor 17, and a DC link capacitor unit 21 provided between the both converters 18, 19 and the inverter 20.

The first converter 18 includes a first input capacitor 22, a first inductor 24, a three-phase transformer 26, a first, a second, and a third switching element modules 27A, 27B, and 27C. The three-phase transformer 26 has a primary coil 26A, a secondary coil 26B, and a tertiary coil 26C.

The negative terminal of the fuel cell 15 is connected to a ground line 28 common to the first converter 18, the second converter 19, and the inverter 20. The first input capacitor 22 is provided between the ground line 28 and a first input-side positive line 29, which is connected to the positive terminal of the fuel cell 15. One end of the first inductor 24 is connected to the first input-side positive line 29. Respective one ends of the primary coil 26A, the secondary coil 26B, and the tertiary coil 26C in the three-phase transformer 26 are connected in parallel to the other end of the first inductor 24.

The first switching element module 27A includes a first positive side switching element 31A and a first negative side switching element 32A. The first positive side switching element 31A is disposed between a common positive line 30 and the primary coil 26A of the three-phase transformer 26, the common positive line 30 being common to the first converter 18, the second converter 19, and the inverter 20. The first negative side switching element 32A is disposed between the primary coil 26A and the ground line 28. The second switching element module 27B includes a second positive side switching element 31B and a second negative side switching element 32B. The second positive side switching element 31B is disposed between the common positive line 30 and the secondary coil 26B of the three-phase transformer 26. The second negative side switching element 32B is disposed between the secondary coil 26B and the ground line 28. The third switching element module 27C includes a third positive side switching element 31C and a third negative side switching element 32C. The third positive side switching element 31C is disposed between the common positive line 30 and the tertiary coil 26C of the three-phase transformer 26. The third negative side switching element 32C is disposed between the tertiary coil 26C and the ground line 28.

The second converter 19 includes a second input capacitor 23, a second inductor 25, a two-phase transformer 33A having a primary coil 82 and a secondary coil 83, and a fourth and a fifth switching element modules 27D and 27E.

The second input capacitor 23 is provided between a second input-side positive line 34 connected to the positive side terminal of the storage battery 16 and the ground line 28 connected to the negative side terminal of the storage battery 16. One end of the second inductor 25 is connected to the second input-side positive line 34. Respective one ends of the primary coil 82 and the secondary coil 83 in the two-phase transformer 33A are connected in parallel to the other end of the second inductor 25.

The fourth switching element module 27D includes a fourth positive side switching element 31D and a fourth negative side switching element 32D. The fourth positive side switching element 31D is disposed between the common positive line 30 and the primary coil 82 of the two-phase transformer 33A. The fourth negative side switching element 32D is disposed between the primary coil 82 and the ground line 28. The fifth switching element module 27E includes a fifth positive side switching element 31E and a fifth negative side switching element 32E. The fifth positive side switching element 31E is disposed between the common positive line 30 and the secondary coil 83 of the two-phase transformer 33A. The fifth negative side switching element 32E is disposed between the secondary coil 83 and the ground line 28.

The inverter 20 includes a sixth, a seventh, and an eighth switching element modules 27F, 27G, and 27H.

The sixth switching element module 27F includes a sixth positive side switching element 31F and a sixth negative side switching element 32F. The sixth positive side switching element 31F is disposed between the common positive line 30 and a U-phase power supply line 35U connected to the electric motor 17 being a three-phase AC motor. The sixth negative side switching element 32F is disposed between the U-phase power supply line 35U and the ground line 28. The seventh switching element module 27G includes a seventh positive side switching element 31G and a seventh negative side switching element 32G. The seventh positive side switching element 31G is disposed between the common positive line 30 and a V-phase power supply line 35V connected to the electric motor 17. The seventh negative side switching element 32G is disposed between the V-phase power supply line 35V and the ground line 28. The eighth switching element module 27H includes an eighth positive side switching element 31H and an eighth negative side switching element 32H. The eighth positive side switching element 31H is disposed between the common positive line 30 and a W-phase power supply line 35W connected to the electric motor 17. The eighth negative side switching element 32H is disposed between the W-phase power supply line 35W and the ground line 28.

Now, in this embodiment, the first to eighth positive side switching elements 31A to 31H and the first to eighth negative side switching elements 32A to 32H in the first to eighth switching element modules 27A to 27H each includes an Insulated Gate Bipolar Transistor (IGBT), and a diode connected in parallel to each IGBT with a forward direction being a direction from an emitter to a collector.

The DC link capacitor unit 21 includes smoothing capacitors 36 provided between the common positive line 30 and the ground line 28. Although only one smoothing capacitor 36 is shown for the sake of simplicity in FIG. 1, the DC link capacitor unit 21 includes the smoothing capacitors 36 corresponding to respective phases of U-phase, V-phase, and W-phase of the three-phase AC electric motor 17, which are provided between the common positive line 30 and the ground line 28.

A series circuit including a pair of discharge resistances 37 is connected between the common positive line 30 and the ground line 28.

Figure 2:
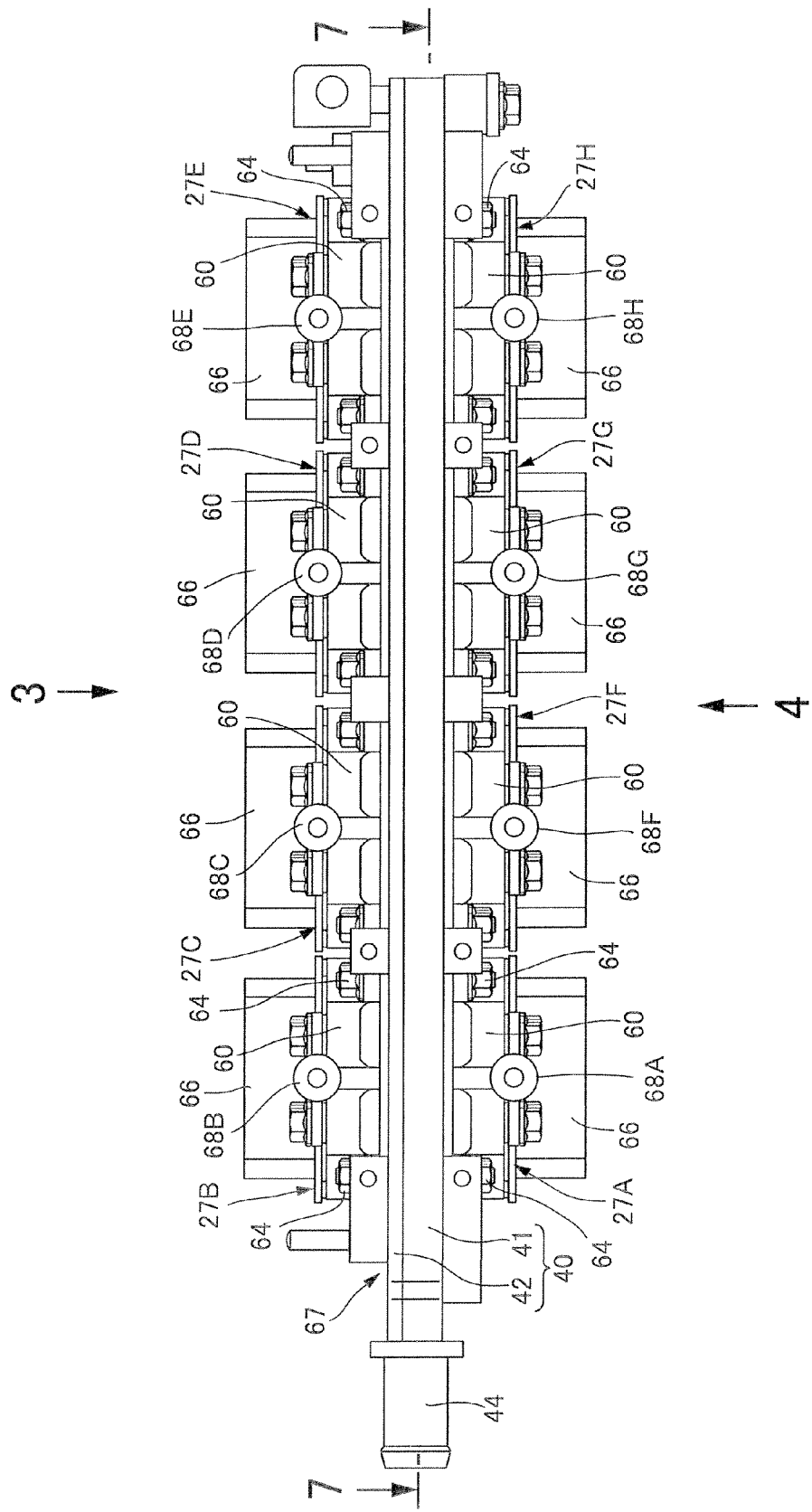
Figure 3:
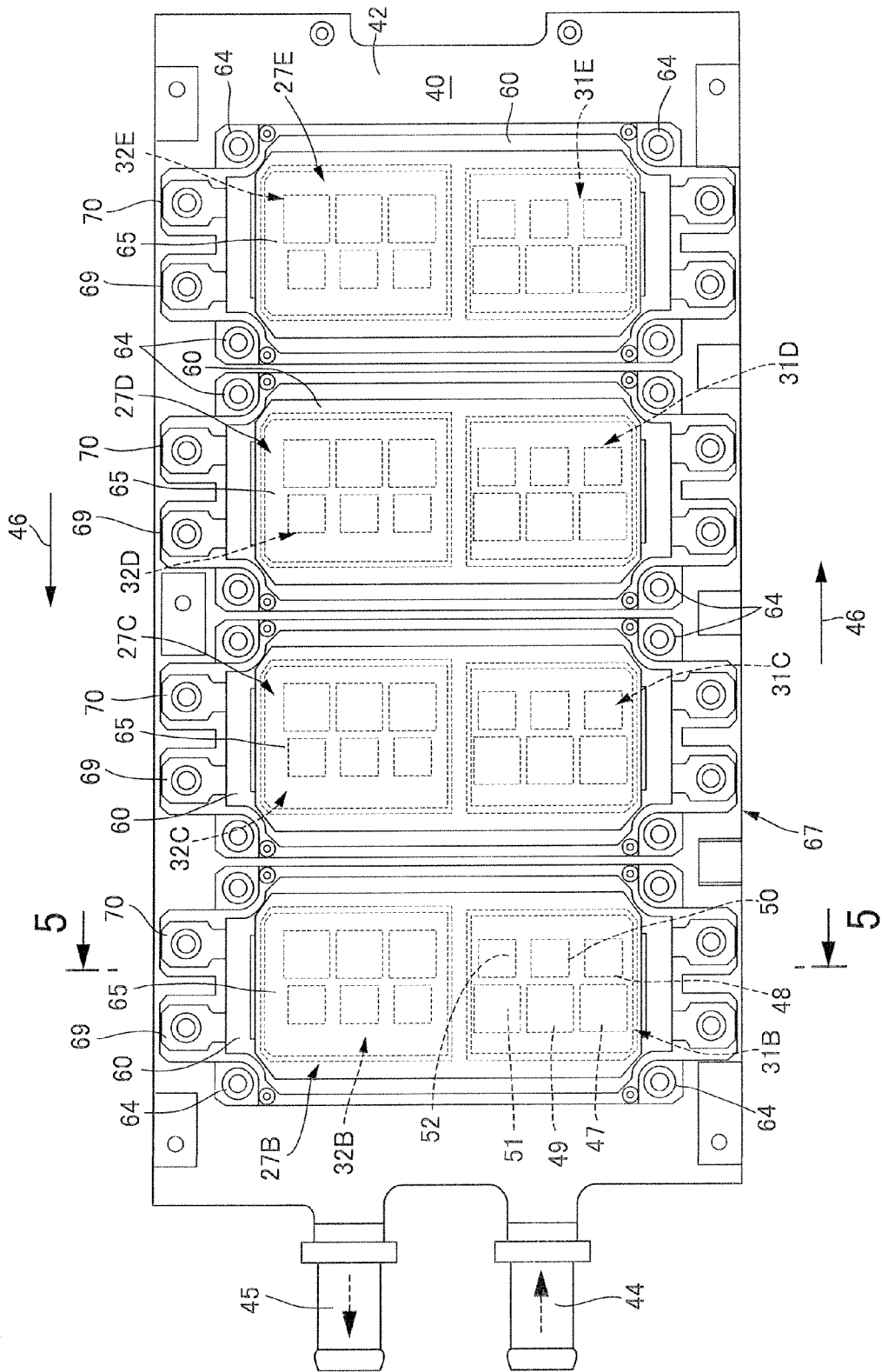
Figure 4:
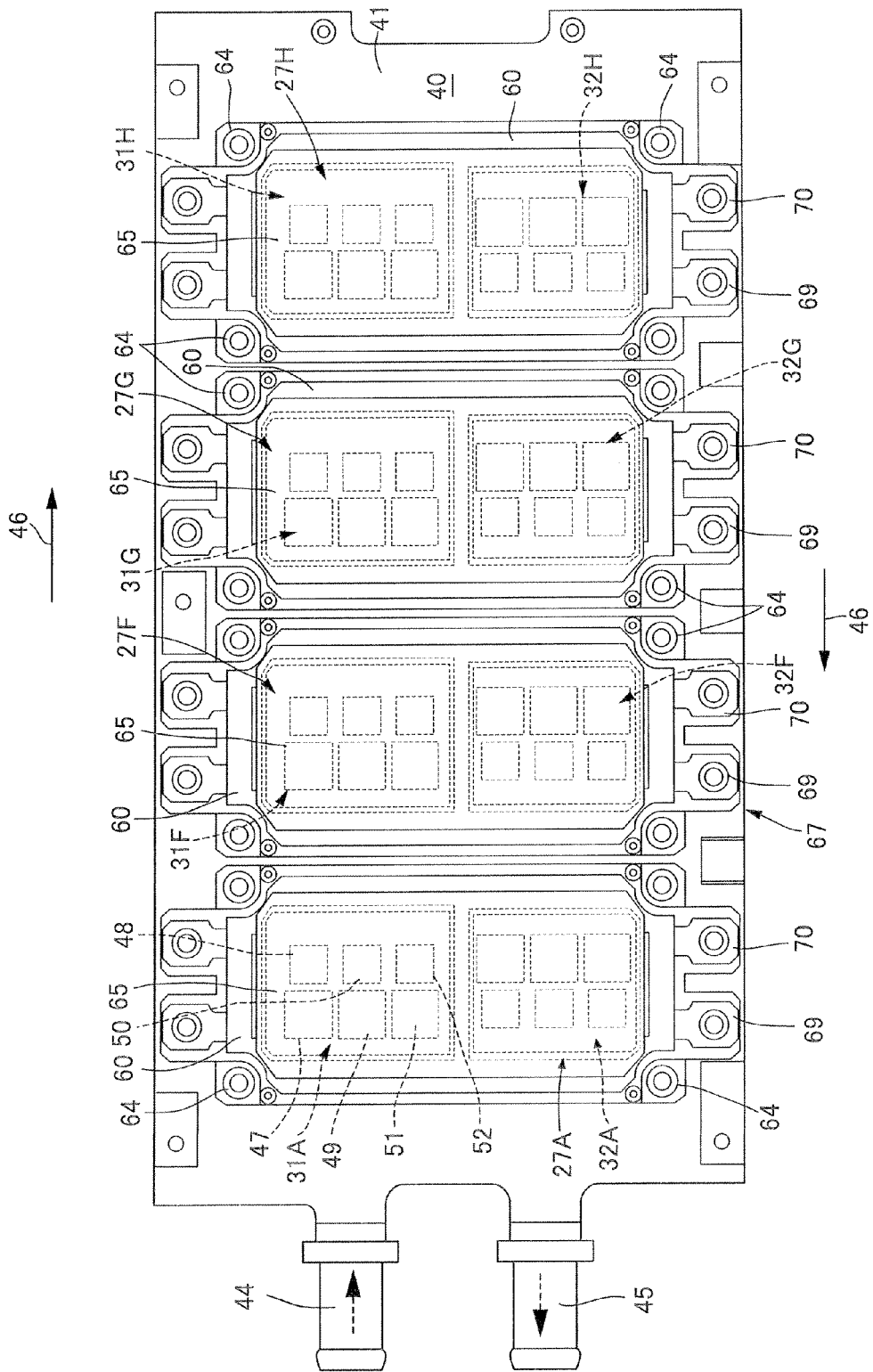

Referring to FIGS. 2 to 4 together, the first, second, and third switching element modules 27A, 27B, 27C included in the first converter 18, the fourth and fifth switching element modules 27D, 27E included in the second converter 19, and the sixth, seventh, and eighth switching element modules 27F, 27G, 27H included in the inverter 20 are disposed on the upper and lower surfaces of a water-cooled type first heat sink 40.

Figure 5:
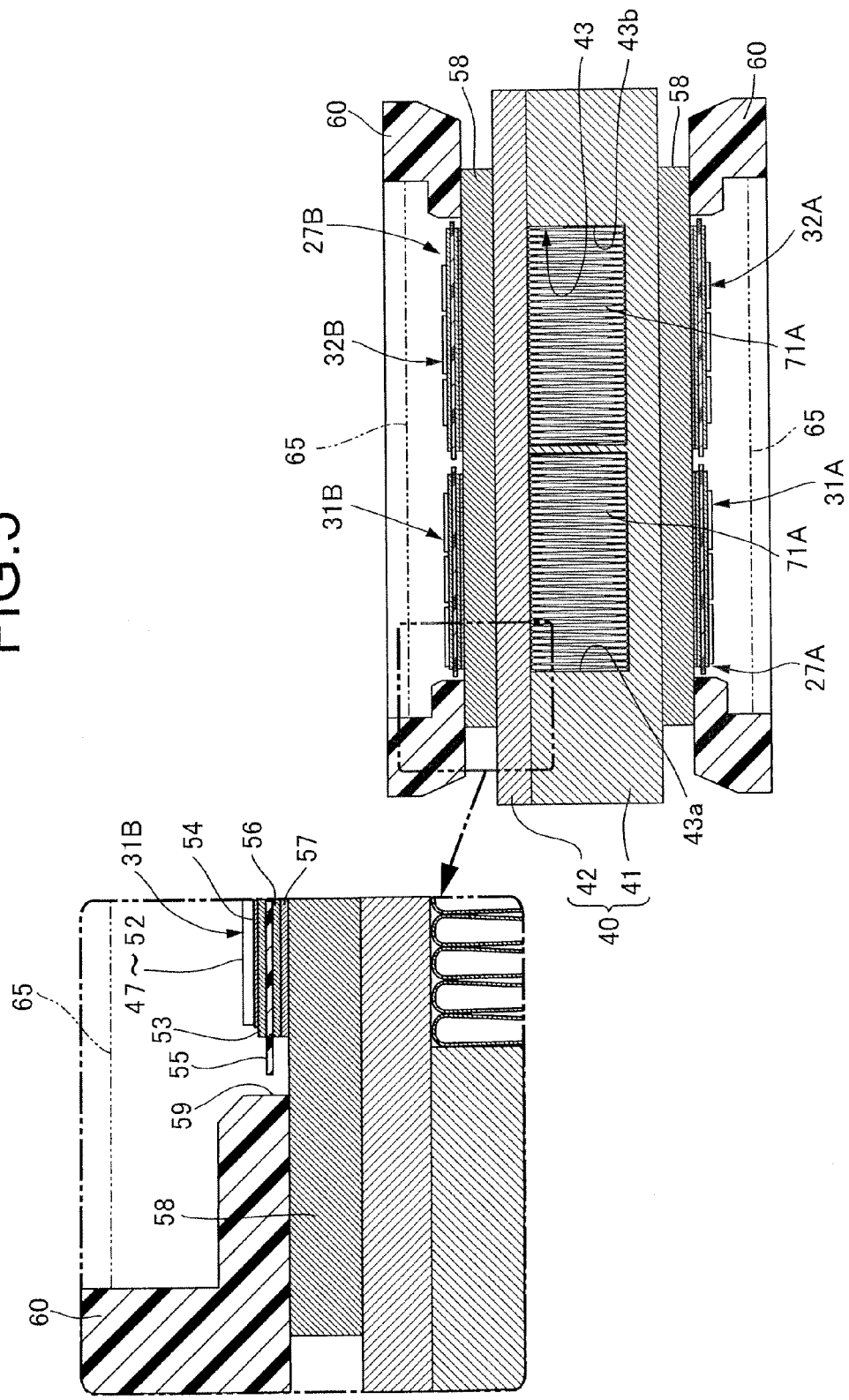
Figure 6:
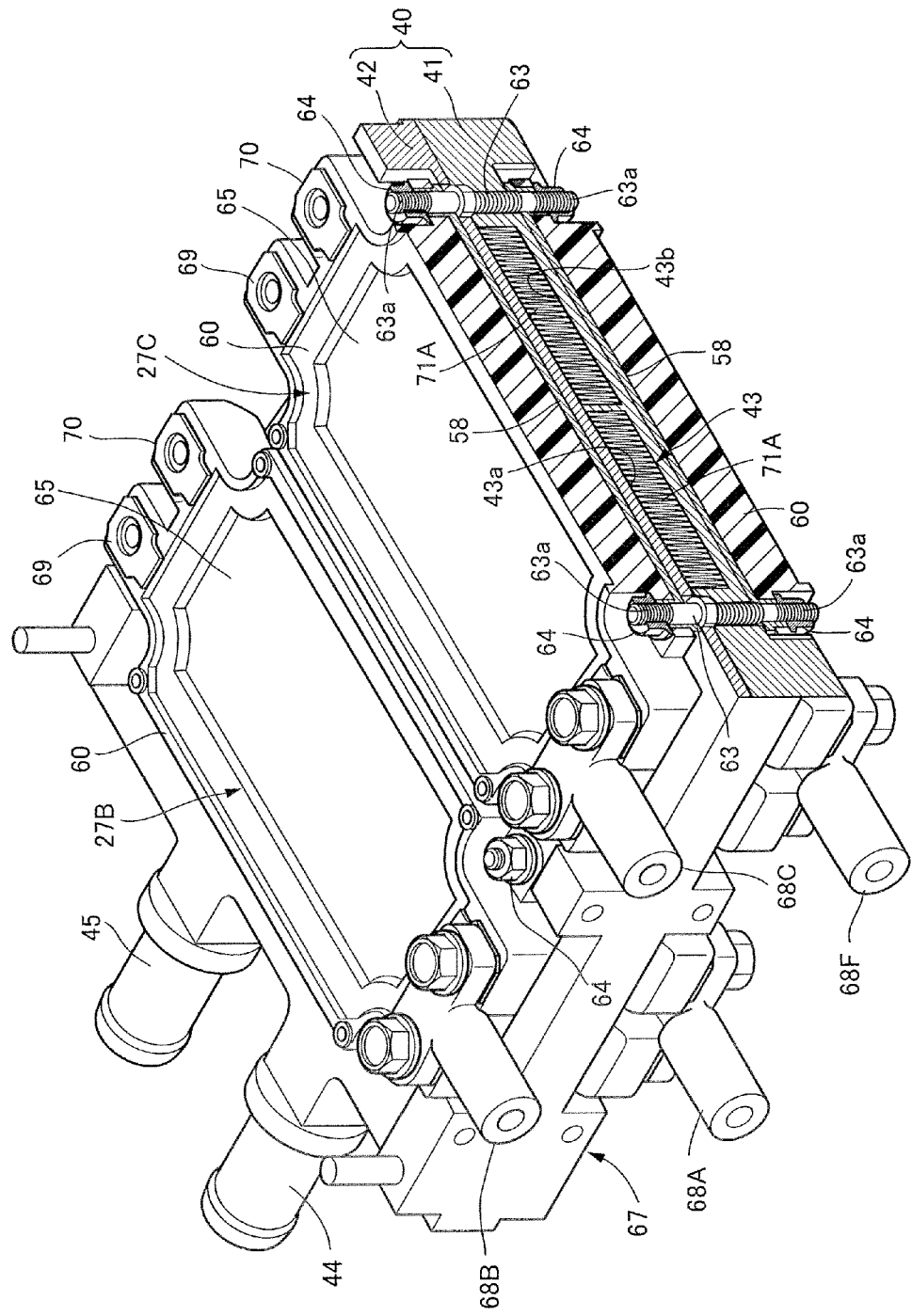
Figure 7:
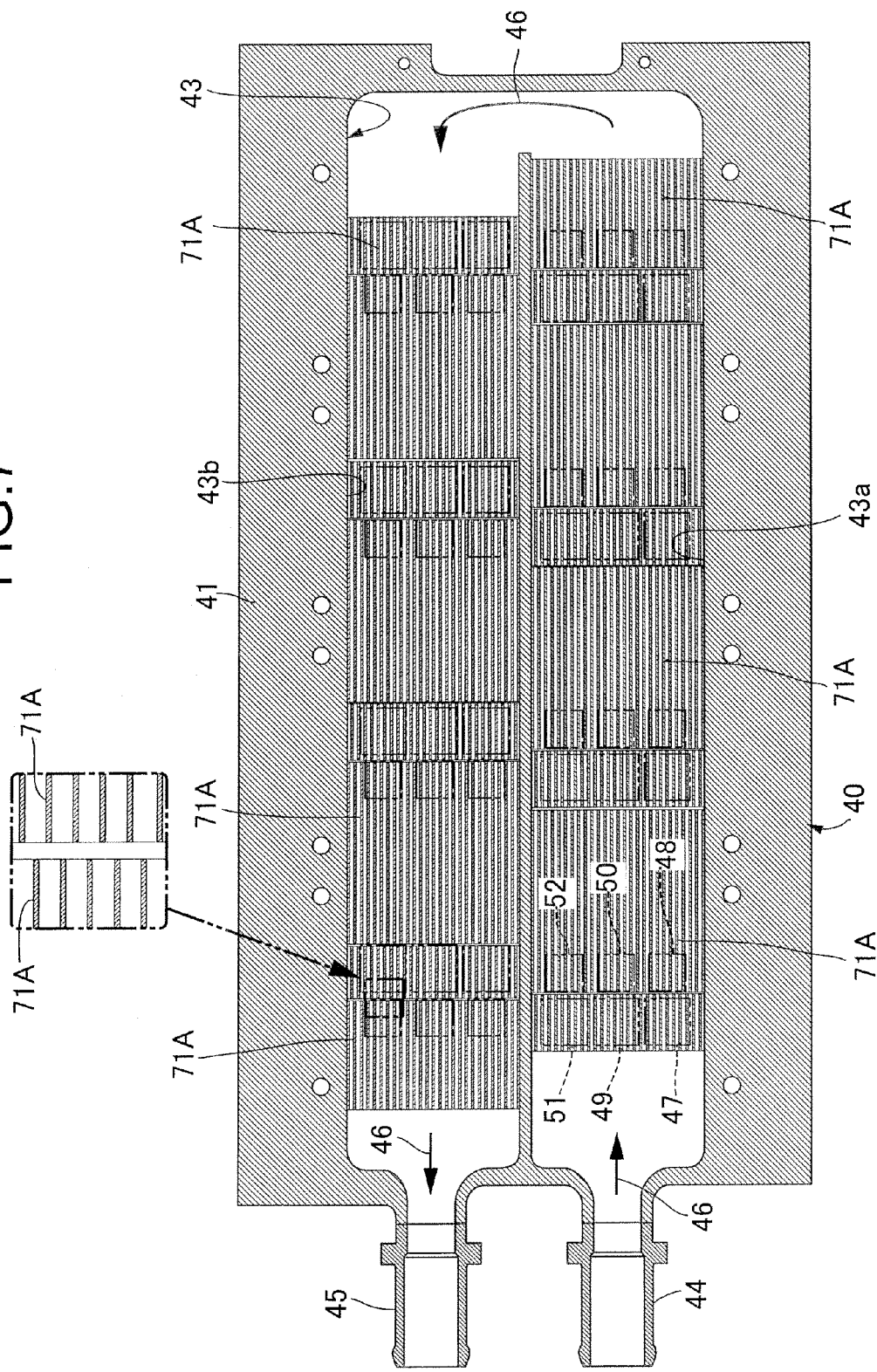

Further referring to FIGS. 5 to 7 together, the first heat sink 40 includes a heat sink body 41 formed extending longer in one direction, and a lid 42 coupled to the heat sink body 41 from above to form a first cooling water passage 43 between the heat sink body 41 and the lid 42. Thus, the first cooling water passage 43 is formed in such a manner that an outward passage portion 43a extending in the longitudinal direction of the heat sink 40 from one end of the first heat sink 40 toward the other end side thereof and a return passage portion 43b extending in parallel to the outward passage portion 43a from the other end of the first heat sink 40 toward the one end side thereof communicate with each other at the other end side of the first heat sink 40. One end of the first heat sink 40 includes a cooling water inlet pipe 44 leading to the outward passage portion 43a in the first cooling water passage 43 and a cooling water outlet pipe 45 leading to the return passage portion 43b in the first cooling water passage 43. The cooling water introduced from the cooling water inlet pipe 44 into the first cooling water passage 43 flows to the other end side of the first heat sink 40 through the outward passage portion 43a along the circulation direction shown by an arrow 46 in FIG. 7. The cooling water further flows around to the return passage portion 43b side at the other end side of the first heat sink 40 and is drawn from the cooling water outlet pipe 45 at the one end side of the first heat sink 40.

Incidentally, the first converter 18 includes three switching element modules, i.e., the first, second, and third switching element modules 27A, 27B, 27C, the second converter 19 includes two switching element modules, i.e., the fourth and fifth switching element modules 27D, 27E, and the inverter 20 includes three switching element modules, i.e., the sixth, seventh, and eighth switching element modules 27F, 27G, 27H. Thus, an even number of switching element modules are disposed on the upper and the lower surfaces of the first heat sink 40, specifically, eight switching element modules 27A to 27H in this embodiment. These switching element modules 27A to 27H are mounted on the upper and lower surfaces of the first heat sink 40 in a substantially symmetrical arrangement with respect to the first heat sink 40.

When the heat generation amount of the first to third switching element modules 27A to 27C is e.g. 700 W, the heat generation amount of the fourth and the fifth switching element modules 27D, 27E is e.g. 500 W, and the heat generation amount of the sixth to eighth switching element modules 27F to 27H is e.g. 1100 W. Thus, a switching element module with a higher heat generation amount is disposed on the first heat sink's 40 lower surface where cooling is easier, while the first to eighth switching element modules 27A to 27H are mounted on the upper and lower surfaces of the first heat sink 40 in an substantially symmetrical arrangement with respect to the first heat sink 40. In the present embodiment, the second and third switching element modules 27B, 27C, and the fourth and fifth switching element modules 27D, 27E are disposed on the upper surface of the first heat sink 40, while the first switching element module 27A, and the sixth, seventh, and eighth switching element modules 27F, 27G, 27H are disposed on the lower surface of the first heat sink 40.

Directing attention to FIG. 5, the first to eighth switching element modules 27A to 27H are on the upper and lower surfaces of the first heat sink 40 in such a manner that the first to eighth positive side switching elements 31A to 31H are arranged at one side of the first heat sink 40 in its width direction, i.e., the outward passage portion 43a side of the first cooling water passage 43 in the present embodiment, while the first to eighth negative side switching elements 32A to 32H are arranged at the other side of the first heat sink 40 in its width direction, i.e., the return passage portion 43b side of the first cooling water passage 43 in the present embodiment.

The multiple chips included in each of the first to eighth positive side switching elements 31A to 31H and the first to eighth negative side switching elements 32A to 32H, i.e., six chips 47, 48, 49, 50, 51, 52 in the present embodiment, are arranged in such a manner that, as shown in FIGS. 3 and 4, every two chips are aligned side-by-side along the circulation direction 46 of the cooling water in the first cooling water passage 43. As shown in FIG. 5, the chips are disposed on a copper electrode 53 with a solder layer 54 interposed therebetween. A copper electrode 56 interposing an insulating substrate 55 between itself and the copper electrodes 53, is fixed to a copper base plate 58 with a solder layer 57 interposed between the copper electrode 56 and the copper base plate 58.

Synthetic resin cases 60 formed in a rectangular frame shape are arranged on the copper base plate 58. Each case 60 has an opening 59 to dispose corresponding one of pairs of the first to eighth positive side switching elements 31A to 31H and the first to eighth negative side switching elements 32A to 32H for the first to eighth switching element modules 27A to 27H, respectively. The copper base plates 58 and the cases 60 are fixed to the first heat sink 40.

On the first heat sink 40, as clearly shown in FIG. 6, multiple stud bolts 63 each having threaded shank portions 63a at opposite ends thereof are implanted at the positions corresponding to four corners of each case 60 in such a manner that the threaded shank portions 63a project from the upper and lower surfaces of the first heat sink 40. The cases 60 and the copper base plates 58 of the first to eighth switching element modules 27A to 27H are secured by fastening the nuts 64 engaging with the threaded shank portions 63a of selected ones of stud bolts 63 out of all the stud bolts 63, and thereby the first to eighth switching element modules 27A to 27H are mounted on the upper and lower surfaces of the first heat sink 40.

Also a coated layer 65 made of a synthetic resin is formed inside each case 60 so as to embed therein the chips 47 to 52, the copper electrode 53, the solder layer 54, the insulating substrate 55, the copper electrode 56, and the solder layer 57. The first to eighth positive side switching elements 31A to 31H and the first to eighth negative side switching elements 32A to 32H of the first to the eighth switching element modules 27A to 27H are sealed inside the coated layer 65. Also, each case 60 is mounted with a control circuit 66 to control switching on/off of the corresponding one of first to eighth positive side switching elements 31A to 31H and the corresponding one of first to eighth negative side switching elements 32A to 32H of the first to eighth switching element modules 27A to 27H, in a manner that each control circuit 66 covers the corresponding one of first to eighth switching element modules 27A to 27H.

The first heat sink 40, the first to eighth switching element modules 27A to 27H mounted on the upper and lower surfaces of the first heat sink 40, and the control circuits 66 form a switching element assembly unit 67.

Now, the first to eighth switching element modules 27A to 27H are mounted to the first heat sink 40 in such a manner that terminals to be connected to the three-phase transformer 26, the two-phase transformer 33A, and the electric motor 17 are arranged at one side of the first heat sink 40 in its width direction. Terminal members 68A, 68B, 68C of the first to third switching element modules 27A to 27C, which are coupled to the terminals to be connected to the three-phase transformer 26, terminal members 68D, 68E of the fourth and fifth switching element modules 27D, 27E, which are coupled to the terminals to be connected to the two-phase transformer 33A, and terminal members 68F, 68G, 68H of the sixth to eighth switching element modules 27F to 27H, which are coupled to the terminal to be connected to the electric motor 17 are mounted on the cases 60 so as to be arranged on one side of the first heat sink 40 in its width direction.

A positive side connection terminal 69 to be connected to the common positive line 30 and a negative side connection terminal 70 to be connected to the ground line 28 in each of the switching element modules 27A to 27H are mounted on the case 60 in a side-by-side arrangement for each of the switching element modules 27A to 27H at the other side of the first heat sink 40 in its width direction.

The first cooling water passage 43 included in the first heat sink 40 has multiple cooling fins 71A which are integrally molded of a light metal such as aluminum alloy, and have a continuous U or V shape waveform cross section in a direction perpendicular to the circulation direction 46. The cooling fins 71A are disposed to extend along the circulation direction 46 while dividing the inside of the first cooling water passage 43 into multiple portions in the width direction.

On the other hand, the multiple chips 47 to 52 included in each the first to eighth positive side switching elements 31A to 31H and the first to eighth negative side switching elements 32A to 32H of the first to eighth switching element modules 27A to 27H are arranged by twos side-by-side along the circulation direction 46 of the cooling water in the first cooling water passage 43, i.e., the chips 47, 48, the chips 49, 50, and the chips 51, 52 are arranged in such manner that each pair is arranged side-by-side along the circulation direction 46.

Also, the chips 47, 49, 51 are disposed at the same location in the circulation direction 46 at the upstream side along the circulation direction 46, and the chips 48, 50, 52 are disposed at the same location in the circulation direction 46 at the downstream along the circulation direction 46. The second to fifth positive side switching elements 31B to 31E and the second to fifth negative side switching elements 32B to 32E of the second to fifth switching element modules 27B to 27E on the upper surface side of the first heat sink 40, and the first, the sixth to eighth positive side switching elements 31A, 31F to 31H and the first, the sixth to eighth negative side switching elements 32A, 32F to 32H of the first, the sixth to eighth switching element modules 27A, 27F to 27H on the lower surface side of the first heat sink 40 have the chips 47 to 52 disposed at such locations that the chips 47 to 52 are arranged relative to the circulation direction 46, as shown in FIGS. 3 and 4.

Figure 8A:
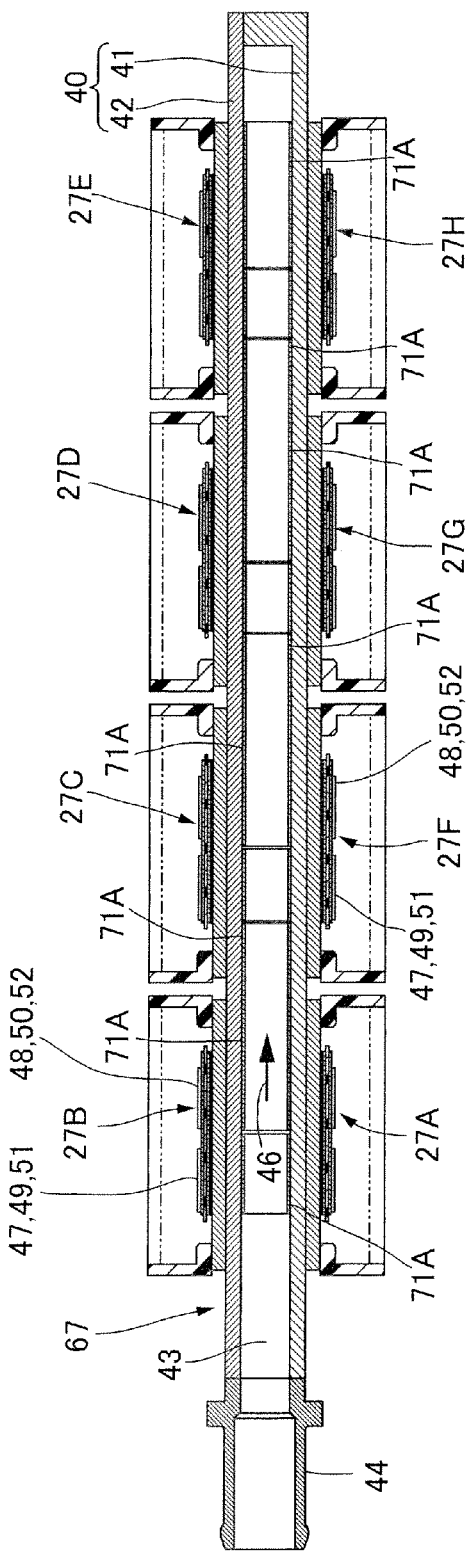
FIG. 8A is a longitudinal cross-sectional view of the switching element assembly unit.

On the other hand, for the cooling fins 71A, their length along the circulation direction 46 is determined according to the distance between the upstream chips 47, 49, 51 and the downstream chips 48, 50, 52 in the circulation direction 46 as shown in FIGS. 7 and 8A. The cooling fins 71A are separated into groups for the respective chips 47, 49, 51; 48, 50, 52 arranged side by side in the circulation direction 46, and, as clearly shown in FIG. 7, the groups of cooling fins 71A are offset from each other in a direction perpendicular to the circulation direction 46.

Figure 8B:
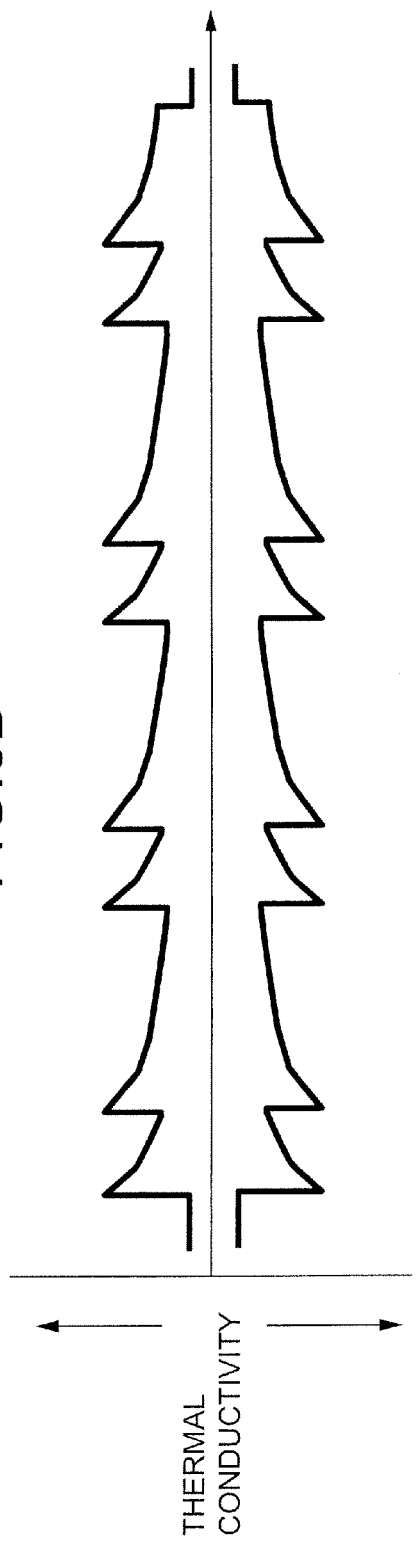
FIG. 8B is a diagram showing a change of a thermal conductivity in a direction of cooling water circulation in a first heat sink, in comparison with FIG. 8A.
Figure 10:
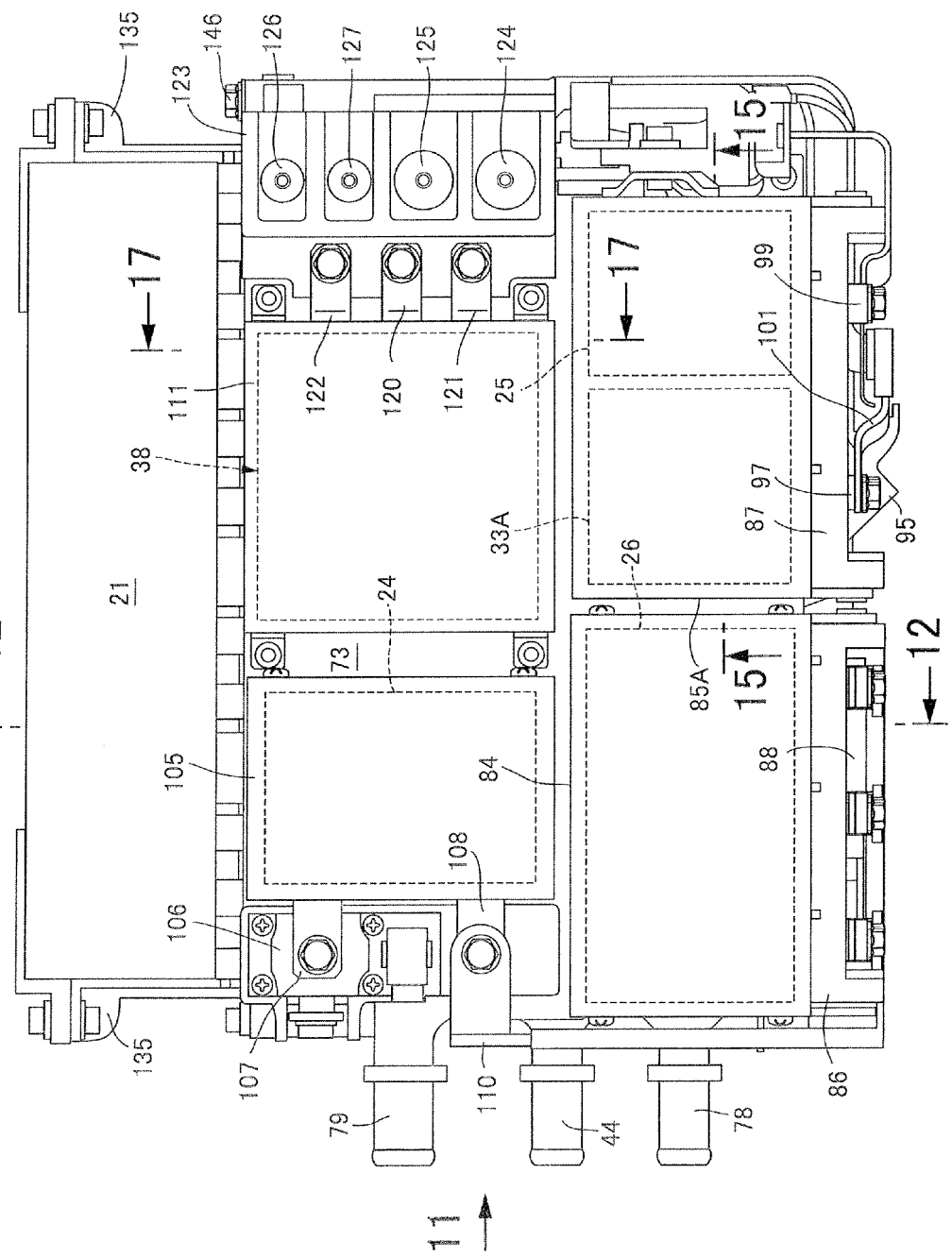
Figure 11:
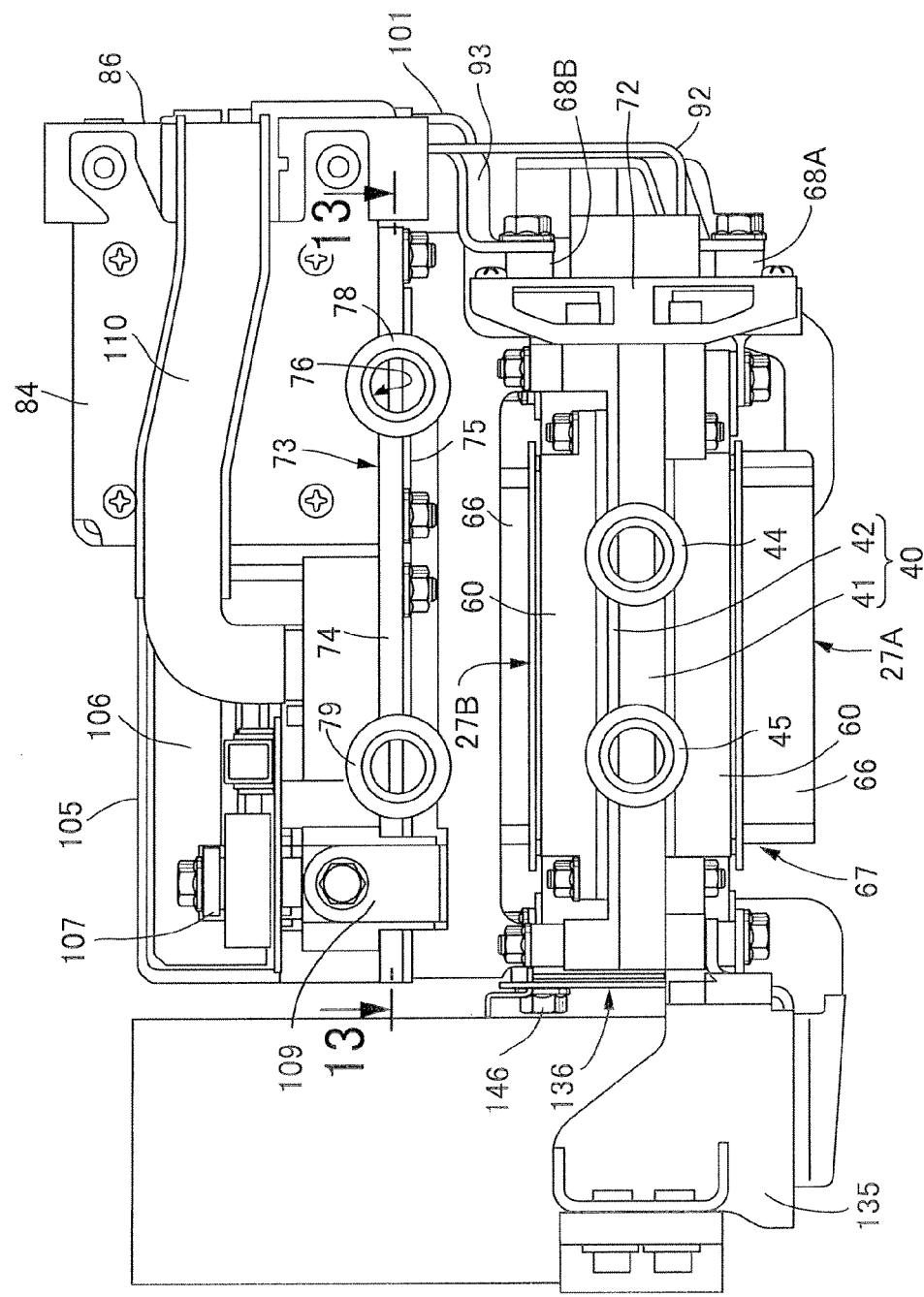

By the way, it is known that when cooling water flows through each of the cooling fins 71A, a thermal entrance region exists near the inlet of each of the cooling fins 71A due to a change in the flow velocity distribution. In the entrance region, the thermal conductivity decreases in a downstream direction, and approaches to a certain thermal conductivity in a hydrodynamically developed region where the flow velocity becomes constant after the cooling water passes through the entrance region. Though relatively high thermal conductivity is achieved in the entrance region, in the hydrodynamically developed region, a boundary layer with the surface of the cooling fin 71A becomes thick and the heat transfer efficiency is reduced. Accordingly, when long, continuous fins are disposed along the circulation direction 46 in the first cooling water passage 43, it is difficult to obtain a high cooling efficiency across the entire first cooling water passage 43. However, as described above, the set of cooling fins 71A is separately arranged for each of the sets of chips of 47, 49, 51 and the sets of chips 48, 50, 52 aligned along the circulation direction 46, and also the sets of cooling fins 71A for the set of chips 47, 49, 51 are arranged to be offset from the sets of cooling fins 71A for the set of chips 48, 50, 52 in a direction perpendicular to the circulation direction 46. Accordingly, a thermal entrance region as shown in FIG. 8B can be formed at an inlet of each set of the cooling fins 71A separately arranged for the corresponding one of sets of chips 47, 49, 51 and sets of chips 48, 50, 52 aligned along the circulation direction 46. Thus, it becomes possible to obtain a high cooling efficiency across the entire first cooling water passage 43.

Referring to FIGS. 9 to 12 together, at one side of the switching element assembly unit 67, a substrate 72 to dispose a current sensor and the like is arranged in a manner that the terminal members 68A to 68H mounted to the cases 60 arranged at the one side of the first heat sink 40 in its width direction penetrates the substrate 72. The substrate 72 is fixed to the first heat sink 40. Above the switching element assembly unit 67, a second heat sink 73 is arranged. The first inductor 24 and the three-phase transformer 26 in the first converter 18, the second inductor 25 and the two-phase transformer 33A in the second converter 19, a capacitor unit 38 configured by integrating the first input capacitor 22 of the first converter 18 and the second input capacitor 23 of the second converter 19 are arranged above the second heat sink 73 with the second heat sink 73 interposed between the switching element assembly units 67 and the components.

The second heat sink 73 includes a heat sink body 74 formed extending longer in the same direction as the longitudinal direction of the first heat sink 40, and a lid 75 coupled to the heat sink body 74 from below to form a second cooling water passage 76 between the heat sink body 74 and the lid 75. The second heat sink 73 is formed to be thinner than the first heat sink 40.

Figure 13:
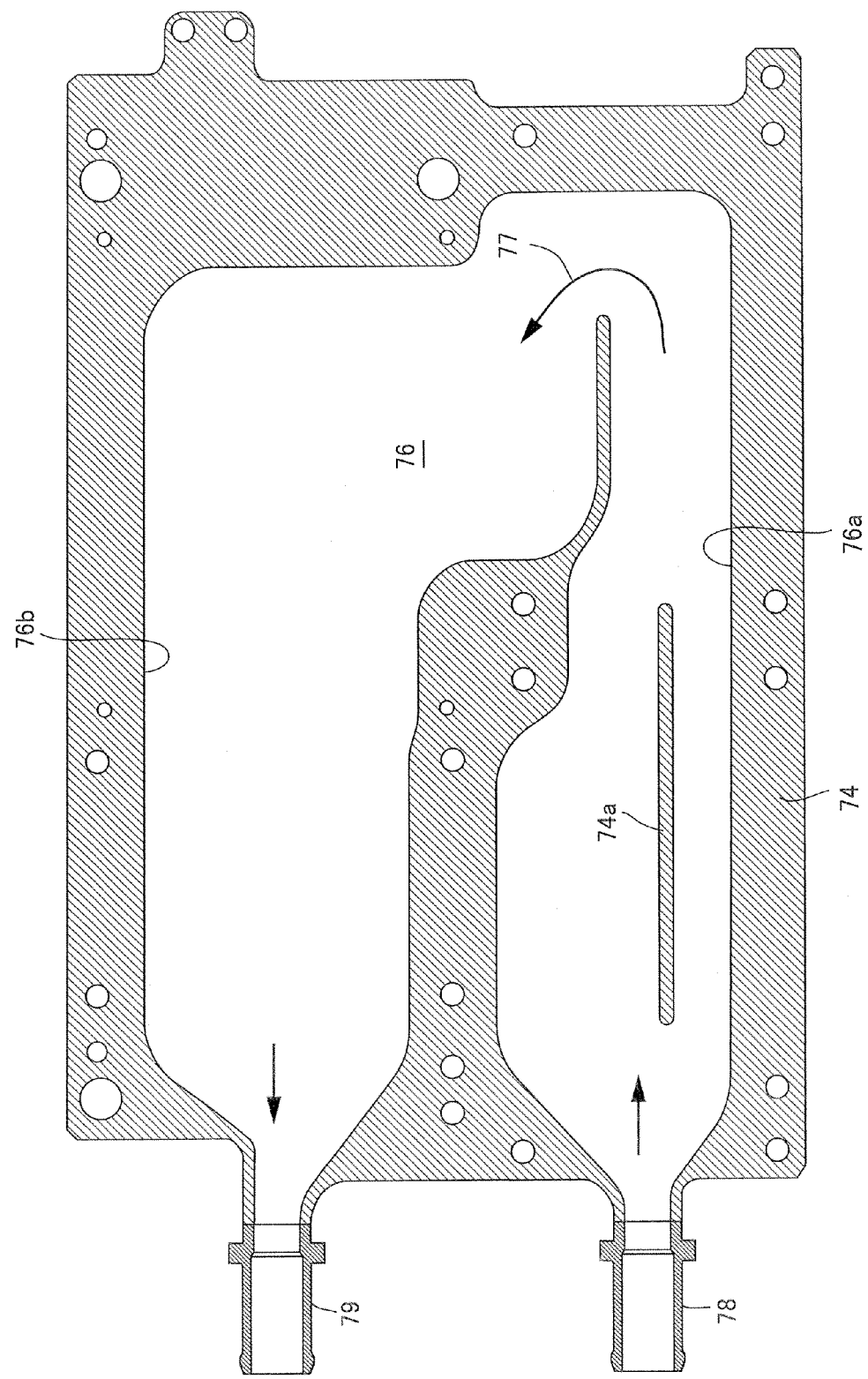

In FIG. 13, the second cooling water passage 76 is formed between the heat sink body 74 and the lid 75 in such a manner that an outward passage portion 76a extending in the longitudinal direction of the heat sink 73 from one end of the second heat sink 73 toward the other end side thereof and a return passage portion 76b extending in parallel to the outward passage portion 76a from the other end of the second heat sink 73 toward the one end side thereof communicate with each other at the other end side of the second heat sink 73. One end of the second heat sink 73 includes a cooling water inlet pipe 78 leading to the outward passage portion 76a and a cooling water outlet pipe 79 leading to the return passage portion 76b. The cooling water introduced from the cooling water inlet pipe 78 into the second cooling water passage 76 flows to the other end side of the second heat sink 73 through the outward passage portion 76a of the second cooling water passage 76 along the circulation direction shown by an arrow 77. The cooling water further flows around to the return passage portion 76b side at the other end side of the second heat sink 73 and is drawn from the cooling water outlet pipe 79 at the one end side of the second heat sink 73. The heat sink body 74 in the second heat sink 73 is integrally provided with a straightening vane portion 74a, which is arranged in the outward passage portion 76a of the second cooling water passage 76 in a manner extending along the circulation direction 77.

Figure 14:
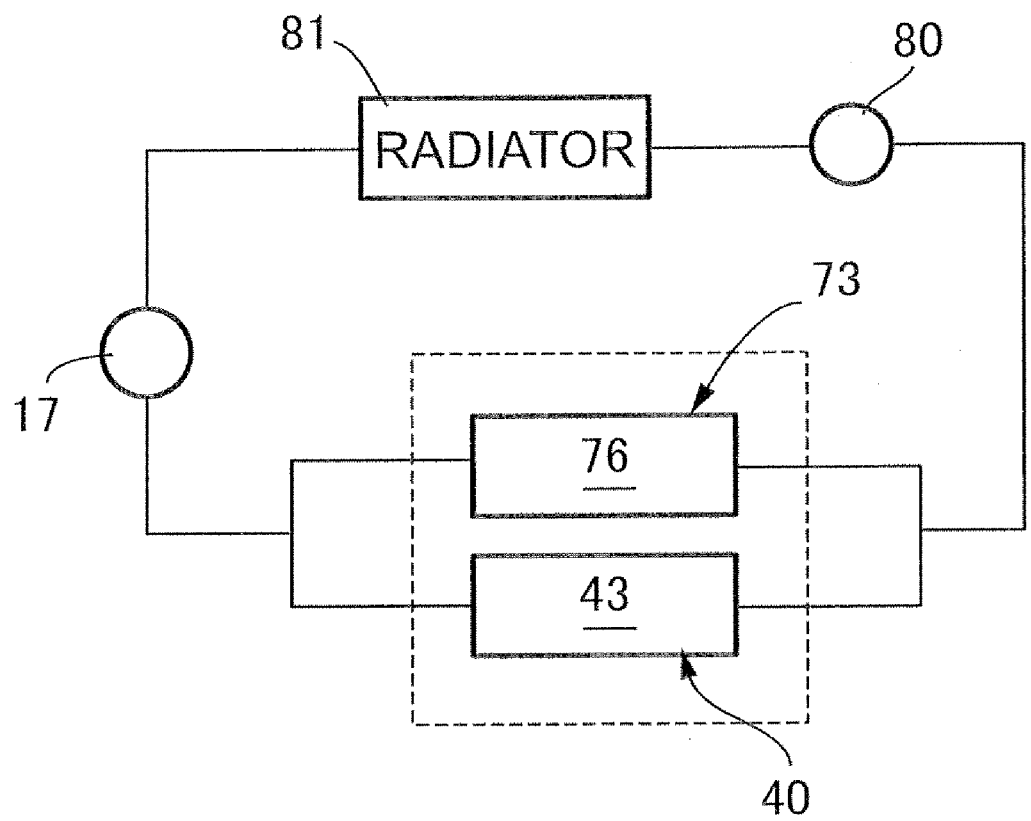

In FIG. 14, the first cooling water passage 43 in the first heat sink 40, and the second cooling water passage 76 in the second heat sink 73 are connected in parallel to an exhaust port of a cooling water pump 80 as a cooling water supply source. Cooling water drawn from the first and second cooling water passages 43 and 76 cools the electric motor 17, and is then cooled by a radiator 81 and returns to the intake port of the cooling water pump 80.

The three-phase transformer 26 of the first converter 18 is housed in a first housing case 84 so as to be arranged at a position at one side of the first and second heat sinks 40 and 73 in their width direction, i.e., the side at which substrate 72 is arranged, and at one end side of the first and second heat sinks 40 and 73, i.e., the side at which the cooling water inlet pipes 44, 78 and the cooling water outlet pipes 45, 79 are provided. The first housing case 84 is fixed on the second heat sink 73.

The two-phase transformer 33A of the second converter 19 is arranged at the one side of the first and the second heat sinks 40, 73 in their width direction so as to be aligned with the three-phase transformer 26. The second inductor 25 of the second converter 19 is arranged at the one side of the first and the second heat sinks 40, 73 in their width direction with the two-phase transformer 33A interposed between the second inductor 25 and the three-phase transformers 26. The two-phase transformer 33A and the second inductor 25 fixed on the second heat sink 73 are housed in a second housing case 85A which is fixed to the heat sink body 74 of the second heat sink 73.

Figure 15:
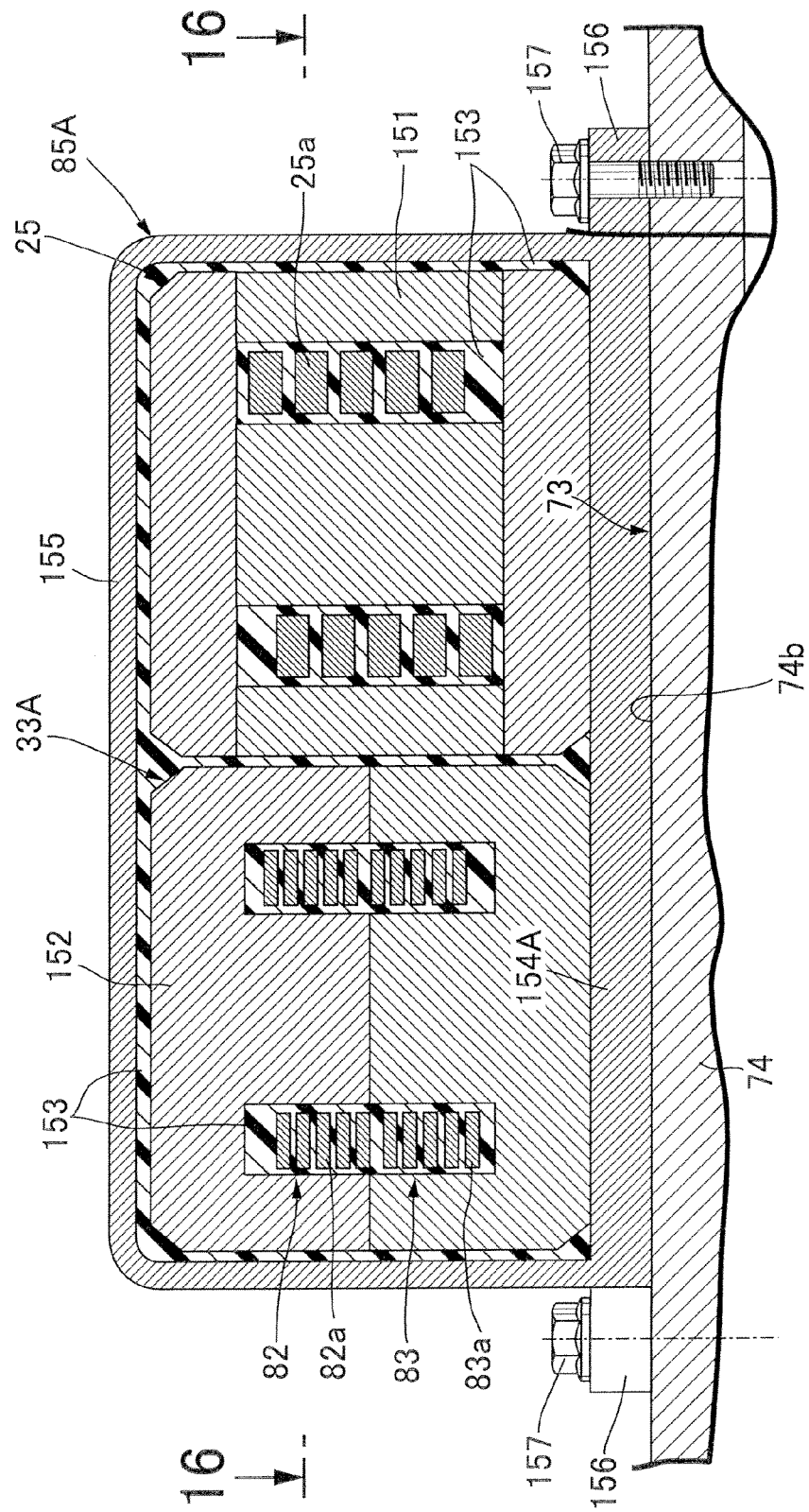
Figure 16:
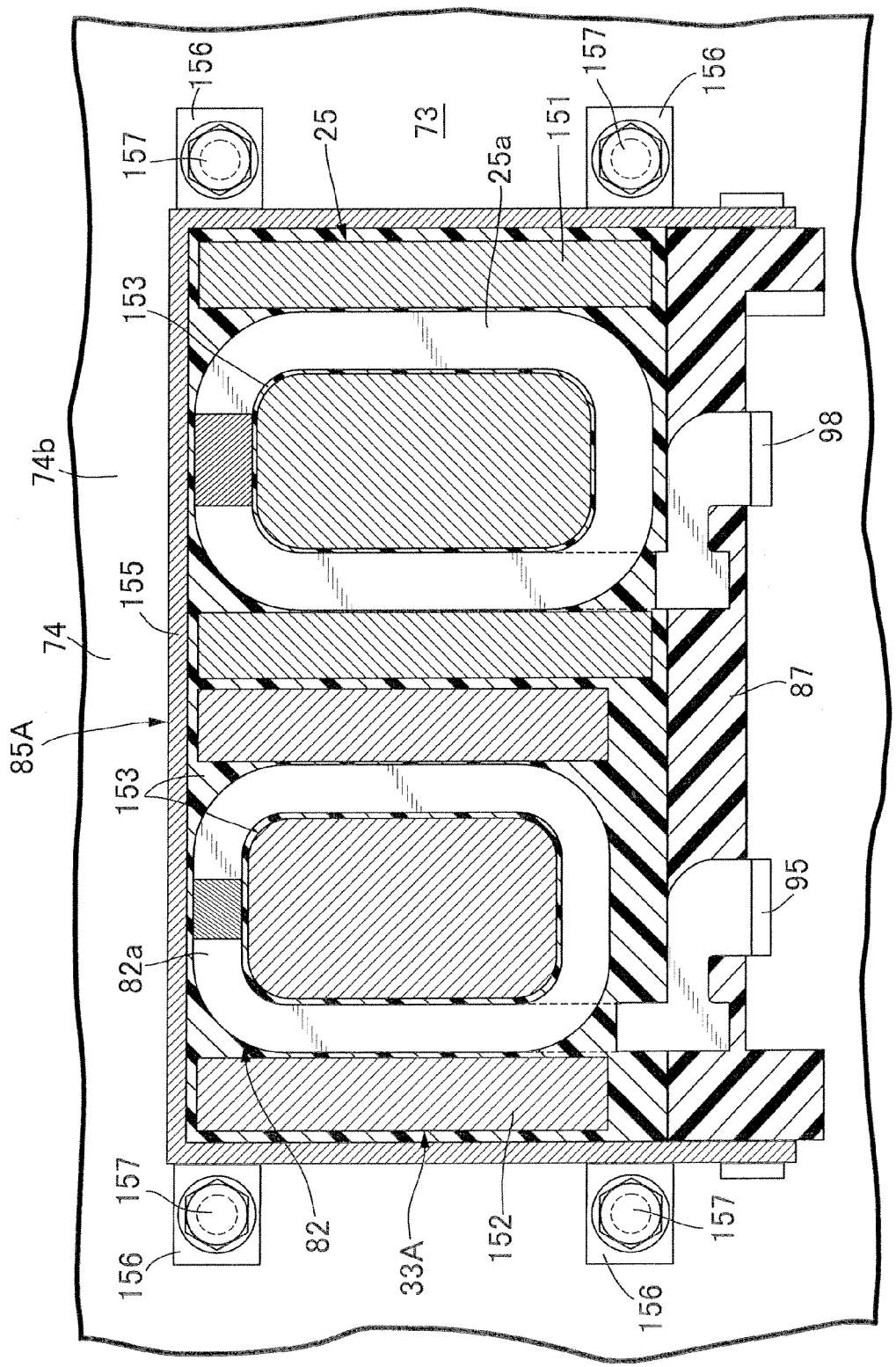

In FIGS. 15 and 16, the second inductor 25 and the two-phase transformer 33A in the second converter 19 are housed in the same second housing case 85A made of metal. The second housing 85A is mounted on a flat mounting surface 74b formed on the heat sink body 74 of the second heat sink 73.

A winding portion 25a of the second inductor 25 is mounted on a core 151. Winding portions 82a, 83a of the respective primary coil 82 and secondary coil 83 in the two-phase transformer 33A are arranged side-by-side with their axes coinciding with each other, and are mounted on a core 152. The winding portion 25a and the core 151 in the second inductor 25, and the winding portion 82a of the primary coil 82, the winding portion 83a of the secondary coil 83, and the core 152 in the two-phase transformer 33A are covered by a resin covering portion 153 made of a synthetic resin.

By the way, the second inductor 25 and the two-phase transformer 33A covered by the resin covering portion 153 are housed in the second housing case 85A in such a manner that the axes of their winding portions 25a, 82a, 83a are perpendicular to the mounting surface 74b of the second heat sink 73. The second housing case 85A includes a supporting plate portion 154A being in contact with the cores 151, 152 of the second inductor 25 and the two-phase transformer 33A, and a cover portion 155 which is disposed contiguously to the supporting plate portion 154A, and covers the second inductor 25 and the two-phase transformer 33A.

Incidentally, the supporting plate portion 154A in the second housing case 85A is formed to have a greater plate thickness than that of the cover portion 155 and to project laterally outward more than the cover part 155 so that multiple, e.g., four mounting arm portions 156 integral to the supporting plate portion 154A are fastened to the mounting surface 74b of the second heat sink 73 by respective bolts 157. Namely, the supporting plate portion 154A in contact with the cores 151, 152 of the second inductor 25 and the two-phase transformer 33A is formed to have a greater plate thickness than that of the cover portion 155 and is mounted on the mounting surface 74b while being in contact therewith.

As shown in FIGS. 9 to 12, a first terminal block 86 located above the substrate 72 is fixed to the first housing case 84. The first terminal block 86 includes a common terminal 88 to connect the coils 26A, 26B, 26C of the three-phase transformer 26 to the first inductor 24, and individual terminals 89, 90, 91 to individually connect the coils 26A, 26B, 26C to the first to third switching element modules 27A to 27C, respectively. The individual terminals 89 to 91 are connected to the terminal members 68A, 68B, 68C, which penetrate through the substrate 72 while coupling to the terminals to be connected to the three-phase transformer 26 of the first to third switching element modules 27A to 27C via bus bars 92, 93, 94 located outside the substrate 72, respectively.

A second terminal block 87 positioned above the substrate 72 is fixed to the second housing case 85A. The second terminal block 87 includes a common terminal 95 to connect the coils 82, 83 of the two-phase transformer 33A to the second inductor 25, and individual terminals 96, 97 to connect the coils 82, 83 to the fourth and fifth switching element module 27D, 27E, respectively. Here, the individual terminal 96 is arranged below the common terminal 95, and the individual terminal 97 is arranged above the common terminal 95. The second terminal block 87 also includes terminals 98, 99 which couple to opposite ends of the second inductor 25, respectively. The individual terminals 96, 97 are connected to terminal members 68D, 68E, which penetrate through the substrate 72 while coupling to the terminals to be connected to the two-phase transformer 33A of the fourth and fifth switching element modules 27D, 27E, via bus bars 100, 101 located outside the substrate 72, respectively. Also, the common terminal 95 and the terminal 98 are connected via a bus bar 102.

The first inductor 24 of the first converter 18 is arranged so as to be aligned with the three-phase transformer 26 at the other side of the first and second heat sinks 40, 73 in their width direction, i.e., the opposite side from where the substrate 72 is arranged, and at the one end side of the first and second heat sinks 40, 73, i.e., the side at which the cooling water inlet pipes 44, 78 and the cooling water outlet pipes 45, 79 are provided. The first inductor 24 is housed in a third housing case 105, which is fixed on the second heat sink 73. Also, a third terminal block 106 is fixed to the housing case 105 so as to be arranged at one end side of the first and second heat sinks 40, 73.

The third terminal block 106 includes terminals 107, 108 which couple to opposite ends of the first inductor 24, respectively. The one terminal 107 is connected to a bus bar 109 which extends to the other end side of the second heat sink 73 in its longitudinal direction between the switching element assembly unit 67 and the second heat sink 73. The other terminal 108 is connected to the common terminal 88 provided on the first terminal block 86 via a bus bar 110.

The capacitor unit 38 is arranged so as to be aligned with the first inductor 24 at the other side of the first and second heat sinks 40, 73 in their width direction, i.e., the opposite side from where the substrate 72 is arranged. A fourth housing case 111 housing the capacitor unit 38 is fixed to the second heat sink 73.

Figure 17:
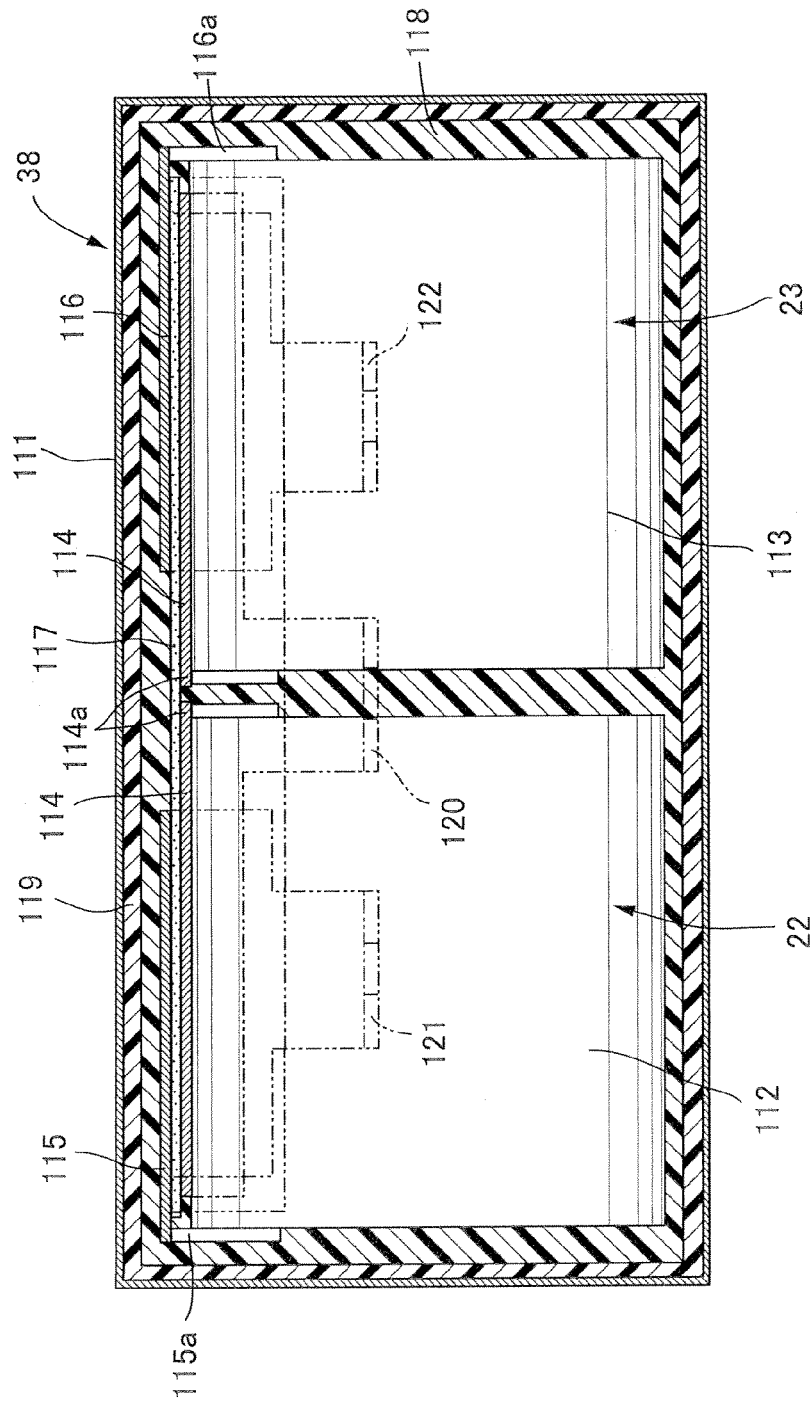
Figure 18:
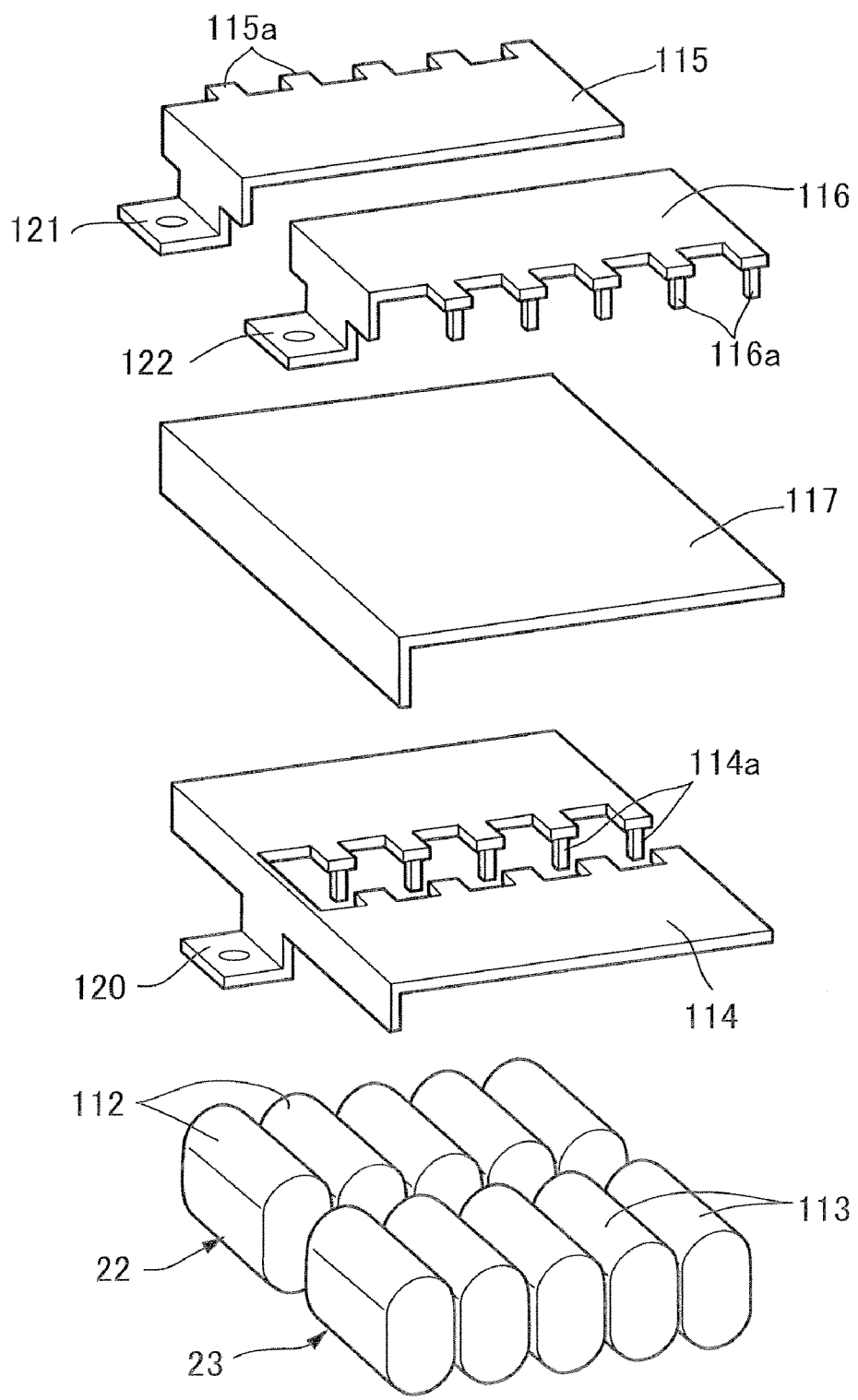

In FIGS. 17 and 18, the first input capacitor 22, which is a partial component of the capacitor unit 38, is configured by connecting multiple first capacitor devices 112 arranged in parallel. The second input capacitor 23, which is the rest of the components of the capacitor unit 38, is configured by connecting multiple second capacitor devices 113 aligned parallel to the arrangement direction of the first capacitor devices 112. The first capacitor devices 112 and the second capacitor devices 113, which are included in the same number, are arranged in such a manner that their negative sides face each other. A common bus bar 114, which has multiple negative side connection pieces 114a to be connected to the negative sides of the first and second capacitor devices 112, 113 by solder, is arranged so as to cover the first and second capacitor devices 112, 113 from the above. A first individual bus bar 115, which has multiple positive side connection pieces 115a to be connected to the positive sides of the first capacitor devices 112 by solder, and a second individual bus bar 116, which has multiple positive side connection pieces 116a to be connected to the positive sides of the second capacitor devices 113 by solider, are arranged on the common bus bar 114 with an insulating paper 117 interposed between the common bus bar 114 and the first individual bus bar 115, as well as between the common bus bar 114 and the second individual bus bar 116. The capacitor unit 38 configured by connecting the first and second capacitor devices 112, 113 with the common bus bar 114 and the first and second bus bars 115, 116 is housed in a case 119 so as to be embedded in a coated layer 118 made of a synthetic resin, and the case 119 is housed in the fourth housing case 111.

Also, the common bus bar 114 is integrally provided with a grounding terminal 120, which is common to the first and second input capacitors 22, 23, and projects from the coated layer 118. The first and second individual bus bars 115, 116 are integrally provided with projecting positive terminals 121, 122 corresponding to the first and second input capacitors 22, 23, respectively, in a manner that the positive terminals 121, 122 interpose the grounding terminal 120 therebetween. Both the positive terminals 121 and 122 also project from the coated layer 118.

A fourth terminal block 123 is fixed on the other end of the second heat sink 73, at such position where the fourth terminal block 123 and the first inductor 24 interpose the capacitor unit 38. The fourth terminal block 123 includes positive side and negative side terminals 124, 125 for fuel cell to be connected to the fuel cell 15, and positive side and negative side terminals 126, 127 for storage battery to be connected to the storage battery 16.

The positive terminal 121 of the capacitor unit 38, and the bus bar 109 connected to the terminal 107 provided on the third terminal block 106 coupling to the first inductor 24 are connected to the fourth terminal block 123 so as to couple to the positive side terminal 124 for fuel cell. The positive terminal 122 of the capacitor unit 38, and a bus bar 128 connected to the terminal 99 provided on the second terminal block 87 so as to couple to the second inductor 25 are connected to the fourth terminal block 123 so as to couple to the positive side terminal 126 for storage battery.

A fifth terminal block 130 to be connected to the U-phase, V-phase, and W-phase power supply lines 35U, 36V, and 35W coupled to the electric motor 17 is fixed to the other end of the first heat sink 40. Bus bars 131, 132, 133, whose respective one ends are connected to the terminal members 68F to 68H of the sixth to eighth switching element modules 27F to 27H which penetrate through the substrate 72 while coupling to the terminals to be connected to the electric motor 17, are extended to the fifth terminal block 130.

Now, on the opposite side of the substrate 72, the DC link capacitor unit 21 is arranged, which is supported on the first heat sink 40 by stays 135. An external bus bar unit 136 is arranged between the first heat sink 40 and the DC link capacitor unit 21.

Figure 19:
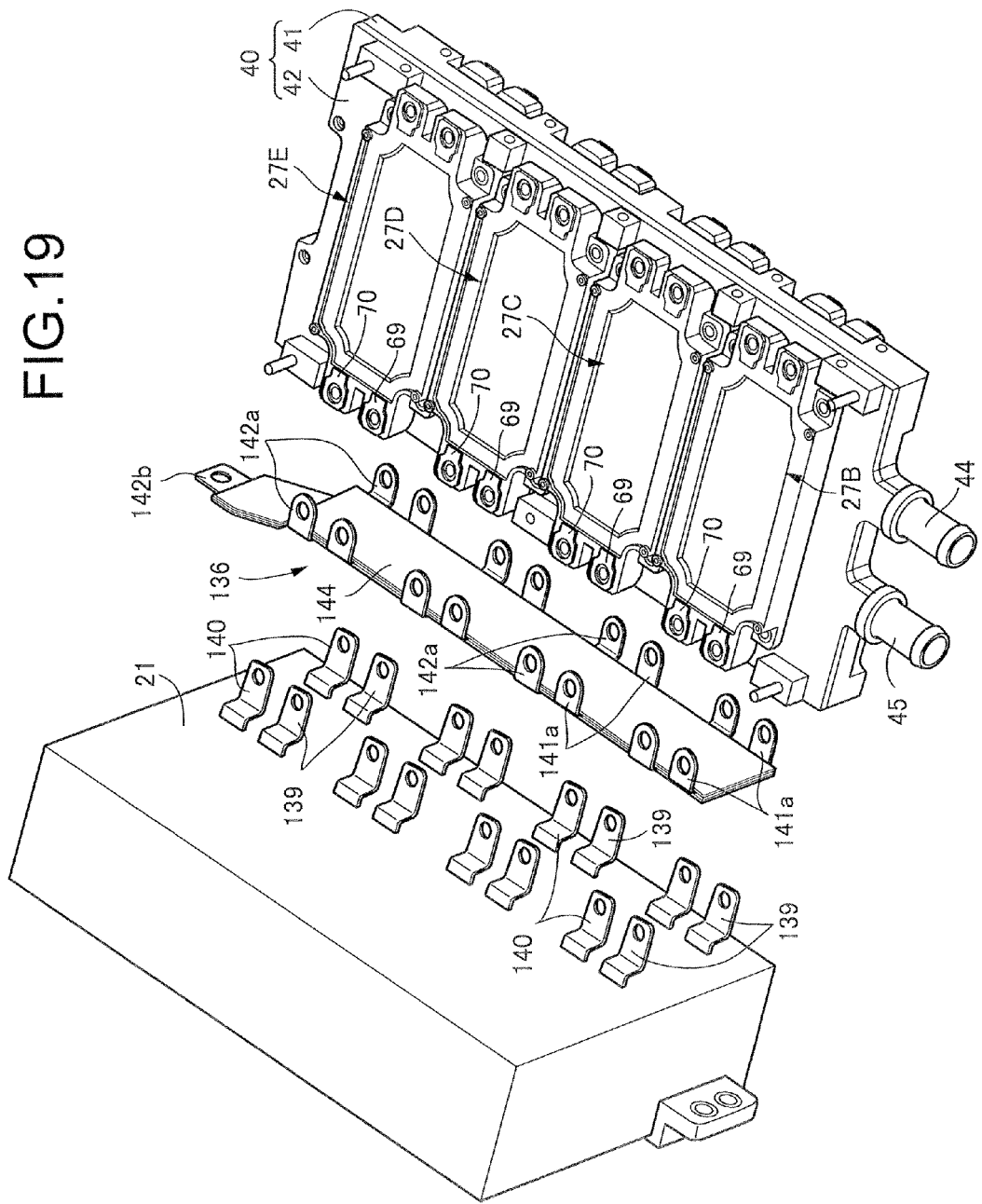

In FIG. 19, from the lateral face of the DC link capacitor unit 21 which faces the first heat sink 40, positive side connection terminals 139 and negative side connection terminals 140 project. The positive and negative side connection terminals 139, 140 are to be connected to the positive side connection terminals 69 and the negative side connection terminals 70 provided on the first to eighth switching element modules 27A to 27H mounted on the upper and lower surface of the first heat sink 40.

Figure 20:
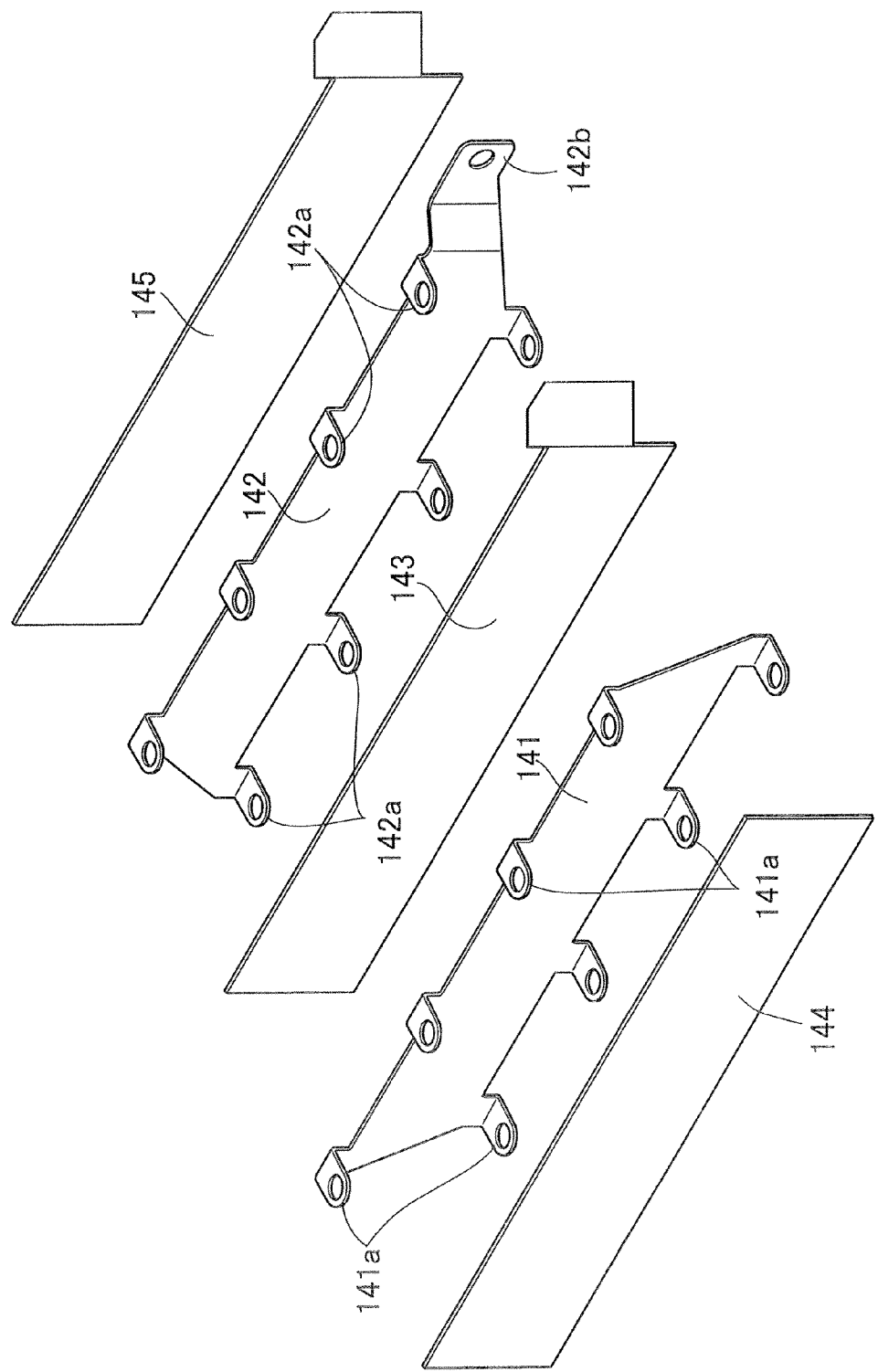

In FIG. 20, the external bus bar unit 136 includes: a positive side external bus bar 141 having multiple positive side connection pieces 141a projecting from its both sides, the positive side connection pieces 141a connected to the positive side connection terminals 69 of the first to eighth switching element modules 27A to 27H and the positive side connection terminals 139 of the DC link capacitor unit 21; and a negative side external bus bar 142 having multiple negative side connection pieces 142a projecting from its both sides, the negative side connection pieces 142a connected to the negative side connection terminals 70 of the first to eighth switching element modules 27A to 27H, and the negative side connection terminals 140 of the DC link capacitor unit 21. The external bus bar unit 136, which is arranged outside the DC link capacitor unit 21, is configured by stacking the positive side and negative side external bus bars 141, 142, a plate-shaped insulating member 143 interposed between the positive side external bus bar 141 and the negative side external bus bar 142, and plate-shaped insulating members 144, 145 which interpose the positive side and negative side external bus bars 141, 142 between themselves and the plate-shaped insulating member 143, respectively.

One end of the negative side external bus bar 142 in the external bus bar unit 136 is integrally provided with a mounting plate portion 142b which projects more than one end of the positive side external bus bar 141. The mounting plate portion 142b is fixed to the first heat sink 40 with a bolt 146, and the external bus bar unit 136 is in direct contact with the first heat sink 40.

Figure 12:
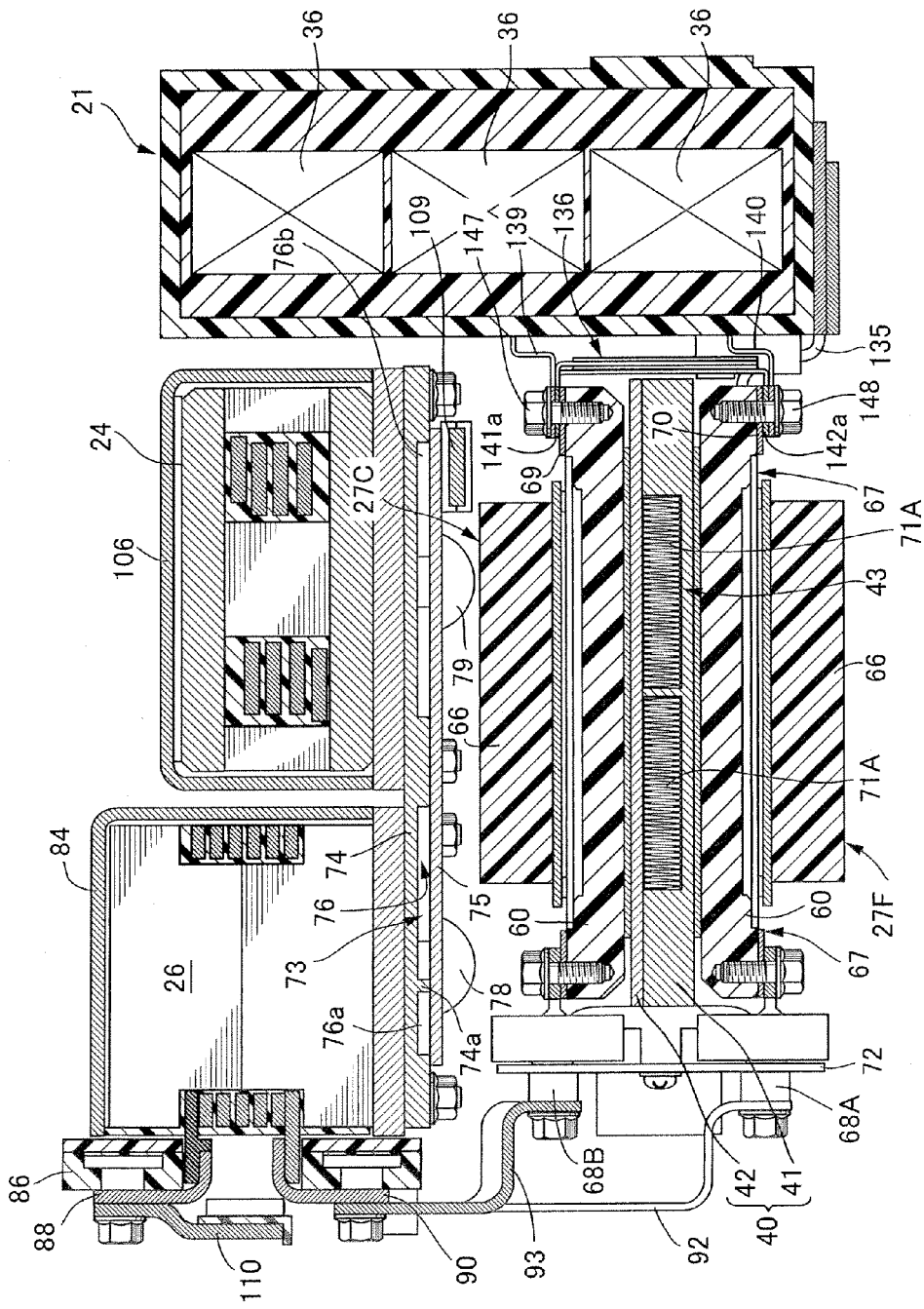

Thus, as shown in FIG. 12, the positive side connection terminals 139 of the DC link capacitor unit 21, positive side connection pieces 141a of the external bus bar unit 136, and the positive side connection terminals 69 of the first to eighth switching element modules 27A to 27H are connected to each other by a bolt 147 with the positive side connection pieces 141a interposed between the positive side connection terminals 139 and the positive side connection terminals 69. Also, the negative side connection terminals 140 of the DC link capacitor unit 21, the negative side connection pieces 142a of the external bus bar unit 136, and the negative side connection terminals 70 of the first to eighth switching element modules 27A to 27H are connected to each other by a bolt 148 with the negative side connection pieces 142a interposed between the negative side connection terminals 140 and the negative side connection terminals 70.

Now, DC power obtained by the first converter 18 or the second converter 19 is converted by the inverter 20 into AC power, which is supplied to the electric motor 17. The power from the first converter 18 or the second converter 19 is once stored in the smoothing capacitor 36 of the DC link capacitor unit 21, and then the stored power is drawn by the inverter 20. Such flow of power can be represented by a flow of current. When the external bus bar unit 136 is not provided, as shown by narrow line arrows in FIG. 21A, a current i1 supplied from the smoothing capacitor 36, and a current i2 supplied from the first converter 18 or the second converter 19 without passing through the smoothing capacitor 36 flow through the internal wiring of the DC link capacitor unit 21 to flow into the inverter 20. If the internal wiring of the DC link capacitor unit 21 is designed to have the load of all currents as such, the internal wiring will generate heat or become larger in size. Thus, the heat generated at the wiring causes an adverse thermal effect on the smoothing capacitor 36.

Figure 21A:
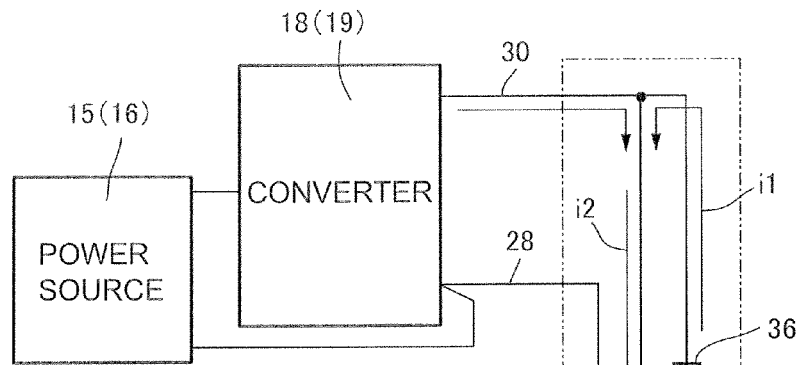
FIG. 21A is a simplified diagram showing current paths between a converter and an inverter in a case without the external bus bar unit.
Figure 21B:
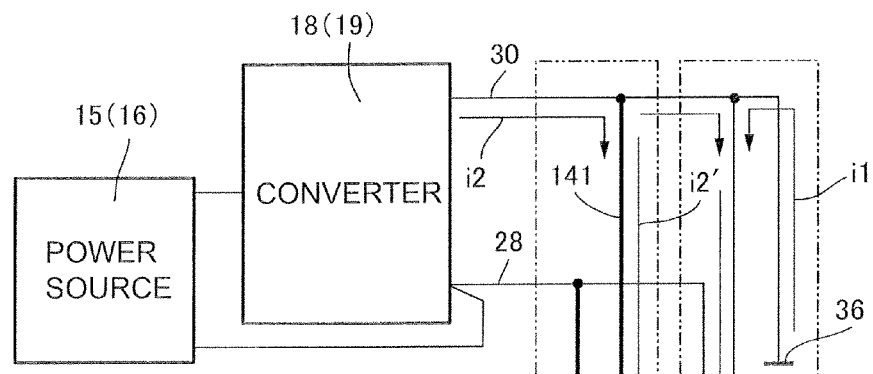
FIG. 21B is a simplified diagram showing current paths between the converter and the inverter in a case with the external bus bar unit, in comparison with FIG. 21A.

On the contrary, if the external bus bar unit 136 is interposed between the first converter 18 and the DC link capacitor unit 21 as well as the second converter 19 and the DC link capacitor unit 21, as shown by narrow line arrows in FIG. 21B, a portion i2' of the current i2 supplied from the first converter 18 or the second converter 19 directly flow into the inverter 20 side through the positive side external bus bar 141 in the external bus bar unit 136. Thus, the current flowing through the internal wiring of the DC link capacitor unit 21 can be suppressed to be low, and the thermal effect on the smoothing capacitor 36 can be suppressed to a lower level.

Figure 22:
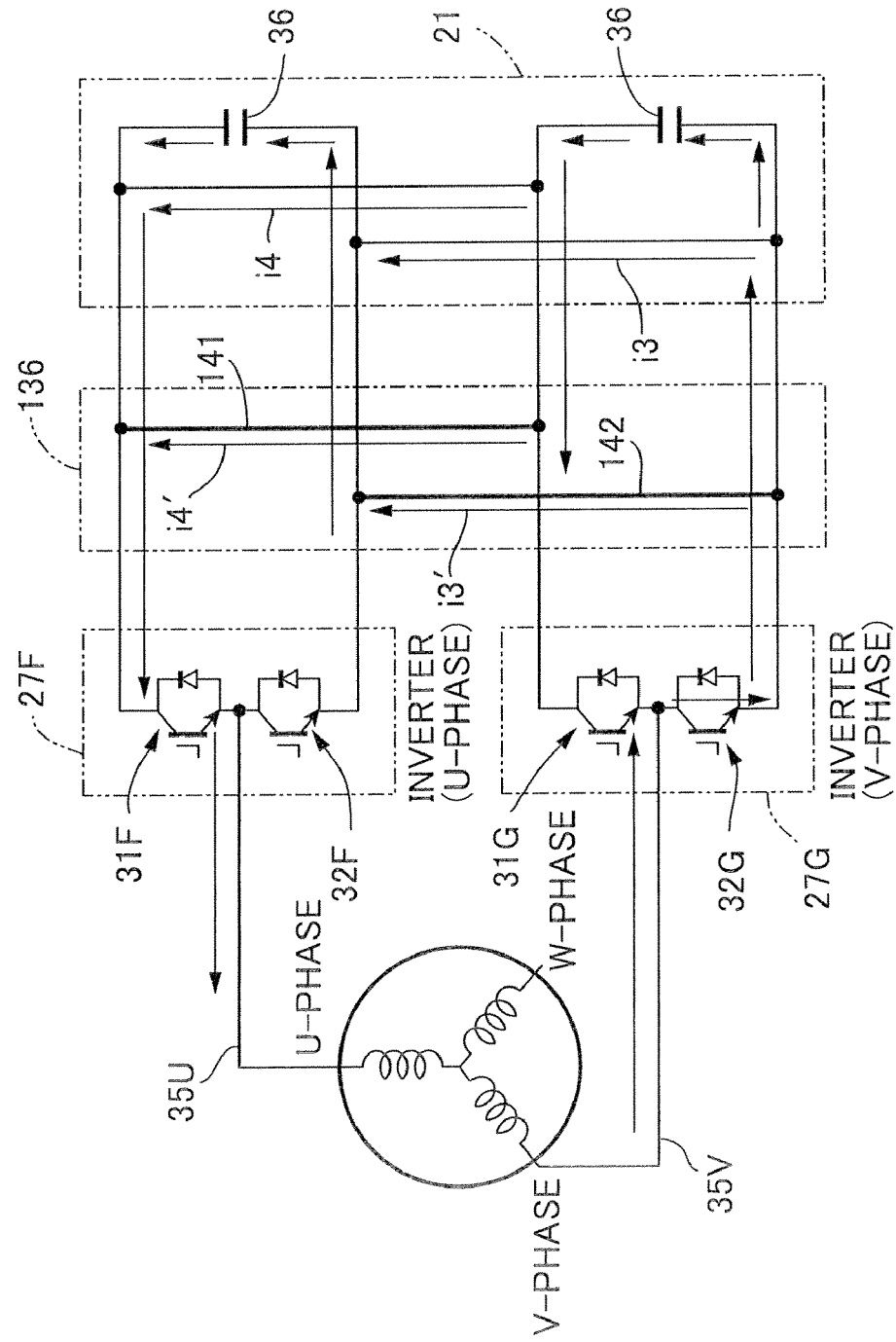
Figure 23:
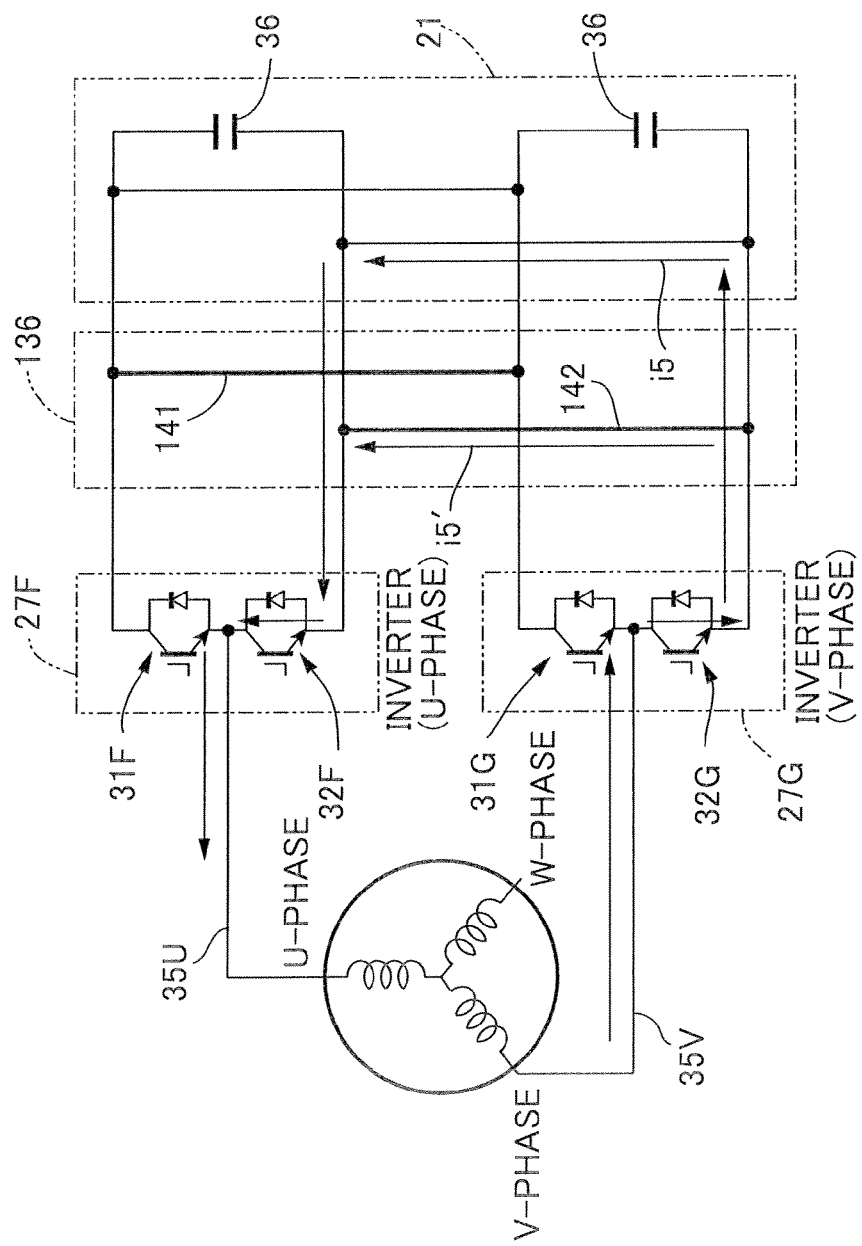
Figure 24:
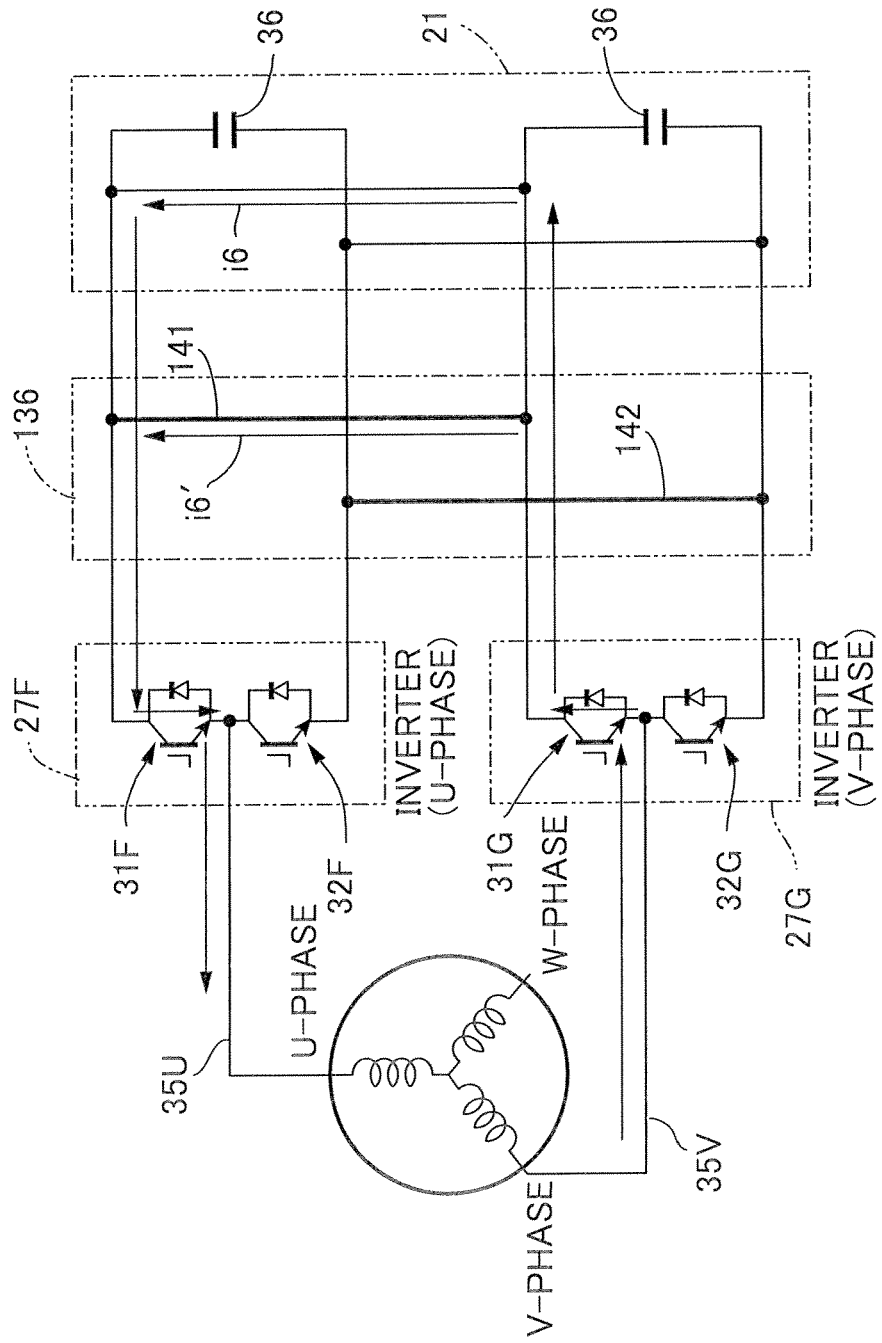

Also, commutation current flows into the DC link capacitor unit 21 by switching on/off of the sixth to eighth positive side switching elements 31F to 31H and the sixth to eighth negative side switching elements 32F to 32H of the sixth to eighth switching element modules 27F to 27H of the inverter 20. Referring to FIGS. 22 to 24, the path of the commutation current flowing inside the DC link capacitor unit 21 and the external bus bar unit 136 when the sixth and seventh positive side switching elements 31F, 31G, and the sixth and seventh negative side switching elements 32F, 32G are switched on/off is described. Here, for the sake of simplicity, a portion corresponding to W-phase of the inverter 20 is omitted.

First, when the sixth positive side switching element 31F and the seventh negative side switching element 32G are switched on, and the sixth negative side switching element 32F and the seventh positive side switching element 31G are switched off, as shown by narrow line arrows in FIG. 22, currents i3', i4' corresponding to currents i3, i4 flowing through the internal wiring of the DC link capacitor unit 21 flow through the positive side and negative side bus bars 141, 142 of the external bus bar unit 136. Thus, the current flowing through the internal wiring of the DC link capacitor unit 21 can be suppressed to be low.

Also when the sixth and seventh negative side switching elements 32F, 32G are switched on, and the sixth and seventh positive side switching elements 31F, 31G are switched off, as shown by narrow line arrows in FIG. 23, a current i5' corresponding to a current i5 flowing through the internal wiring of the DC link capacitor unit 21 flows through the negative side bus bar 142 of the external bus bar unit 136. Thus, the current flowing through the internal wiring of the DC link capacitor unit 21 can be suppressed to be low.

Further, when the sixth and seventh positive side switching elements 31F, 31G are switched on, and the sixth and seventh negative side switching elements 32F, 32G are switched off, as shown by narrow line arrows in FIG. 24, a current i6' corresponding to a current i6 flowing through the internal wiring of the DC link capacitor unit 21 flows through the positive side bus bar 141 of the external bus bar unit 136. Thus, the current flowing through the internal wiring of the DC link capacitor unit 21 can be suppressed to be low.

In other words, common connection of the positive side connection terminals 69 of the first to eighth switching element modules 27A to 27H to each other outside the DC link capacitor unit 21 by the external bus bar unit 136, and common connection of the negative side connection terminals 70 of the first to eighth switching element modules 27A to 27H to each other outside the DC link capacitor unit 21 by the external bus bar unit 136 allow a portion of the current supplied from the first converter 18 or the second converter 19 to the inverter 20 to flow outside the DC link capacitor unit 21, and allow a portion of the commutation current generated by switching on/off the sixth to eighth positive side switching elements 31F to 31H and the sixth to eighth negative side switching elements 32F to 32H in the inverter 20 to flow outside the DC link capacitor unit 21.

Next, an operation of Embodiment 1 is described. The switching element assembly unit 67 is configured by including part of the first converter 18, the second converter 19 and the inverter 20 on the upper and lower surfaces of the water-cooled type first heat sink 40 with the first to eighth switching element modules 27A to 27H mounted on the upper and lower surfaces. Above the switching element assembly unit 67, the first inductor 24 and the three-phase transformer 26 in the first converter 18, and the second inductor 25 and the two-phase transformer 33A in the second converter 19 are arranged with the water-cooled type second heat sink 73 interposed between the switching element assembly unit 67 and the above components. Thus, the power conversion device can be made small in size while efficiently cooling the first to eighth switching element modules 27A to 27H, the first inductor 24, the three-phase transformer 26, the second inductor 25, and the two-phase transformer 33A. In addition, the second heat sink 73 allows the first to eighth switching element modules 27A to 27H to be less effected by a noise due to the first inductor 24, the three-phase transformer 26, the second inductor 25, and the two-phase transformer 33A.

Also, the capacitor unit 38 formed by integrating the first input capacitor 22 included in the first converter 18 and the second input capacitor 23 included in the second converter 19 is arranged above the switching element assembly unit 67 with the second heat sink 73 interposed between the switching element assembly unit 67 and the capacitor unit 38. Thus, compact arrangement of the first and second input capacitors 22, 23 allows the power conversion device to be compact, while heat transfer from the first to eighth switching element modules 27A to 27H to the first and second input capacitors 22, 23 can be suppressed by the second heat sink 73.

Moreover, since the capacitor unit 38 has the single grounding terminal 120 common to the first and second input capacitors 22, 23, not only the capacitor unit 38 can be made more compact, but also its wiring inductance can be reduced.

The first to eighth switching element modules 27A to 27H, the number of which is even, are mounted on the upper and lower surfaces of the first heat sink 40 in a substantially symmetrical arrangement with respect to the first heat sink 40. Thus, cooling performance of the first to eighth switching element modules 27A to 27H can be optimized.

Also, the first to eighth switching element modules 27A to 27H are mounted on the first heat sink 40 with their connection terminals arranged in the same direction. The first to the fifth switching element modules 27A to 27E, which are part of the first and second converters 18, 19 and are mounted on the first heat sink 40, and the three-phase transformer 26 and the two-phase transformer 33A, which are part of the first and second converters 18, 19 and are disposed on the second heat sink 73 while being directly coupled to the first to the fifth switching element modules 27A to 27E, are connected to each other by the bus bars 92, 93, 94, 100, and 101. Thus, the lengths of the bus bars 92 to 94, 100, 101 can be minimized, and also the assembly of the unit can be made easier.

Incidentally, the multiple stud bolts 63 each having threaded shank portions 63a at opposite ends thereof are implanted in the first heat sink 40 in such a manner that the threaded shank portions 63a project from the upper and lower surfaces of the first heat sink 40. The cases 60 and the copper base plates 58 of the first to eighth switching element modules 27A to 27H are secured by fastening the nuts 64 engaged with the threaded shank portions 63a of selected ones of stud bolts 63 out of all the stud bolts 63, and thereby the first to eighth switching element modules 27A to 27H are mounted on the upper and lower surfaces of the first heat sink 40. Accordingly, the first to eighth switching element modules 27A to 27H can be easily mounted on the upper and lower surfaces of the first heat sink 40 with fewer components.

The cooling water pump 80 which supplies cooling water to the first cooling water passage 43 in the first heat sink 40 and the second cooling water passage 76 in the second heat sink 73 is connected in parallel to the first and second cooling water passages 43, 76 to distribute and supply the cooling water from the cooling water pump 80 to the first and second heat sinks 40, 73. Thus, optimal cooling performance can be obtained for cooling the first to eighth switching element modules 27A to 27H, the first inductor 24, the three-phase transformer 26, the second inductor 25, and the two-phase transformer 33A.

The first to eighth positive side switching elements 31A to 31H and the first to eighth negative side switching elements 32A to 32H included in the first to eighth switching element modules 27A to 27H each have multiple chips 47, 48, 49, 50, 51, and 52, which are arranged on the first heat sink 40 by twos side-by-side along the circulation direction 46 of the cooling water in the first cooling water passage 43. As shown in FIG. 8A, the set of the cooling fins 71A is separately arranged for each set of chips of 47, 49, 51 and each set of chips 48, 50, 52 aligned along the circulation direction 46 in the first cooling water passage 43 included in the first heat sink 40. Also, as clearly shown in FIG. 7, the sets of cooling fins 71A for the sets of chips of 47, 49, 51 are arranged to be offset from the sets of cooling fins 71A for the sets of chips 48, 50, 52 in a direction perpendicular to the circulation direction 46.

Thereby, thermal entrance regions as shown in FIG. 8B can be formed at the inlet of each set of the cooling fins 71A separately arranged for corresponding one of sets of chips 47, 49, 51 and sets of chips 48, 50, 52 aligned along the circulation direction 46. Accordingly, a high cooling efficiency across the entire first cooling water passage 43 can be obtained.

The first to eighth positive side switching elements 31A to 31H and the first to eighth negative side switching elements 32A to 32H included in the first to eighth switching element modules 27A to 27H are arranged at positions spaced apart along the circulation direction 46 in the first cooling water passage 43. In the present embodiment, the first to eighth positive side switching elements 31A to 31H are arranged at positions corresponding to the outward passage portion 43a in the first cooling water passage 43, whereas the first to eighth negative side switching elements 32A to 32H are arranged at positions corresponding to the return passage portion 43b in the first cooling water passage 43. Thus, a thermal entrance region is formed for each of the first to eighth positive side switching elements 31A to 31H and the first to eighth negative side switching elements 32A to 32H, and the cooling efficiency can be increased.

Also, the first to eighth switching element modules 27A to 27H are mounted on the first heat sink 40 in such a manner that the first to eighth positive side switching elements 31A to 31H and the first to eighth negative side switching elements 32A to 32H included in the first to eighth switching element modules 27A to 27H are sealed inside the coated layers 65 made of a synthetic resin. Thus, the first to eighth switching element modules 27A to 27H can be effectively cooled by the heat dissipation from the coated layers 65 and the cooling from the first heat sink 40.

Furthermore, the plurality of cooling fins 71A are integrally molded and thus each of the cooling fins 71A on the downstream side can be securely placed at a position corresponding to the midpoint between adjacent ones of the cooling fins 71A on the upstream side. Accordingly, possibility of reduction of the cooling effect due to positional displacement of the downstream cooling fins can be eliminated, and the cooling effect exactly as designed can be achieved.

Now, the DC link capacitor unit 21 having the smoothing capacitor 36 is provided between the first converter 18 and the inverter 20 as well as between the second converter 19 and the inverter 20, and the positive side connection terminals 69 and the negative side connection terminals 70 of the first to eighth switching element modules 27A to 27H included in the first converter 18, the second converter 19, and the inverter 20 are connected to the positive side connection terminals 139 and the negative side connection terminals 140 provided on the DC link capacitor unit 21. The positive side connection terminals 69, 139 are connected in common to the positive side external bus bar 141, and the negative side connection terminals 70, 140 are connected in common to the negative side external bus bar 142. Since the external bus bar unit 136 is integrally formed by stacking the positive side and negative side external bus bars 141, 142 arranged outside the DC link capacitor unit 21 with the insulating member 143 interposed therebetween, the current flowing through the internal wiring of the DC link capacitor unit 21 is decreased. Thus, the internal wiring of the DC link capacitor unit 21 can be prevented from generating heat which causes an adverse thermal effect on the smoothing capacitor 36.

Furthermore, since the external bus bar unit 136 is in direct contact with the first heat sink 40, the heat generated in the external bus bar unit 136 is directly transferred to the first heat sink 40 side. Thus, a temperature rise near the DC link capacitor unit 21 can be suppressed.

Since the second inductor 25 and the two-phase transformer 33A constituting part of the second converter 19 are housed in the common second housing case 85A mounted to the mounting surface 74b of the second heat sink 73, the package of the second inductor 25 and the two-phase transformer 33A can be made compact.

Also since the second inductor 25 and the two-phase transformer 33A housed in the second housing 85A are disposed in such a manner that the axes of their winding portions 25a, 82a, 83a are perpendicular to the flat mounting surface 74b of the second heat sink 73, the entire winding portions 25a, 82a, 83a can be placed closer to the second heat sink 73 than in a case where the axes of the winding portions are approximately parallel to the second heat sink 73. Thus, heat in the entire winding portions 25a, 82a, 83a can be uniformly dissipated to the second heat sink 73 side and thereby, abnormal heat generation is prevented from occurring in part of the winding portions 25a, 82a, 83a. Accordingly, a temperature rise of the winding portions 25a, 82a, 83a is prevented, consequently preventing a temperature rise of the cores 151 and 152.

Also, the second housing 85A includes: the supporting plate portion 154A in contact with the second inductor 25 and the two-phase transformer 33A; and the cover portion 155 which is disposed contiguously to the supporting plate portion 154A and covers the second inductor 25 and the two-phase transformer 33A. The supporting plate portion 154A having a greater plate thickness than that of the cover portion 155 is mounted on the mounting surface 74b while being in contact therewith. This allows the supporting plate portion 154A with increased heat capacity and improved mechanical strength to be provided with the function to cool the second inductor 25 and two-phase transformer 33A as well as the function to mount the same.

Embodiment 2 of the present invention is described referring to FIGS. 25 to 29. The components of Embodiment 2 corresponding to those of Embodiment 1 are shown in the drawings with the same reference numerals as used in Embodiment 1, and their detailed descriptions are omitted.

Figure 25:
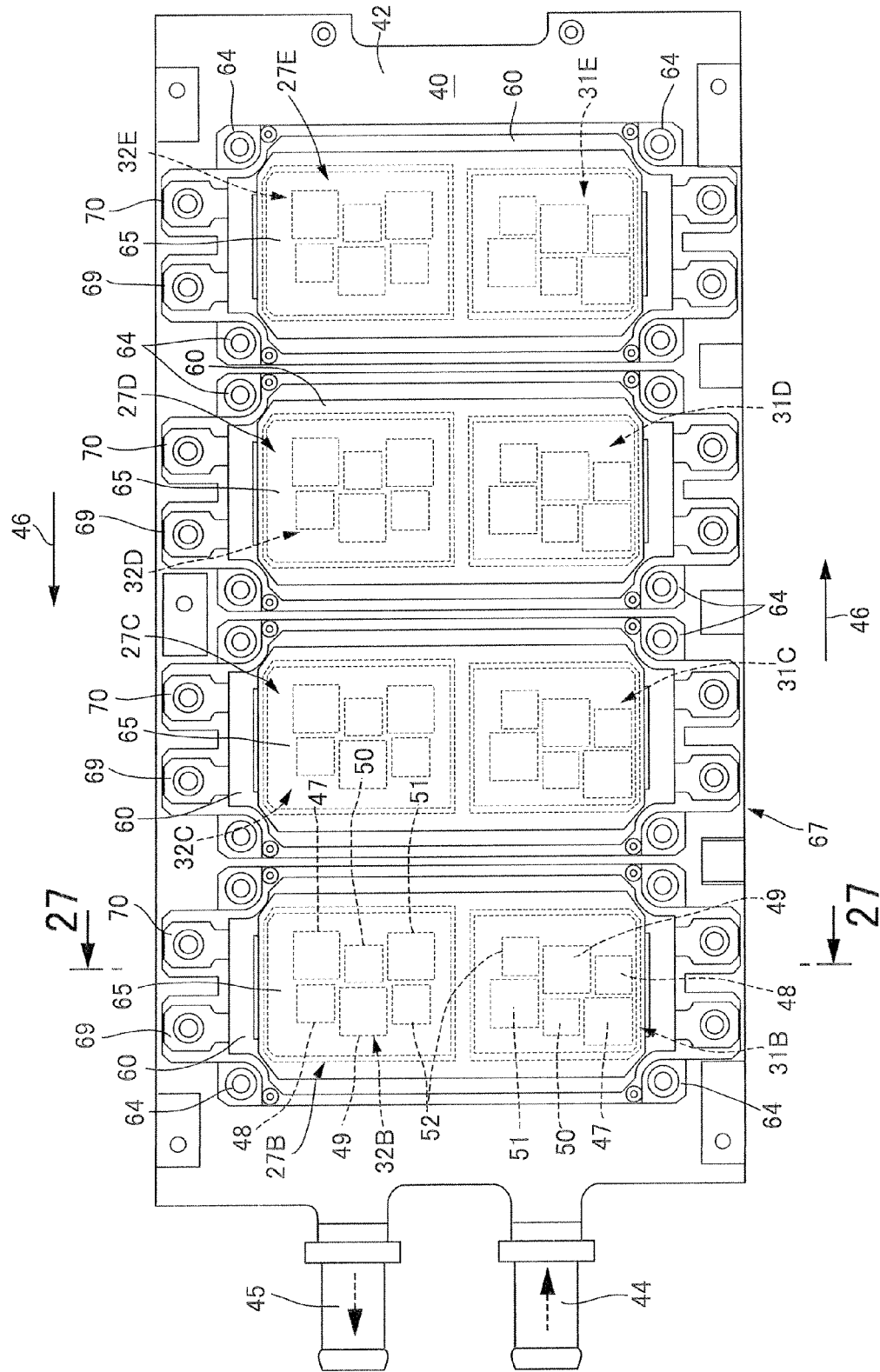
Figure 26:
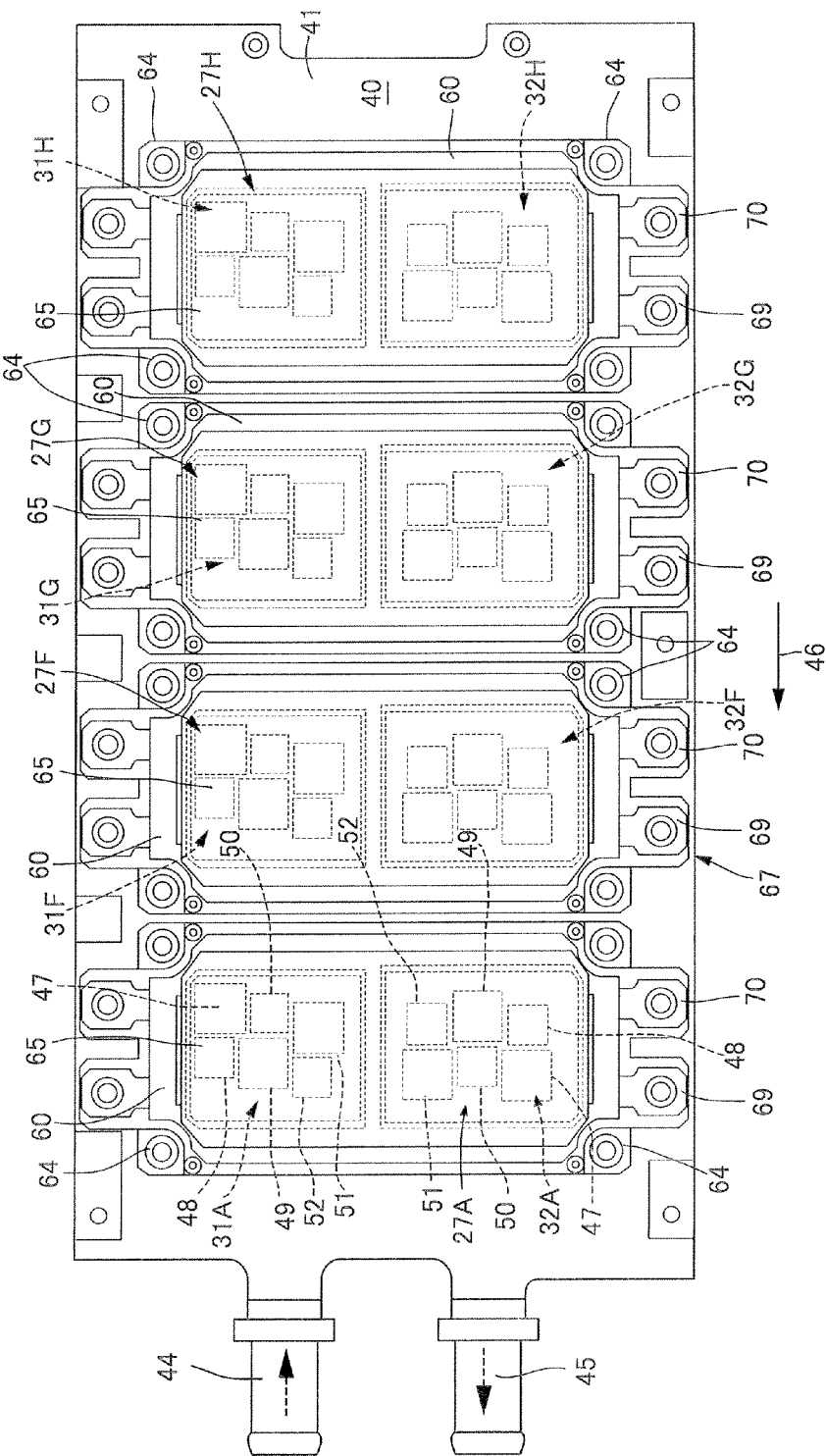

As shown in FIGS. 25 and 26, the six chips 47, 48, 49, 50, 51, 52 included in each of the first to eighth positive side switching elements 31A to 31H and the first to eighth negative side switching elements 32A to 32H are arranged by twos side-by-side along the circulation direction 46 of the cooling water in the first cooling water passage 43, i.e., the chips 47, 48, the chips 49, 50, and the chips 51, 52 are arranged in such manner that each pair is arranged side-by-side along the circulation direction 46.

The first cooling water passage 43 included in the first heat sink 40 has multiple cooling fins 71B which are integrally molded of a light metal such as aluminum alloy, having a continuous U or V shape waveform cross section in a direction perpendicular to the circulation direction 46. The cooling fins 71B are disposed to extend along the circulation direction 46 while dividing the inside of the first cooling water passage 43 into multiple portions in the width direction.

As shown in FIG. 25, in each of the second to fifth positive side switching elements 31B to 31E and the second to fifth negative side switching elements 32B to 32E of the second to fifth switching element modules 27B to 27E on the upper surface side of the first heat sink 40, the chips 47, 50, 51 are placed upstream of the chips 48, 49, 52 in the circulation direction 46; however, the relative positions of the chips 47 to 52 along the circulation direction 46 are different between the second to fifth positive side switching elements 31B to 31E (i.e., the portion corresponding to the outward passage portion 43a in the cooling water passage 43), and the second to fifth negative side switching elements 32B to 32E (i.e., the portion corresponding to the return passage portion 43b in the cooling water passage 43).

On the other hand, as shown in FIG. 26, in each of the first, the sixth to eighth positive side switching elements 31A, 31F to 31H, and the first, the sixth to eighth negative side switching elements 32A, 32F to 32H of the first, the sixth to eighth switching element modules 27A, 27F to 27H on the lower surface side of the first heat sink 40, the chips 48, 49, 52 are placed upstream of the chips 47, 50, 51 in the circulation direction 46; however, the relative positions of the chips 47 to 52 along the circulation direction 46 are different between the first, the sixth to eighth positive side switching elements 31A, 31F to 31H (i.e., the portion corresponding to the outward passage portion 43a in the cooling water passage 43), and the first, the sixth to eighth negative side switching elements 32A, 32F to 32H (i.e., the portion corresponding to the return passage portion 43b in the cooling water passage 43).

In short, on the upper surface side of the first heat sink 40, the portion corresponding to the outward passage portion 43a of the cooling water passage 43 and the portion corresponding to the return passage portion 43b of the cooling water passage 43 are different in terms of the positions of the chips 47 to 52 along the circulation direction 46. On the lower surface side of the heat sink 40, the portion corresponding to the outward passage portion 43a of the cooling water passage 43 and the portion corresponding to the return passage portion 43b of the cooling water passage 43 are different in terms of the positions of the chips 47 to 52 along the circulation direction 46. Moreover, the positions of the chips 47 to 52 along the circulation direction 46 are different between the upper surface side of the first heat sink 40 and the lower surface side of the first heat sink 40.

Figure 27:
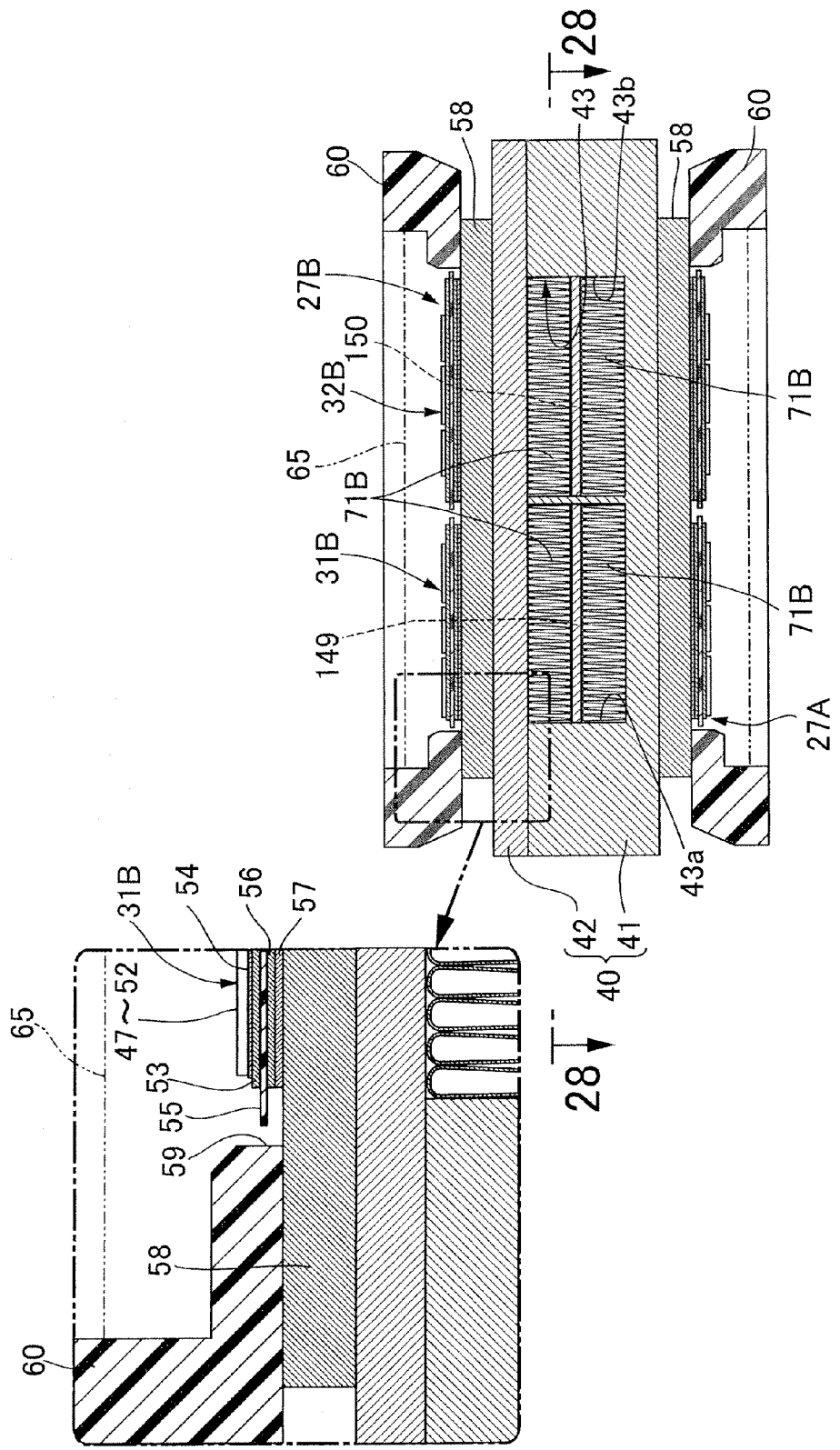
Figure 32:
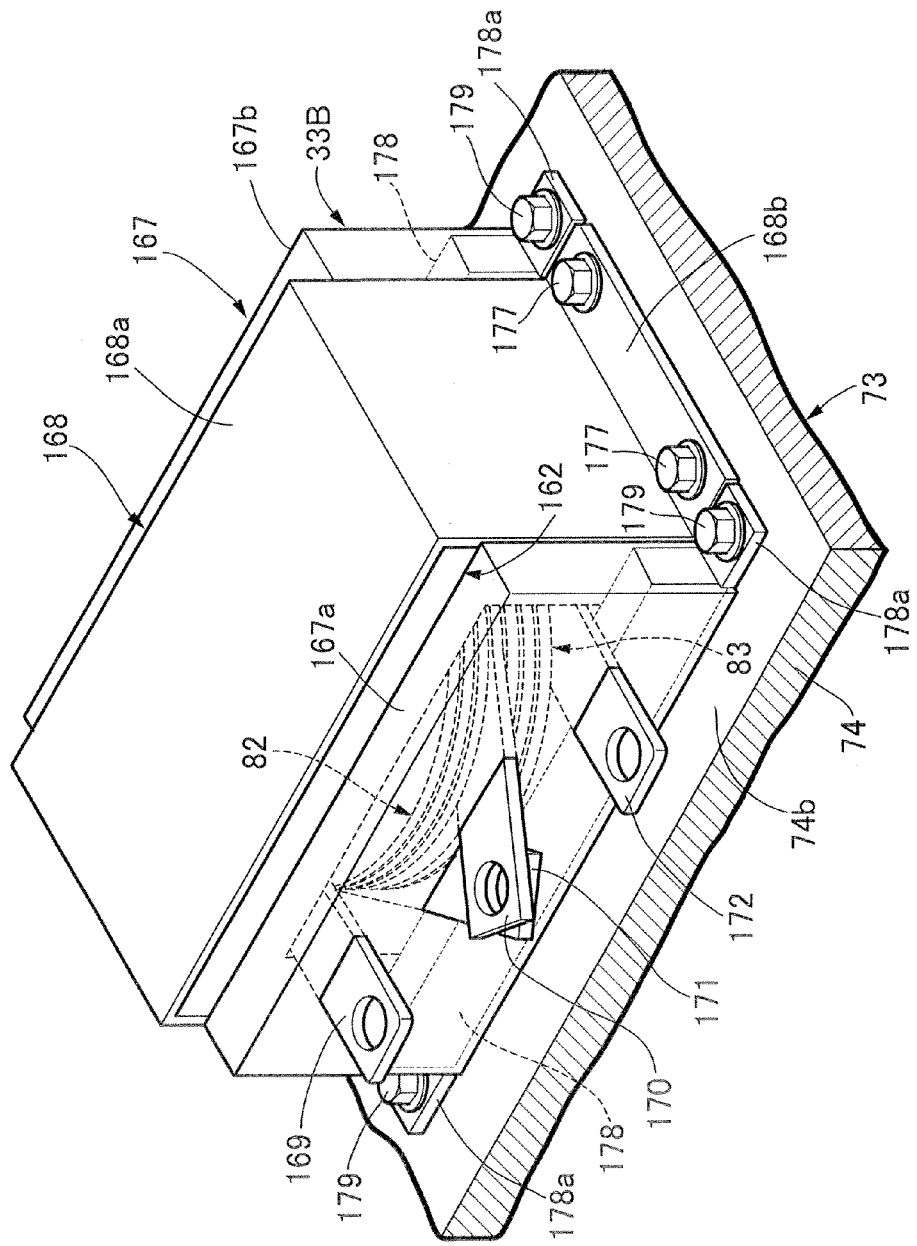
Figure 33:
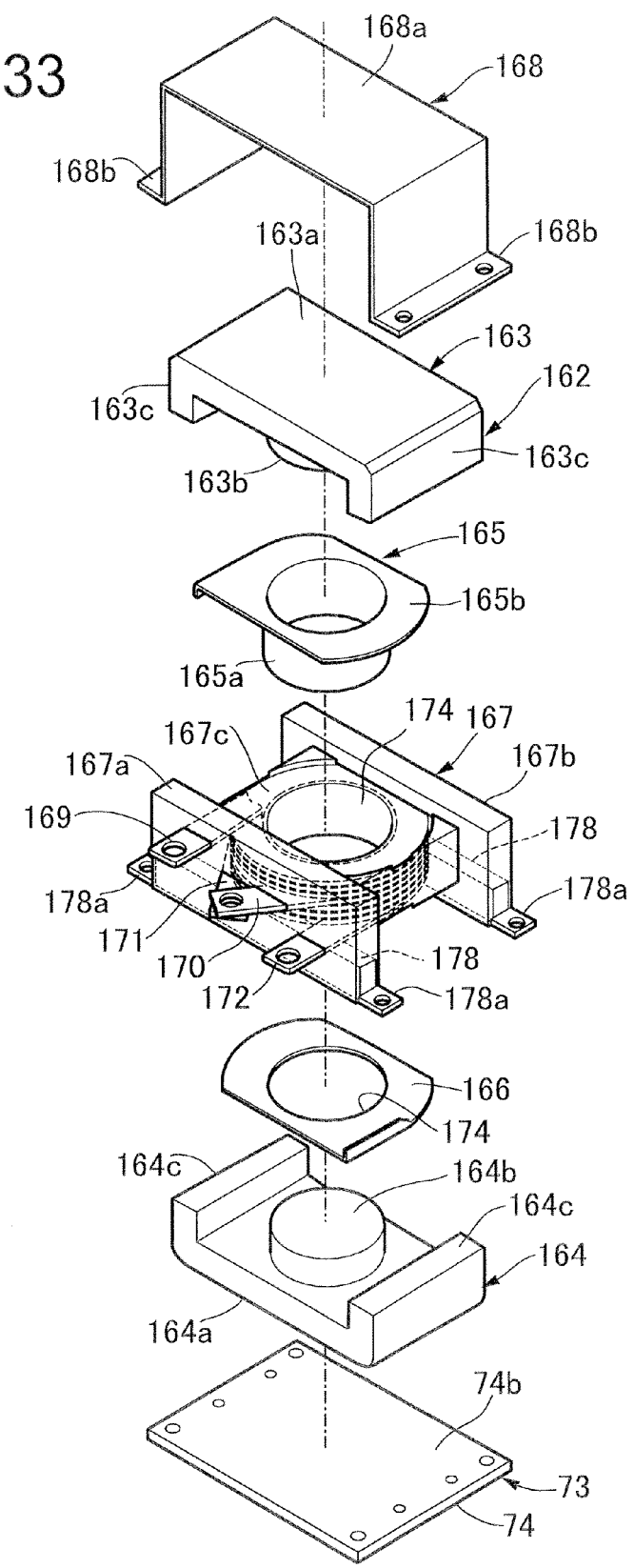

Thus, as shown in FIG. 27, partition walls 149, 150 which respectively divide the outward passage portion 43a and the return passage portion 43b of the cooling water passage 43 into upper and lower portions are provided to the first heat sink 40. Above the partition walls 149, 150 in the cooling water passage 43, as shown in FIGS. 28 and 29A, cooling fins 71B having individually adjusted lengths for respective chips 47 to 52 in the second to fifth switching element modules 27B to 27E on the upper surface side of the first heat sink 40 are separated into groups for the respective chips 47, 50, 51; 48, 49, 52 arranged side by side in the circulation direction 46, and the groups of the cooling fins 71B are offset from each other in the direction perpendicular to the circulation direction 46.

Also, below the partition walls 149, 150 in the cooling water passage 43, as shown in FIG. 29A, the cooling fins 71B having individually adjusted lengths for respective chips 47 to 52 in the first, the sixth to eighth switching element modules 27A, 27F to 27H on the lower surface side of the first heat sink 40 are separated into groups for the respective chips 47, 50, 51; 48, 49, 52 arranged side by side in the circulation direction 46, and the groups of cooling fins 71B are offset from each other in the direction perpendicular to the circulation direction 46.

Also in Embodiment 2, it is possible to obtain a high cooling efficiency across the entire first cooling water passage 43 by forming thermal entrance regions as shown in FIG. 29B.

As another embodiment of the present invention, multiple cooling fins having different pitches may be integrally formed.

Embodiment 3 of the present invention is described with reference to FIG. 30. The components of Embodiment 3 corresponding to those of Embodiments 1 and 2 are shown in the drawings with the same reference numerals as used in Embodiments 1 and 2, and their detailed descriptions are omitted.

The second inductor 25 and the two-phase transformer 33A are housed in a common second housing case 85B made of metal, which is mounted on the flat mounting surface 74b of the second heat sink 73.

The second housing case 85B includes a supporting plate portion 154B in contact with the cores 151, 152 of the second inductor 25 and the two-phase transformer 33A; and the cover portion 155 which is disposed contiguously to the supporting plate portion 154B and covers the second inductor 25 and the two-phase transformer 33A. The supporting plate portion 154B is formed to have a greater plate thickness than that of the cover portion 155, and multiple stud bolts 158 implanted in the supporting plate portion 154B penetrate through the second heat sink 73. By engaging nuts 159 with respective portions of the stud bolts 158 projecting from the second heat sink 73 and fastening the nuts 159, the supporting plate portion 154B in contact with the cores 151, 152 of the second inductor 25 and the two-phase transformer 33A is mounted on the mounting surface 74b of the second heat sink 73 while being in contact with the mounting surface 74b.

In Embodiment 3, similar effects to those of Embodiments 1 and 2 can be achieved.

Embodiment 4 of the present invention is described with reference to FIGS. 31 to 34. At first, in FIGS. 31 to 33, a two-phase transformer 33B being a magnetic part is mounted on the second heat sink 73 to cool the heat generated by the transformer 33B.

The two-phase transformer 33B includes a core 162 which is formed by connecting a first and a second core halves 163, 164; a pair of coils 82, 83 having respective winding portions 82a, 83a which is wound around the core 162; a first and a second bobbins 165, 166 disposed between the winding portions 82a, 83a of the both coils 82, 83 and the core 162; and a resin covering portion 167 which buries therein the winding portions 82a, 83a of the both coils 82, 83 together. The two-phase transformer 33B is mounted on the heat sink body 74 of the second heat sink 73 by a cover member 168 which covers the core 162.

The both coils 82, 83 are formed by vertically arranging the winding portions 82a, 83a of the coils 82, 83 in a coaxial manner. A first and a second terminals 169, 170 connected to opposite ends of one winding portion 82a, and a third and a fourth terminals 171, 172 connected to opposite ends of the other winding portion 83a project to a same side of the both winding portions 82a, 83a with the second and the third terminals 170, 171 stacked one on the other.

Figure 34:
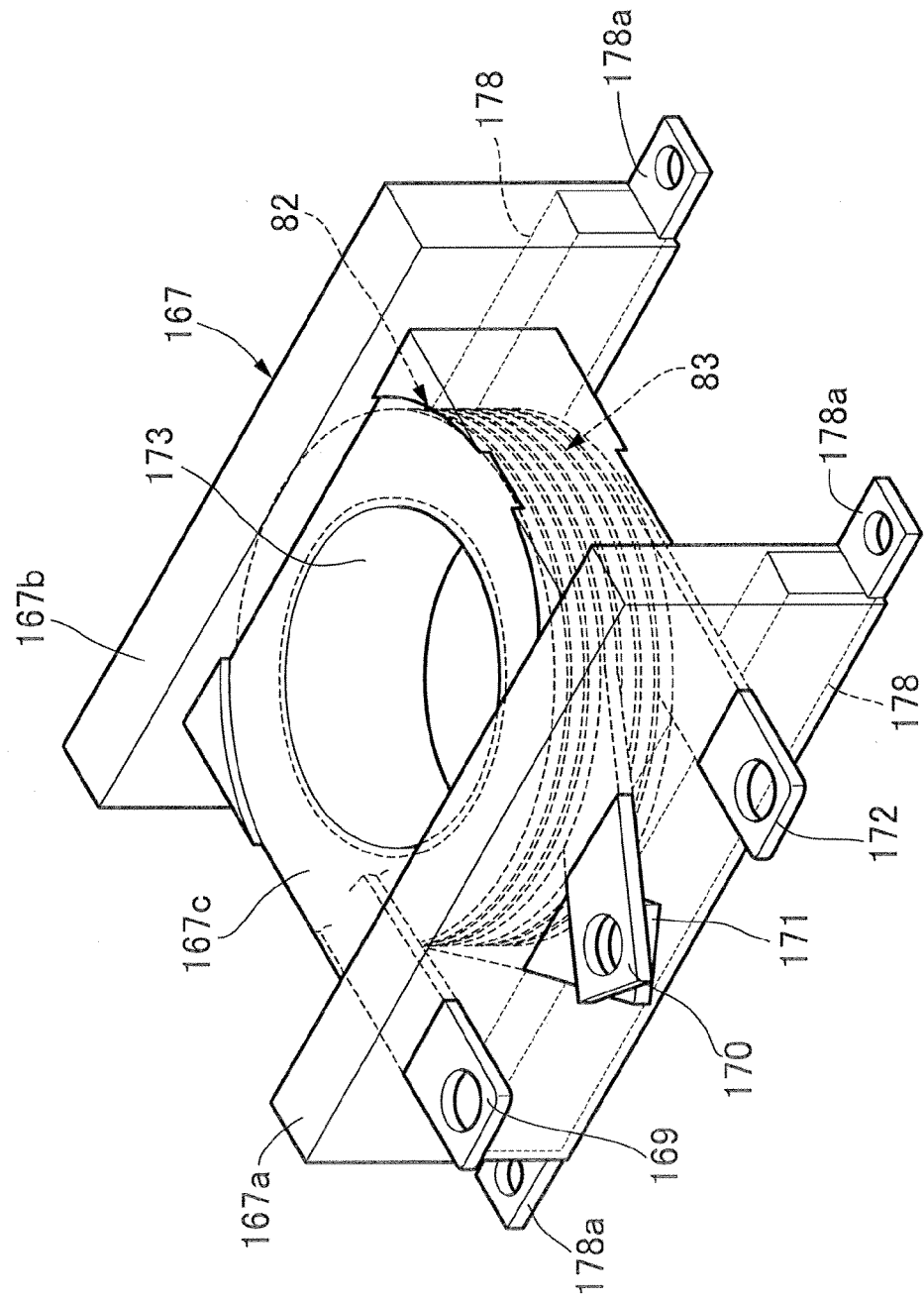

Referring also to FIG. 34, the resin covering portion 167 includes a pair of wall portions 167a, 167b vertically extending in parallel on opposite sides of the both coils 82, 83, and a bridge portion 167c which connects the both wall portions 167a and 167b. The resin covering portion 167 is formed so as to bury the both winding portions 82a, 83a. The first to fourth terminals 169 to 172 projects from one wall portion 167a laterally outward. In the bridge portion 167c, an insertion hole 173 coaxial with the axes of the both winding portions 82a, 83a is formed.

The first bobbin 165 is formed to integrally include a cylindrical portion 165a inserted in the insertion hole 173, and a flange portion 165b connected to one end of the cylindrical portion 165a while being in contact with the upper end of the bridge portion 167c in the resin covering portion 167. The second bobbin 166 is formed in a planar shape having a circular opening 174 corresponding to the insertion hole 173 in its central portion, and is in contact with the lower end of the bridge portion 167c in the resin covering portion 167 while the periphery of the opening 174 in the second bobbin 166 is in contact with the other end of the cylindrical portion 165a of the first bobbin 165. Moreover, the upper end of the bridge portion 167c and the flange portion 165b of the first bobbin 165 are formed to secure positioning of one to the other. The lower end of the bridge portion 167c and the second bobbin 166 are also formed to secure positioning of one to the other.

The first core half 163 of the first and the second core halves 163, 164 which together form the core 162 integrally include: a first flat plate portion 163a which is in contact with the flange portion 165b of the first bobbin 165 at an area between the both wall portions 167a, 167b of the resin covering portion 167; a first projecting portion 163b which projects perpendicularly from the first flat plate portion 163a and is inserted in the cylindrical portion 165a of the first bobbin 165; and a pair of first engagement projecting portions 163c, 163c which are perpendicularly connected to the opposite ends of the first flat plate portion 163a while being engaged with the both sides of the upper end of the bridge portion 167c in the resin covering portion 167. The second core half 164 integrally include: a second flat plate portion 164a which is in contact with the second bobbin 166 at an area between the both wall portions 167a, 167b of the resin covering portion 167; a second projecting portion 164b which projects perpendicularly from the second flat plate portion 164a and is inserted in the cylindrical portion 165a of the first bobbin 165 through the opening 174 of the second bobbin 166; and a pair of second engagement projecting portions 164c, 164c which are perpendicularly connected to the opposite ends of the second flat plate portion 164a while being engaged with the both sides of the lower end of the bridge portion 167c in the resin covering portion 167. Thus, the first projecting portion 163b of the first core half 164 and the second projecting portion 164b of the second core half 164 are in contact with each other within the cylindrical portion 165a of the first bobbin 165.

The cover member 168 is formed to integrally include: a main cover portion 168a which is formed into a substantially U-shape and is open toward the second heat sink 73 side; and a pair of mounting flange portions 168b, 168b which are perpendicularly connected to the open ends of the main cover portion 168a and project laterally outward. Thus, the first and the second core halves 163, 164, which are mounted on the resin covering portion 167 via the first and the second bobbins 165, 166, are covered by the main cover portion 168a of the cover member 168 at an area between the both wall portions 167a, 167b of the resin covering portion 167.

On the other hand, the heat sink body 74 of the second heat sink 73 has the flat mounting surface 74b. Each of the two mounting flanges 168b of the cover member 168 which covers the first and the second core halves 163, 164 mounted on the resin covering portion 167 via the first and the second bobbins 165, 166 is fastened to the mounting surface 74b by a pair of bolts 177. Thereby, the two-phase transformer 33B for which the axes of the winding portions 82a, 83a included in the both coils 82, 83 are made perpendicular to the mounting surface 74b, is mounted on the second heat sink 73 with the resin covering portion 167 and the core 162 being in contact with the mounting surface 74b.

Also, at least part of heat dissipation plates 178 made of metal is buried in the wall portions 167a, 167b of the resin covering portion 167. In this embodiment, most part of heat dissipation plate 178 is buried in lower portion of the wall portions 167a, 167b while being arranged between the winding portions 82a, 83a of the both coils 82, 83 and the second heat sink 73. These heat dissipation plates 178 are in direct contact with the mounting surface 74b of the second heat sink 73 while being buried in the wall portions 167a, 167b of the resin covering portion 167.

Furthermore, each heat dissipation plate 178 is integrally provided with a pair of mounting plate portions 178a projecting from wall portions of the resin covering portion 167. The mounting plate portions 178a are attached to the mounting surface 74b by respective bolts 179 while being in contact with the mounting surface 74b of the second heat sink 73.

In the following, an operation of Embodiment 4 is described. The two-phase transformer 33B, which includes: the core 162 formed by connecting the first and the second core halves 163, 164; the pair of coils 82, 83 having the respective winding portions 82a, 83a which is wound around the core 162; the first and the second bobbins 165, 166 disposed between the winding portions 82a, 83a of the both coils 82, 83 and the core 162; and the resin covering portion 167 which buries therein the winding portions 82a, 83a of the both coils 82, 83 together, is mounted on the second heat sink 73, on which the flat mounting surface 74b perpendicular to the axes of the winding portions 82a, 83a is formed, in a manner that the resin covering portion 167 and the core 162 comes in to contact with the mounting surface 74b. Thus, the entire coils 82, 83 can be placed closer to the second heat sink 73 than in a case where the axes of the winding portions 82a, 83a of the coils 82, 83 are approximately parallel to the second heat sink 73.

Furthermore, since at least part of the heat dissipation plates 178 made of metal is buried in the resin covering portion 167, heat generated by the coils 82, 83 can be easily transferred to the second heat sink 73 via the heat dissipation plates 178. Thus, heat of the entire coils 82, 83 can be uniformly dissipated from the heat dissipation plates 178. This prevents abnormal heat generation from occurring at a portion of the coils 82, 83, thereby suppressing a temperature rise of the coils 82, 83. Furthermore, since the core 162 is also in contact with the second heat sink 73, heat transferred from the coils 82, 83 to the core 162 can be efficiently transferred to the second heat sink 73, thereby suppressing a temperature rise of the core 162.

Also, since the heat dissipation plates 178 are buried in the resin covering portion 167 while being in direct contact with the mounting surface 74b of the second heat sink 73, heat dissipation to the second heat sink 73 can be greatly promoted.

In addition, the heat dissipation plates 178 are integrally provided with the mounting plate portions 178a to be mounted on the mounting surface 74b while being in contact with the mounting surface 74b of the second heat sink 73 in such a manner that the mounting plate portions 178a project from the wall portions 167a, 167b of the resin covering portion 167. Thus, the heat dissipation plates 178 can be provided with heat transfer function and mounting function to mount the cover portion 167, i.e., a magnetic part on the second heat sink 73.

Figure 35:
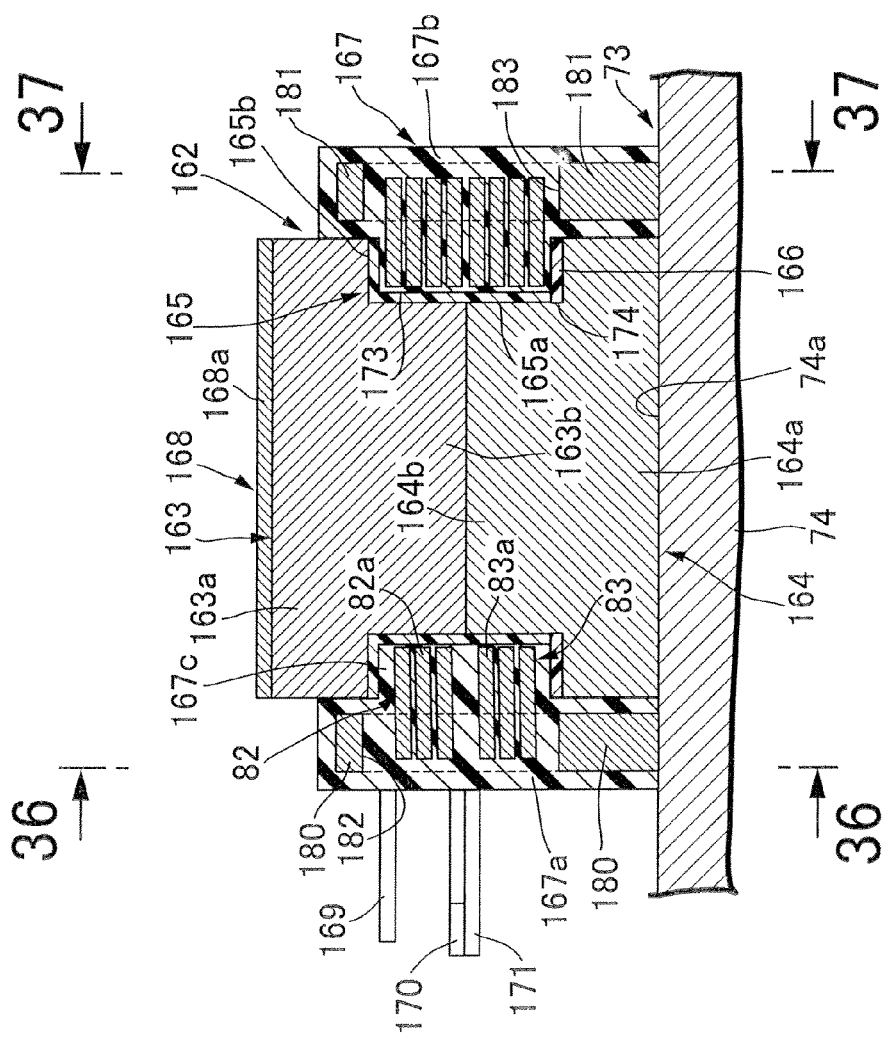
FIGS. 35 to 37 show Embodiment 5 of the present invention.
Figure 36:
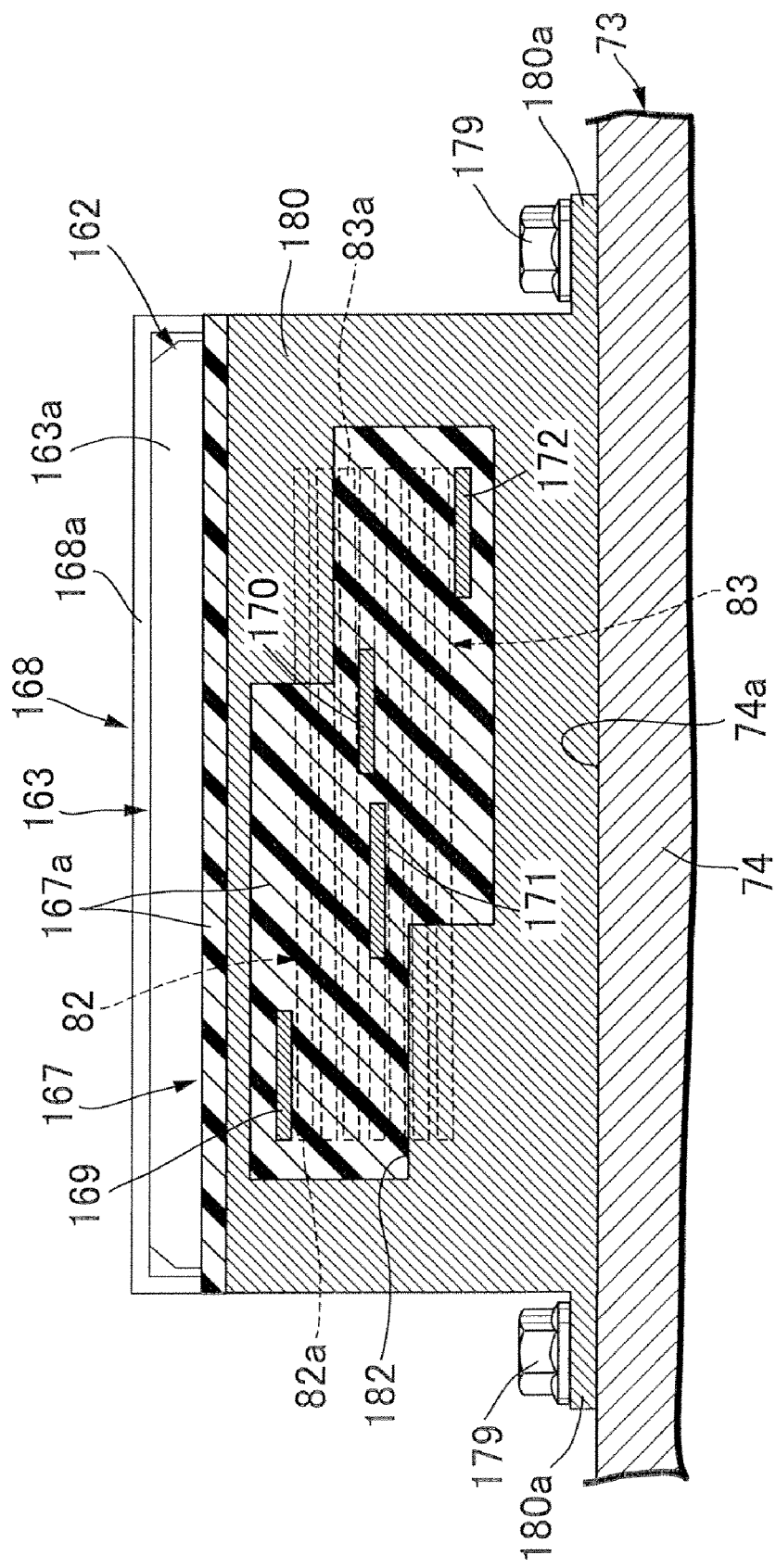
Figure 37:
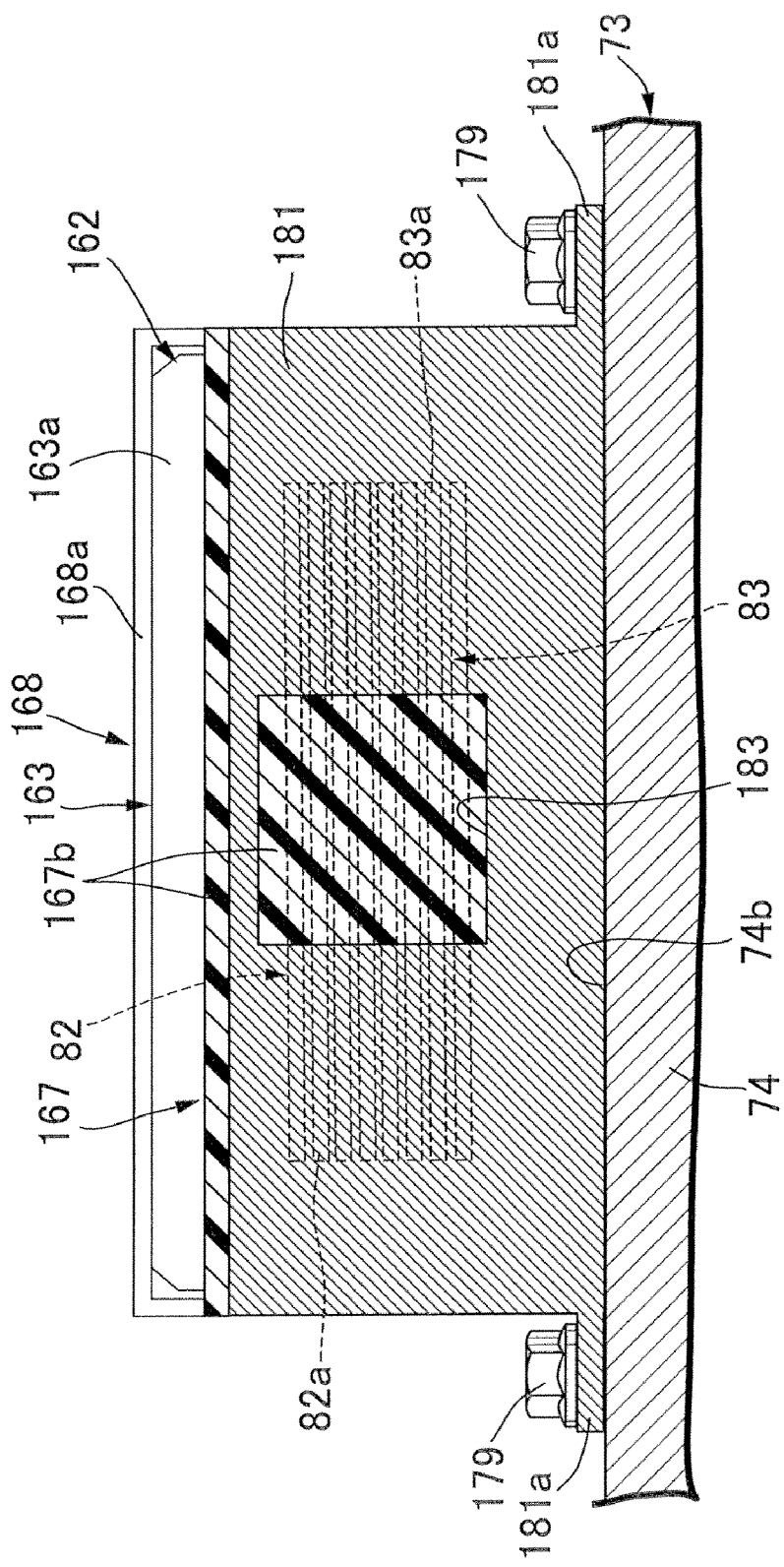

Embodiment 5 of the present invention is described with reference to FIGS. 35 to 37. The components of Embodiment 5 corresponding to those of Embodiment 4 are shown in the drawings with the same reference numerals as used in Embodiment 4, and their detailed description is omitted.

At least part of a pair of heat dissipation plates 180, 181 made of metal, which sandwiches the winding portions 82a, 83a of the both coils 82, 83 from both sides of the coils, is buried in the wall portions 167a, 167b in the resin covering portion 167. Mounting plate portions 180a, 180a; 181a, 181a which are integrally provided to the heat dissipation plates 180, 181 and project from the wall portions 167a, 167b are mounted on the mounting surface 74b of the second heat sink 73 by the bolts 179 while being in contact with the mounting surface 74b.

Both the heat dissipation plates 180, 181 are formed to sandwich the winding portions 82a, 83a at least in the axis direction of the winding portions 82a, 83a from their both sides. Here, one heat dissipation plate 180 has an opening 182, in which part of the winding portions 82a, 83a of the both coils 82, 83 is arranged, and through which the first to fourth terminals 169 to 172 connected to opposite ends of the winding portions 82a, 83a project laterally outward. The heat dissipation plate 180 is formed to surround one side of the both winding portions 82a, 83a. The other heat dissipation plate 181 has an opening 183 in which part of the winding portions 82a, 83a of the both coils 82, 83 is arranged. The heat dissipation plate 181 is formed to surround the other side of the both winding portions 82a, 83a.

According to Embodiment 5, the heat dissipation plates 180, 181 made of metal are formed to sandwich the winding portions 82a, 83a at least in the axis direction of the winding portions 82a, 83a in the coils 82, 83 from their both sides, and especially, the heat dissipation plates 180, 181 are formed to surround one side and the other side of the both winding portions 82a, 83a. Thus, optimal heat dissipation from the entire coils 82, 83 can be achieved.

Embodiments of the present invention are explained above, but the present invention is not limited to the above-mentioned embodiments and may be modified in a variety of ways as long as the modifications do not depart from the gist of the present invention.

What is claimed is:

1. A cooling device for a semiconductor element module and a magnetic part, comprising:
   a water-cooled type heat sink having a cooling water passage;
   a semiconductor element module including a plurality of chips arranged side by side in a circulation direction in the cooling water passage, the semiconductor element module being mounted on the heat sink;
   a magnetic part including a core and a winding portion mounted on the core, the magnetic part being mounted on the heat sink or another heat sink; and
   a plurality of cooling fins disposed to extend in the circulation direction in the cooling water passage in a manner that the plurality of cooling fins are separated into groups for the respective chips arranged side by side along the circulation direction, and that the groups of the cooling fins are offset from each other in a direction perpendicular to the circulation direction.

2. The cooling device for a semiconductor element module and a magnetic part according to claim 1, wherein
   each the semiconductor element module includes a pair of semiconductor elements which are disposed at separate locations along the circulation direction of the cooling water passage.

3. The cooling device for a semiconductor element module and a magnetic part according to claim 1, wherein
   a plurality of the semiconductor element modules are mounted separately on opposite surfaces of the heat sink having the cooling water passage.

4. The cooling device for a semiconductor element module and a magnetic part according to claim 1, wherein
   the semiconductor element module is mounted on the heat sink having the cooling water passage, with a plurality of semiconductor elements buried in a covering layer made of a synthetic resin.

5. The cooling device for a semiconductor element module and a magnetic part according to claim 1, wherein
   the plurality of cooling fins are integrally molded.

6. The cooling device for a semiconductor element module and a magnetic part according to claim 1, wherein
   a flat mounting surface is formed on the heat sink on which a plurality of the magnetic parts are mounted,
   the magnetic parts are housed in a common housing case in such a manner that axes of the winding portions of the magnetic parts are perpendicular to the mounting surface, and
   the housing case is mounted on the mounting surface.

7. The cooling device for a semiconductor element module and a magnetic part according to claim 6, wherein
   the plurality of magnetic parts are an inductor and a transformer.

8. The cooling device for a semiconductor element module and a magnetic part according to claim 6, wherein
   the housing case includes: a supporting plate portion with which the magnetic parts are brought into contact; and a cover portion which covers the magnetic parts and is connected to the supporting plate portion, and
   the supporting plate portion having a greater plate thickness than that of the cover portion is mounted on the mounting surface while being in contact with the mounting surface.

9. The cooling device for a semiconductor element module and a magnetic part according to claim 1, wherein
   a flat mounting surface is formed on the heat sink having mounted thereon the magnetic part having a resin covering portion in which at least part of the winding portion is buried, the flat mounting surface formed to be perpendicular to an axis of the winding portion and to be in contact with the resin covering portion and the core, and
   at least part of a heat dissipation plate made of metal is buried in the resin covering portion.

10. The cooling device for a semiconductor element module and a magnetic part according to claim 9, wherein
    the heat dissipation plate is buried in the resin covering portion while being in direct contact with the mounting surface.

11. The cooling device for a semiconductor element module and a magnetic part according to claim 9, wherein
    a mounting plate portion mounted on the mounting surface while being in contact with the mounting surface is provided integrally to the heat dissipation plate in such a manner as to project from the resin covering portion.

12. The cooling device for a semiconductor element module and a magnetic part according to claim 9, wherein
    the heat dissipation plate is formed to sandwich the winding portion at least in the axis direction of the winding portion from both sides thereof.

\* \* \* \* \*